(12) United States Patent
Ohara et al.

(10) Patent No.: US 9,980,372 B2
(45) Date of Patent: May 22, 2018

(54) CAMERA MODULE

(71) Applicant: Sharp Kabushiki Kaisha, Sakai, Osaka (JP)

(72) Inventors: Yoshikazu Ohara, Sakai (JP);
Yoshihiro Sekimoto, Sakai (JP);
Tetsuya Fujimoto, Sakai (JP);
Yoshinori Tanida, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 0 days. days.

(21) Appl. No.: 15/503,747

(22) PCT Filed: Jun. 2, 2015

(86) PCT No.: PCT/JP2015/065928
§ 371 (c)(1),
(2) Date: Feb. 14, 2017

(87) PCT Pub. No.: WO2016/031332
PCT Pub. Date: Mar. 3, 2016

(65) Prior Publication Data
US 2017/0280558 A1    Sep. 28, 2017

(30) Foreign Application Priority Data

Aug. 26, 2014  (JP) ................. 2014-172036

(51) Int. Cl.
H05K 1/02     (2006.01)
H04N 5/225    (2006.01)
G03B 17/55    (2006.01)

(52) U.S. Cl.
CPC .......... H05K 1/0274 (2013.01); G03B 17/55 (2013.01); H04N 5/2253 (2013.01);
(Continued)

(58) Field of Classification Search
CPC ....... H05K 1/0274; H05K 2201/09063; H04N 5/2253; H04N 5/2254; H04N 5/2257; G03B 17/55
See application file for complete search history.

(56) References Cited

U.S. PATENT DOCUMENTS 5,352,316 A * 10/1994 Steer ................. A61F 5/441
156/252
8,520,330 B2 * 8/2013 Fujiki ................. B24B 5/40
359/811
(Continued)

FOREIGN PATENT DOCUMENTS

JP    2007-128987 A    5/2007
JP    2009-060381 A    3/2009
(Continued)

OTHER PUBLICATIONS

Official Communication issued in International Patent Application No. PCT/JP2015/065928, dated Aug. 25, 2015.

Primary Examiner — Timothy J Henn
(74) Attorney, Agent, or Firm — Keating & Bennett, LLP

(57) ABSTRACT

A camera module (1) has an internal space (28) that abuts a wiring substrate (21) and is occluded, at least a part of a base material of the wiring substrate (21) is a porous portion (41) that is configured of porous ceramic, porous metal, organic fabric, or inorganic fabric and has interconnected air holes, and the internal space (28) is connected to the outside of the camera module (1) through the interconnected air holes.

7 Claims, 21 Drawing Sheets

(52) U.S. Cl.
CPC ......... *H04N 5/2254* (2013.01); *H04N 5/2257* (2013.01); *H05K 2201/09063* (2013.01)

(56) References Cited

U.S. PATENT DOCUMENTS

| | | | | |
|---|---|---|---|---|
| 2004/0239794 | A1* | 12/2004 | Saito | G02B 7/022 348/340 |
| 2005/0014307 | A1* | 1/2005 | Shiraishi | H01L 27/14618 438/60 |
| 2006/0097335 | A1* | 5/2006 | Kim | H01L 27/14618 257/433 |
| 2006/0292418 | A1* | 12/2006 | Akiyama | H01M 8/0668 429/410 |
| 2008/0237768 | A1* | 10/2008 | Yajima | H01L 23/26 257/434 |
| 2008/0266823 | A1* | 10/2008 | Tseng | H05K 1/111 361/767 |
| 2010/0149410 | A1* | 6/2010 | Matsuzawa | H01L 23/10 348/374 |
| 2011/0005030 | A1* | 1/2011 | Shirono | H04N 5/2171 15/363 |
| 2012/0039596 | A1* | 2/2012 | Hou | G02B 27/0006 396/535 |
| 2012/0062790 | A1* | 3/2012 | Tazoe | G02B 7/021 348/374 |
| 2012/0229701 | A1* | 9/2012 | Pavithran | H04N 5/2252 348/374 |
| 2013/0070351 | A1 | 3/2013 | Fujiki et al. | |
| 2013/0100343 | A1* | 4/2013 | Oh | G03B 17/12 348/374 |
| 2014/0055669 | A1* | 2/2014 | Chen | H01L 27/14618 348/374 |
| 2014/0251659 | A1* | 9/2014 | Asano | H05K 3/38 174/252 |
| 2014/0264699 | A1* | 9/2014 | Ryu | H01L 27/14618 257/434 |
| 2015/0172519 | A1* | 6/2015 | Mitarai | H01L 27/14618 348/373 |
| 2016/0212308 | A1* | 7/2016 | Ahn | G03B 17/02 |

FOREIGN PATENT DOCUMENTS

| | | |
|---|---|---|
| JP | 2009-073124 A | 4/2009 |
| JP | 2009-100174 A | 5/2009 |
| JP | 2011-147006 A | 7/2011 |
| JP | 2011-248115 A | 12/2011 |
| JP | 2012-069851 A | 4/2012 |
| JP | 5341266 B2 | 11/2013 |

\* cited by examiner

FIG. 16

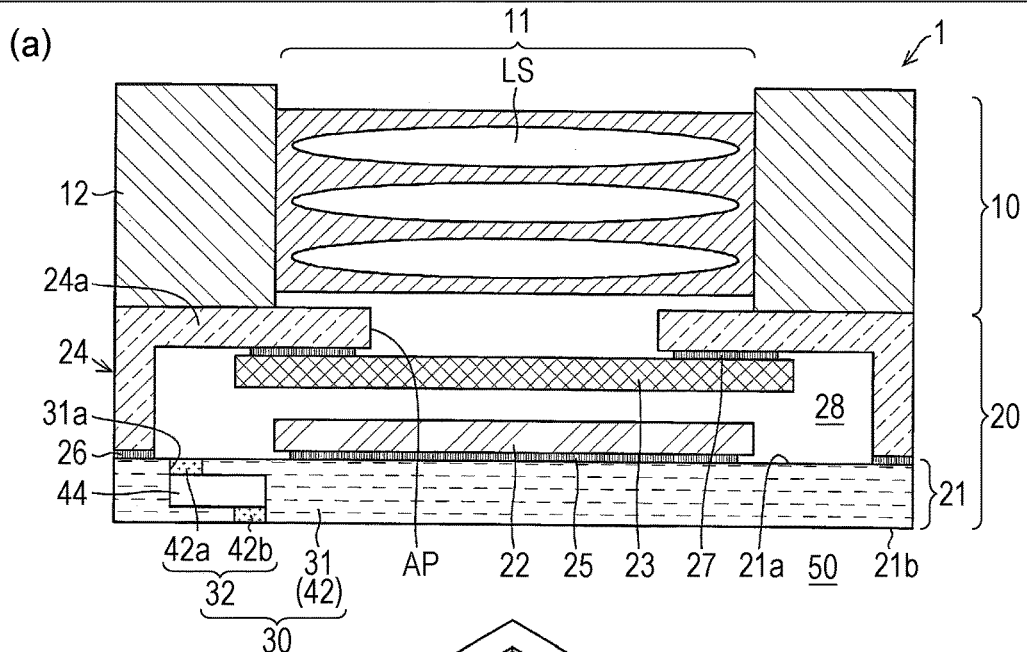

(a)

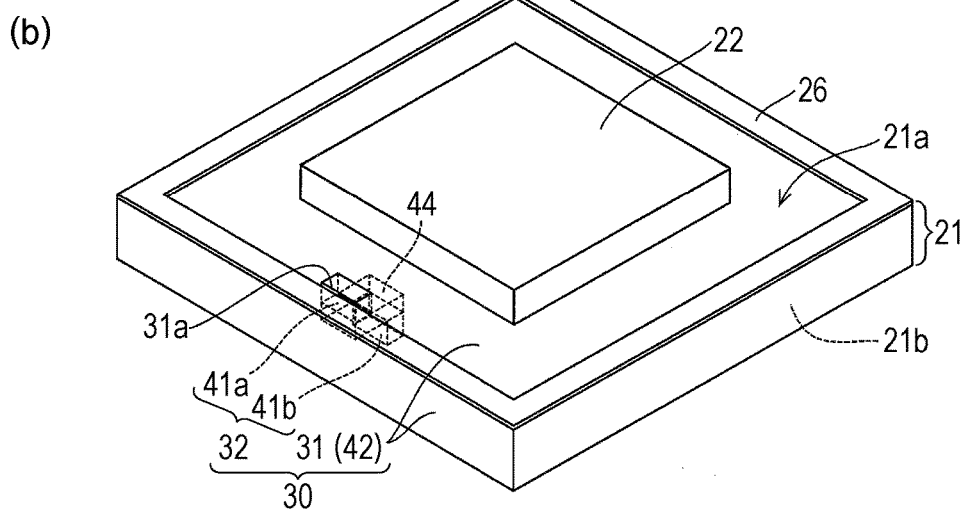

(b)

| 1: CAMERA MODULE | 25, 26, 27: ADHESIVE LAYER |
| 10: LIGHT CONCENTRATING UNIT | 28: INTERNAL SPACE |
| 11: LENS UNIT | 30: BASE MATERIAL PORTION |
| 12: LENS HOLDER | 31: FIRST BASE MATERIAL PORTION |
| 20: IMAGING UNIT | 31a: THROUGH PORT |
| 21: WIRING SUBSTRATE | 32: SECOND BASE MATERIAL PORTION |
| 21a: UPPER SURFACE | 41a: FIRST POROUS PORTION |
| 21b: LOWER SURFACE | 41b: SECOND POROUS PORTION |
| 22: IMAGE SENSOR | 42: COMPACT PORTION |
| 23: LIGHT-TRANSMITTING UNIT | 44: SEPARATING PORTION |
| 24: COVER BODY | 50: EXTERNAL SPACE |
| 24a: CEILING PORTION | AP: OPENING PORTION |
| | LS: IMAGING LENS |

CAMERA MODULE

TECHNICAL FIELD

The present invention relates to a camera module having an internal space that is occluded and abuts a wiring substrate.

BACKGROUND ART

A camera module used in a camera-equipped mobile phone, a digital camera, a security camera, or the like has an integrated structure of, for example, an image sensor such as a charge coupled device (CCD) or a complementary metal oxide semiconductor (CMOS); a wiring substrate having terminals and a light-transmitting unit such as glass; a cover body holding the image sensor and the wiring substrate; a light concentrating unit configured of a lens, a lens barrel, and the like; and a lens holder holding the light concentrating unit.

FIG. 18(a) is a sectional view illustrating a schematic configuration of a camera module 100 disclosed in PTL 1. FIGS. 18(b) to 18(e) are plan views illustrating the planar shape of an air vent groove G that is formed in a cover body of the camera module 100 illustrated in FIG. 18(a).

As illustrated in FIG. 18(a), the camera module 100 includes a light concentrating unit 120 and an imaging unit 110. The light concentrating unit 120 is a lens unit that includes a lens holder 122 and a lens 121 fixed to the lens holder 122.

A wiring substrate 111, an image sensor 113 mounted on the wiring substrate 111 with an adhesive 112, a light-transmitting unit 117, and a cover body 114 covering the wiring substrate 111 and the image sensor 113 are disposed in the imaging unit 110. The image sensor 113 and the light-transmitting unit 117 are disposed below the lens 121.

The cover body 114 is fixed on the wiring substrate 111. The end portions of the light-transmitting unit 117 are fixed to the cover body 114 with an adhesive 116.

An opening 114a is disposed in the center of the cover body 114, and the light-transmitting unit 117 is arranged on the opening 114a. Consequently, the light-transmitting unit 117 and an internal space 118 surrounded by the cover body 114 and the wiring substrate 111 are formed in the imaging unit 110.

When the internal space 118 is sealed, a rise in temperature accompanies thermal expansion of air in the internal space 118, and a crack or the like starting from a joint portion of each member constituting the internal space 118 may be produced. In addition, a change in temperature or a change in atmospheric pressure may cause blurriness in the light-transmitting unit 117 with influence of gas or ions produced from the adhesives 112 and 116 or the like.

Therefore, in the camera module 100, an air vent groove G is disposed in the cover body 114, and the internal space 118 and the outside of the cover body 114 are connected through the air vent groove G and a gap 119. The planar structure of the air vent groove G, for example, has a shape that is bent in the form of an angle or a circle as illustrated in FIGS. 18(b) to 18(d) or a shape in which a circular recess portion $G_H$ is disposed as illustrated in FIG. 18(e).

According to PTL 1, in the case of not considering shrinkage of the adhesive 116, the depth of the air vent groove G ideally has the minimum value (for example, 0.01 to 0.1 mm) that achieves both of two objects of emitting air existing in the internal space 118 and preventing intrusion of a foreign object from the outside.

However, according to PTL 1, in the case of considering shrinkage due to the adhesive 116 flowing into the air vent groove G, approximately 0.015 mm to 0.040 mm, for example, is appropriate, and the length of the air vent groove G is preferably set to, for example, 0.2 to 1.0 mm and the width of the air vent groove G to, for example, 0.1 mm to 0.5 mm.

FIG. 19 is a sectional view illustrating a schematic configuration of a camera module 200 disclosed in PTL 2.

As illustrated in FIG. 19, the camera module 200 has a solid-state image sensor 220 mounted on a substrate 210, a lens holder 230 holding a lens 231 and mounted on the substrate 210, and an air-permeable resin 212 filling the inside of a through hole 211 formed in the substrate 210. The solid-state image sensor 220 is sealed in the inside of an air-cavity 240 formed by the substrate 210 and the lens holder 230.

According to PTL 2, even if the ambient temperature of where the solid-state image sensor 220 is placed rises and thereby heats air in the air-cavity 240 and causes pressure inside of the air-cavity 240 to rise by the pressure of the expanded air, the expanded air is dispersed through the air-permeable resin 212. Thus, according to PTL 2, a rise in the pressure of the air-cavity 240 in which the solid-state image sensor 220 is sealed can be reduced, and a positional relationship between the solid-state image sensor 220 and the lens 231 can be accurately maintained.

FIG. 20(a) is a sectional view illustrating a schematic configuration of a semiconductor device 300 disclosed in PTL 3. FIG. 20(b) is a plan view illustrating a schematic configuration of the semiconductor device 300 illustrated in FIG. 20(a). As illustrated in FIGS. 20(a) and 20(b), the semiconductor device 300 includes at least a package main body 303 in which a cavity 302 capable of accommodating a semiconductor element 301 is formed.

An air vent unit 305 that connects the cavity 302 to the outside is formed in the package main body 303 in a state where the semiconductor element 301 is accommodated in the cavity 302 and sealed with a lid member 304. The air vent unit 305 is a through hole having a bent structure.

Thus, the semiconductor device 300 disclosed in PTL 3 can prevent a foreign object from entering the cavity 302 with the air vent unit 305.

The package main body 303 may be in a stacked form formed by stacking a plurality of layers. According to PTL 3, the air vent unit 305 can be easily and efficiently formed by, for example, forming a hole in a plurality of layers configured of an organic-based material (a high molecular weight polymer or the like) and integrating the layers in a stacking manner.

FIG. 21 is a sectional view illustrating a schematic configuration of a camera module 400 disclosed in PTL 4. As illustrated in FIG. 21, the camera module 400 includes an image sensor 402 mounted on a substrate 401, an infrared removing filter 403 having one side thereof facing the image sensor 402, a lens 404 facing the other side of the infrared removing filter 403, and a cylindrical hollow case 405 mounted on the substrate 401 to accommodate the infrared removing filter 403 and the lens 404 and to cover the image sensor 402.

An internal space 406 is formed between the image sensor 402 and the infrared removing filter 403. The internal space 406 is connected with an air vent 407 exposed to the outside. A porous cylindrical elastic body 408 is disposed on the peripheral portion of the image sensor 402. The cylindrical elastic body 408 is in elastic contact with one side of the infrared removing filter 403. Accordingly, the cylindrical elastic body 408 supports the infrared removing filter 403.

The internal space 406 is surrounded by the cylindrical elastic body 408. Thus, according to PTL 4, the cylindrical elastic body 408 removes dust included in external air flowing into the internal space 406, while connecting the internal space 406 to the external space.

The surface area or the thickness of the cylindrical elastic body 408 can be sufficiently secured. Thus, a material that is unlikely to cause clogging even after long-term use thereof can be used.

According to PTL 4, condensation or the like can be securely prevented by maintaining a connected state between the internal space 406 and the external space for a long period. Furthermore, according to PTL 4, the cylindrical elastic body 408 supports the infrared removing filter 403 inside of the cylindrical case 405. Thus, the infrared removing filter 403 is in a state of having a position thereof determined even without being bonded to the cylindrical case 405, and an assembly step of bonding the infrared removing filter 403 to the cylindrical case 405 can be omitted.

CITATION LIST

Patent Literature

PTL 1: Japanese Patent No. 5341266 (registered on Aug. 16, 2013)
PTL 2: Japanese Unexamined Patent Application Publication No. 2012-69851 (published on Apr. 5, 2012)
PTL 3: Japanese Unexamined Patent Application Publication No. 2007-128987 (published on May 24, 2007)
PTL 4: Japanese Unexamined Patent Application Publication No. 2009-60381 (published on Mar. 19, 2009)

SUMMARY OF INVENTION

Technical Problem

However, in the camera module 100 disclosed in PTL 1, in the case of forming the cover body 114 by, for example, resin molding, the actual depth of the air vent groove G is approximately 0.025 mm, and the actual minimum width of the air vent groove G is approximately 0.1 mm according to problems in die-casting. Furthermore, the thickness of the adhesive 116 for bonding the cover body 114 and the light-transmitting unit 117 is approximately 0.025 mm. Therefore, a section of the air vent groove G formed of the cover body 114, the light-transmitting unit 117, and the adhesive 116 has a width of 0.1 mm and a depth of 0.05 mm, and a foreign object that is smaller than the sectional shape of the air vent groove G may intrude into the air vent groove G and easily cling onto the image sensor 113.

In PTL 2, a silicone resin such as a phenyl-silicone-based resin or a methyl-silicone-based resin is used as the air-permeable resin 212 filling the through hole 211.

However, a silicone-based resin generally refers to an artificial high molecular weight compound having a main skeleton of siloxane bonds. In the case of a gasified siloxane remaining in a product and clinging to a conductive part, the siloxane decomposes and changes into a silicon dioxide and may be at risk of being a substance causing an insulation defect. In an optical system product, the produced gas may pose a problem such as causing mist or clinging to the light-transmitting unit 117 to cause blurriness.

In PTL 2, disclosed is simply filling the through hole 211 with the air-permeable resin 212. If the resin material is a resin material in oil form (for example, phenyl silicone oil or methyl silicone oil) and is not cured, the position of the resin material cannot be held in the through hole 211, and the air-permeable resin 212 spreads and renders the surface of the substrate 210 wet and thus may pose a problem. In addition, if the resin material is a resin material in oil form and is not cured, the air-permeable resin 212, when air in the internal space is expanded by heating or the like in a subsequent step, spills from the inside of the through hole 211 and contaminates the surface of the substrate 210, and the air-permeable resin 212 may open a hole and damage a necessary function.

If the resin material is a viscous material that is cured inside of the through hole 211 after application, the viscosity thereof before curing is high, and a certain amount of time is required to elapse until the resin material intrudes into the through hole 211. Thus, an amount of time for waiting after application of the resin material to the substrate 210 is required, and productivity is degraded. In the case of applying the air-permeable resin 212 to the surface of the substrate 210 where the solid-state image sensor 220 is mounted, when the viscosity of the resin material is high, the diameter of an application needle for application of the resin material is required to be increased, and a large area of a resin puddle is formed on the substrate 210. In addition, when the viscosity is high, thixotropy is considered to be high. Thus, the height of the resin puddle is considered to be increased. An increase in the area of the resin puddle reduces the footprint area of mounted components including interconnects on the substrate 210 and hinders reduction of the size of an electronic device.

In PTL 2, PTFE is illustrated as another air-permeable resin 212. However, PTFE has a melting point of 326.8° C. and is a solid at room temperature. Thus, it is difficult to fill the fine through hole 211 with PTFE in an assembly step of the camera module 200. PTFE is characterized as having excellent thermal resistance and chemical resistance and not being dissolved in hydrofluoric acid having high corrosiveness. However, PTFE is a substance having the smallest coefficient of friction of the substances discovered so far. Thus, even if the through hole 211 is filled with PTFE, PTFE is not stably held in the through hole 211 and is at risk of permitting passage of a foreign object.

The linear expansion coefficient of PTFE is $10 \times 10^{-5}/°C.$, and ceramic that is a material of a wiring substrate has a linear expansion coefficient of, for example, $7.1 \times 10^{-6}/°C.$ Thus, even if the through hole 211 is filled with PTFE, PTFE is not stably held in the through hole 211 and is at risk of permitting passage of a foreign object.

In PTL 2, PET is illustrated as another air-permeable resin 212. However, PET has a melting point of 260° C. and is a solid at room temperature. Thus, it is difficult to fill the fine through hole 211 with PET in the assembly step of the camera module 200. The linear expansion coefficient of PET is $6.5 \times 10^{-5}/°C.$, and ceramic that is a material of the substrate 210 has a linear expansion coefficient of, for example, $7.1 \times 10^{-6}/°C.$ Thus, even if the through hole 211 is filled with PET, PET is not stably held in the through hole 211 and may permit passage of a foreign object.

Accordingly, a suitable air-permeable resin material that fills the through hole 211 of the substrate 210, is stably held in the through hole 211, and prevents intrusion of a foreign object while securing air ventilation in an imaging unit is not found yet in the related art.

PTL 3 is related to the semiconductor device 300 and does not illustrate an internal structure of the air vent unit 305. Thus, PTL 3 cannot be easily expected to be applied to a camera module.

The diameter of an air vent of the air vent unit 305 that can be stably formed depends on the diameter of a hole opening tool, for example, a drill. A commercially available drill has a small diameter ($\varphi$) of 0.05 mm. However, a hole opened with such a drill has a greater diameter than the drill. In addition, such a small diameter drill is generally very expensive and tends to have high risk of wear or damage. Thus, the frequency of exchange thereof is high. Thus, use of such a small diameter drill generally causes an increase in cost. Therefore, if a drill having a diameter ($\varphi$) of, for example, 0.1 mm is used, a very large opening is formed with respect to the size (for example, a diameter ($\varphi$) of 0.01 mm) of a foreign object of which the passage is desired to be prevented. In this case, intrusion of a foreign object into the air vent unit 305 cannot be prevented, and the foreign object may pass the air vent unit 305.

In PTL 4, the cylindrical elastic body 408 is arranged on the image sensor 402. The cylindrical elastic body 408 is formed in a location other than a pixel area along with an external connection unit such as a wire bonding pad for electrical connection between the image sensor 402 and an external unit. However, in recent small camera modules, the size of the image sensor 402 used has been reduced, and it is difficult to sufficiently secure room for arranging the cylindrical elastic body 408 in a part other than the external connection unit and the pixel area on the image sensor 402. Even if the cylindrical elastic body 408 can be arranged in a part other than the external connection unit and the pixel area on the image sensor 402, the thickness of the cylindrical elastic body 408 cannot be sufficiently secured. Thus, the cylindrical elastic body 408 lacks strength and may not stably hold the infrared removing filter 403.

An inner wall of the cylindrical elastic body 408 is close to a pixel. Thus, stray light other than a main flux of light is reflected by the inner wall of the cylindrical elastic body 408 and may pose a problem such as flare in an image.

The cylindrical elastic body 408 is just mounted on the image sensor 402 in a state of elastic contact with the infrared removing filter 403 and thus is not fixed. Thus, the position thereof may be shifted by an impact of falling or the like, and an image defect may be caused. Even if the cylindrical elastic body 408 is bonded onto the image sensor 402, a positional shift may occur on the infrared removing filter 403 side thereof.

The cylindrical elastic body 408 is an elastic body and maintains a position thereof by repulsive force when being compressed. Being compressed between the infrared removing filter 403 and the image sensor 402 means being deformed in a direction at 90° from the direction of compression. Thus, in the case of the cylindrical elastic body 408 being deformed in the direction of the inside diameter thereof, the cylindrical elastic body 408 may block an optical path and cause an image defect. Accordingly, various adverse effects may be caused in the case of arranging the cylindrical elastic body 408 close to the pixel area on the image sensor 402.

Therefore, even in PTL 4, the cylindrical elastic body 408 cannot be stably held, and this may cause an image defect such as a stain due to passage or clinging of a foreign object.

The present invention is conceived in view of the problems in the related art, and an object thereof is to provide a camera module that can reduce an image defect due to clinging of a foreign object with air ventilation secured.

Solution to Problem

In order to resolve the problem, a camera module according to one aspect of the present invention is a camera module including an internal space that abuts a wiring substrate and is occluded, in which at least a part of a base material of the wiring substrate is a porous portion that is configured of porous ceramic, porous metal, organic fabric, or inorganic fabric and has interconnected air holes, and the internal space is connected to the outside of the camera module through the interconnected air holes.

Advantageous Effects of Invention

According to one aspect of the present invention, gas or ions in the internal space can be released to the outside of the camera module through a pore of the porous portion. Thus, according to the above configuration, blurriness of a light-transmitting unit caused by gas or ions in the internal space can be reduced, and damage or the like in the camera module can be prevented with reduction of increase in pressure due to thermal expansion of air in the internal space.

Any of porous ceramic, porous metal, organic fabric, and inorganic fabric is a versatile porous material and is easily obtained. In addition, these porous materials have thermal resistance that does not cause burning, scorching, subliming, or plastic deformation in a heating step of manufacturing steps of a camera module such as a firing step or a soldering step, and thus do not cause problems of an air-permeable resin in PTL 2. Thus, according to the above configuration, unlike in the case of filling a through hole of a substrate with an air-permeable resin, the porous portion can be stably held and stably formed.

The interconnected air holes of the porous portion configured of the porous material have fine openings (pores). Thus, a foreign object that is larger than the pore does not intrude into the pore. Therefore, a foreign object does not reach the internal space from the outside of the camera module through the wiring substrate. A foreign object that is smaller than the pore intrudes into the pore, but the foreign object that is stuck in the pore does not easily pass the pore. Therefore, a foreign object almost does not reach the internal space from the outside of the camera module through the wiring substrate.

According to the above configuration, the porous portion does not allow a foreign object to reach the internal space from the outside. Thus, clinging of a foreign object onto a pixel on the surface of an image sensor of the camera module and onto the surface of the light-transmitting unit on the image sensor can be prevented. Therefore, according to the above configuration, an image defect such as a stain defect can be reduced.

According to the above configuration, when light that is incident on the light concentrating unit is incident on the surface of the wiring substrate on the inner side of the internal space through the light-transmitting unit, the pore can absorb the most part of the incident light and thus can decrease reflectance. Consequently, occurrence of a problem such as flare or a ghost can be reduced, and image quality can be improved with improvement in image contrast.

Therefore, according to the above configuration, a camera module that can reduce an image defect due to clinging of a foreign object can be provided with air ventilation secured.

BRIEF DESCRIPTION OF DRAWINGS

FIG. 1(b) is a perspective view schematically illustrating a schematic configuration of a main portion of the camera module illustrated in FIG. 1(a).

FIG. 16(a) is a sectional view schematically illustrating a schematic configuration of a camera module according to a fifteenth embodiment, and FIG. 16(b) is a perspective view schematically illustrating a schematic configuration of a main portion of the camera module illustrated in FIG. 16(a).

DESCRIPTION OF EMBODIMENTS

Hereinafter, embodiments of the present invention will be described in detail.

[First Embodiment]

One embodiment of the present invention will be described as follows on the basis of FIGS. 1(a) and 1(b).

<Schematic Configuration of Camera Module 1>

Figure 1:
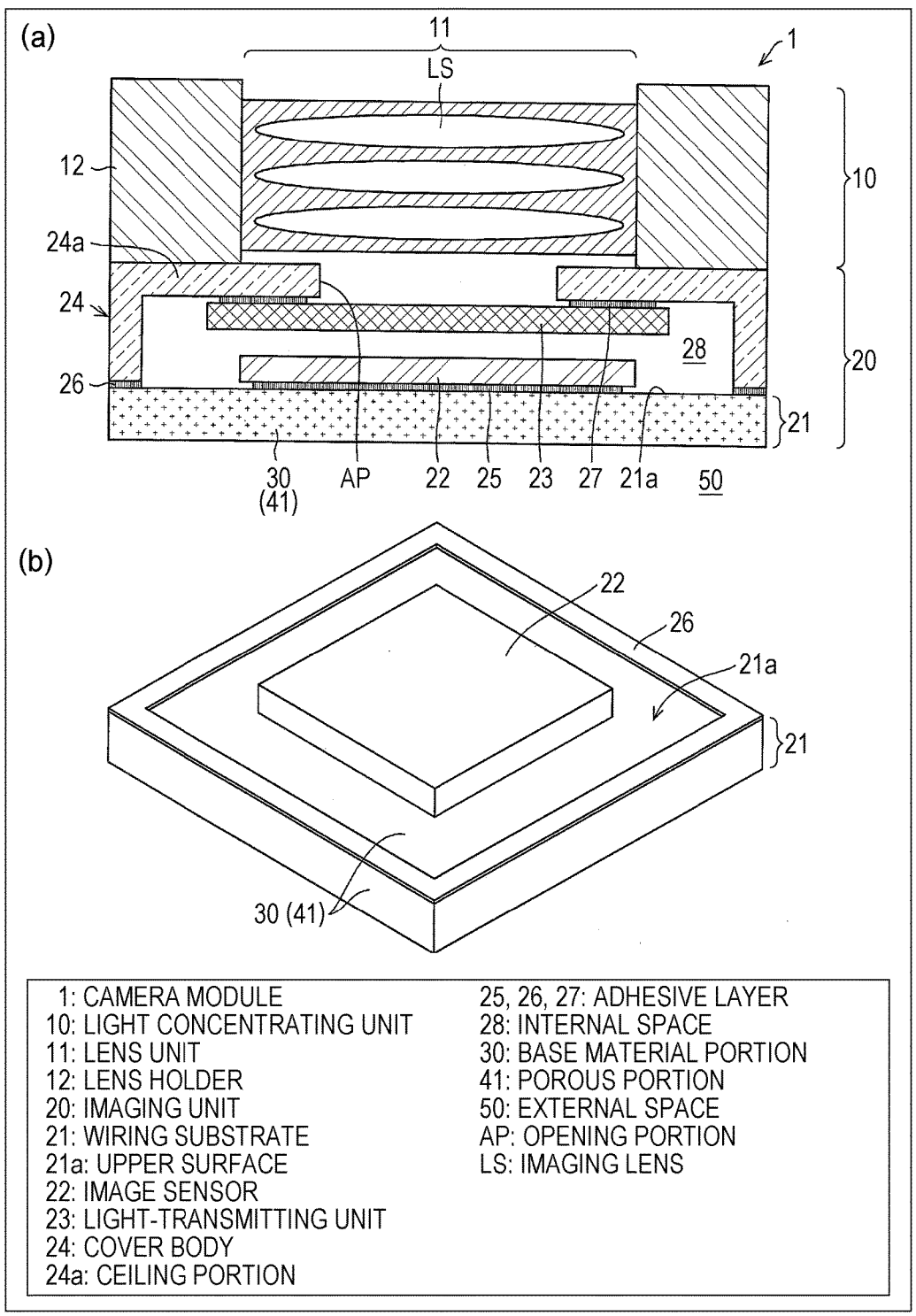
FIG. 1(*a*) is a sectional view schematically illustrating a schematic configuration of a camera module according to a first embodiment.

FIG. 1(a) is a sectional view schematically illustrating a schematic configuration of a camera module 1 according to the present embodiment, and FIG. 1(b) is a perspective view schematically illustrating a schematic configuration of a main portion of the camera module 1 illustrated in FIG. 1(a).

As illustrated in FIG. 1(a), the camera module 1 includes a light concentrating unit 10 and an imaging unit 20. Hereinafter, the light concentrating unit 10 side will be described as an upper side (front side) and the imaging unit 20 side as a lower side (rear side) for convenience of description.

<Light Concentrating Unit 10>

The light concentrating unit 10 includes a lens unit 11 including an imaging lens LS and a lens holder 12 holding the lens unit 11. The lens unit 11 is fixed to the lens holder 12.

FIG. 1(a) illustratively illustrates, as a configuration of the light concentrating unit 10, the simplest configuration of a fixed focal point type that is configured of the lens unit 11 and the lens holder 12. However, the present embodiment is not limited thereto. A lens driving device that includes various mechanisms such as an autofocusing mechanism, a zooming mechanism, an image stabilizing mechanism, and a macro-imaging mechanism may be disposed in the light concentrating unit 10.

<Imaging Unit 20>

The imaging unit 20 includes a wiring substrate 21, an image sensor 22, a light-transmitting unit 23, and a cover body 24.

The image sensor 22 is mounted on the wiring substrate 21 through an adhesive layer 25. The image sensor 22 is electrically connected to the wiring substrate 21 by a wire or the like not illustrated. The wiring substrate 21 will be described in detail later.

The cover body 24 has a ceiling portion 24a (ceiling wall) and has a shape of a lid of a box. An opening portion AP is disposed in the central portion of the ceiling portion 24a of the cover body 24.

The cover body 24 is fixed on the wiring substrate 21 through an adhesive layer 26. As illustrated in FIGS. 1(a) and 1(b), the adhesive layer 26 is disposed to surround the image sensor 22 along the peripheral portion of an upper surface 21a of the wiring substrate 21. The opening portion AP is positioned above the image sensor 22 as illustrated in FIG. 1(a). Accordingly, the cover body 24 covers a part of the wiring substrate 21 and the image sensor 22 mounted on the wiring substrate 21. The present embodiment is not limited thereto and may not cover the image sensor 22.

The light-transmitting unit 23 is configured of, for example, a light-transmitting plate configured of a light-transmitting material. The light-transmitting material constituting the light-transmitting unit 23 is exemplified by, for example, glass, plastic, or another light-transmitting material.

The light-transmitting unit 23 is disposed above the image sensor 22 in overlap with the opening portion AP to close the opening portion AP. The light-transmitting unit 23 is fixed by an adhesive layer 27 around the opening portion AP of the ceiling portion 24a.

Accordingly, the wiring substrate 21 and the image sensor 22 are covered with the cover body 24 and the light-transmitting unit 23. An internal space 28 that is an occluded space portion surrounded by constituent elements including the wiring substrate 21 (the wiring substrate 21, the cover body 24, and the light-transmitting unit 23 in the present embodiment) is formed in the imaging unit 20.

FIG. 1(a) illustratively illustrates the case of the light-transmitting unit 23 being fixed to the lower surface of the ceiling portion 24a of the cover body 24. However, the present embodiment is not limited thereto. The light-transmitting unit 23 may be fixed to the upper surface of the ceiling portion 24a.

The lens unit 11 is disposed on the upper surface side of the ceiling portion 24a of the cover body 24 and is positioned above the image sensor 22 and the light-transmitting unit 23.

The imaging lens LS forms an image of an object on the image sensor 22. The present embodiment is not limited thereto. The optical axes of the image sensor 22 and the imaging lens LS may coincide. If the optical paths of the image sensor 22 and the imaging lens LS are not obstructed, the optical axes are not necessarily required to coincide with (may be offset from) the axial centers of the light-transmitting unit 23 and the opening portion AP.

<Wiring Substrate 21>

Next, the wiring substrate 21 will be described. The wiring substrate 21 according to the present embodiment is a circuit substrate that has a circuit not illustrated and is configured of a porous material.

As illustrated in FIGS. 1(a) and 1(b), the wiring substrate 21 includes a plate-shaped base material portion 30 (substrate main body) that is a support base, and a circuit unit, not illustrated, that is disposed in the base material portion 30.

The circuit unit disposed in the base material portion 30 is electrically joined to the image sensor 22 or to the light concentrating unit 10 in which the lens driving device is disposed.

In the present embodiment, the base material portion 30 is formed of a porous material. Thus, the base material portion 30 according to the present embodiment can be represented in another way as a porous portion. Hereinafter, the base material portion 30 will be referred to as a porous portion 41 in the present embodiment.

(Configuration of Porous Portion 41)

The porous portion 41 has an open cell porous structure that is disposed on the outside air side of the internal space 28, that is, across an external space 50 that is a space portion outside of the camera module 1. The porous portion 41 has a three-dimensional mesh structure configured of a three-dimensional mesh skeleton in which interconnected air holes as pores (air holes) are formed to connect the internal space 28 and the external space 50 to each other.

(Porous Material)

A material that can be used as a base material of a wiring substrate is used in the porous material. The porous material is exemplified by, for example, porous ceramic, porous metal, organic fabric, or inorganic fabric. Any of these materials is easily obtained and has thermal resistance that does not cause burning, scorching, subliming, or plastic deformation in a heating step of manufacturing steps such as a firing step or a soldering step, and thus does not cause problems of an air-permeable resin in PTL 2. Thus, these materials can be suitably used as a base material of a wiring substrate. The present embodiment is not limited thereto if a material other than the materials can be used as a base material.

Porous ceramic, of those materials, is a versatile material used in a material such as a catalyst, a filter, or a building material and has an advantage of being easily obtained.

Similarly, porous metal is also a versatile material used in a material such as a secondary battery, a Li-ion battery, a capacitor, or a hydrogen battery and has an advantage of being easily obtained. Porous metal is exemplified by, for example, stainless steel, nickel, titanium, a titanium alloy, copper, a copper alloy, aluminum, or an aluminum alloy.

Porous metal has conductivity. Thus, in the case of forming the porous portion 41 with porous metal, the porous metal can be used as a circuit of the wiring substrate 21. Therefore, in this case, air ventilation can be secured, and the wiring substrate 21 can have high density interconnects.

A porous metal sheet has excellent bendability. Thus, the wiring substrate 21 can be applied as a flexible substrate by using a porous metal sheet as the porous material.

Organic fabric and inorganic fabric are also versatile materials and are easily obtained. Organic fabric is exemplified by, for example, paper. Inorganic fabric is exemplified by, for example, glass fiber. Inorganic fabric, for example, may be formed by stacking glass fiber or may be so-called glass cloth that is formed by stacking cloths of glass fiber.

In the case of the porous material being organic fabric or inorganic fabric, the wiring substrate 21 can be manufactured by using a manufacturing process of an organic substrate or an inorganic substrate.

The porous material may preferably have thermal resistance that does not cause burning, scorching, or plastic deformation at a soldering temperature in a step such as reflow soldering mounting at the time of manufacturing the wiring substrate 21.

(Modification Examples)

A plating coat not illustrated may be formed on the surface of an air hole of the porous portion 41, that is, the surface of a porous structure (the surface of a three-dimensional mesh skeleton) constituting the porous portion 41.

By coating the surface of the three-dimensional mesh skeleton constituting the porous portion 41 by plating, the magnitude of the air hole diameter can be adjusted, and the plating coat of the surface of the three-dimensional mesh skeleton can be used as an interconnect regardless of types of porous materials.

When the porous material is a non-metal such as ceramic, organic fiber, or inorganic fiber, electroless plating is preferably used as the plating.

In the case of the porous material being a metal or a plated porous material, the plating may be electroless plating or electroplating.

Types of plating are exemplified by, for example, gold plating, nickel plating, copper plating, and chrome plating.

A plating process is a process that is typically performed in general manufacturing steps of a wiring substrate. Thus, an additional facility for the plating process is not required. Therefore, investment of a new facility for the plating process is not required. Even if the plating process is performed, a significant increase in cost can be reduced.

The porous material can be appropriately stacked before use in order for the wiring substrate 21 to satisfy a desired thickness or strength or the like as a base material portion (base material portion 30) in the wiring substrate 21.

<Effect>

As described above, the image sensor 22 is bonded onto the wiring substrate 21 by the adhesive layer 25, and the cover body 24 is bonded by the adhesive layer 26 to cover the image sensor 22. The opening portion AP is disposed in the ceiling portion 24a of the cover body 24, and the light-transmitting unit 23 is bonded to the surrounding area of the opening portion AP by the adhesive layer 27.

Thus, the internal space 28 is connected to the external space 50 outside of the cover body 24 through the pore of the porous portion 41 that is a connecting hole. Connection between the internal space 28 and the external space 50 is equivalent to connection between the internal space 28 and the outside of the camera module 1, that is, the outside air.

Therefore, according to the present embodiment, gas or ions produced from the adhesive layers 25, 26, and 27 and the like in the internal space 28 of the imaging unit 20 can be released to the outside air through the pore of the porous portion 41. Thus, according to the present embodiment, blurriness of the light-transmitting unit 23 can be reduced, and damage or the like in the camera module 1 can be prevented with reduction of increase in pressure due to thermal expansion of the air of the internal space 28.

In the present embodiment, the base material of the wiring substrate 21 is formed of a porous material. In other words, the entire base material of the wiring substrate 21 is configured of the porous portion 41 having interconnected air holes. Thus, the porous material can be stably held in the wiring substrate 21, and the porous portion 41 can be stably formed.

The pore of the porous portion 41 has a fine opening (not illustrated). Thus, a foreign object that is larger than the fine opening does not intrude into the pore of the porous portion 41. Therefore, a foreign object does not reach the internal space 28 from the outside of the camera module 1 through the wiring substrate 21. While a foreign object that is smaller than the fine opening intrudes into the pore of the porous portion 41, the foreign object that is stuck in the pore does not easily pass the pore since the opening of the pore is small. Therefore, a foreign object almost does not reach the internal space 28 from the outside of the camera module 1 through the wiring substrate 21.

Accordingly, the porous portion 41 does not allow a foreign object to reach the internal space 28 from the outside. Thus, clinging of a foreign object onto a pixel on the surface of the image sensor 22 and onto the surface of the light-transmitting unit 23 on the image sensor 22 can be prevented. Accordingly, the camera module 1 according to the present embodiment can reduce an image defect such as a stain defect.

The size of a foreign object to be prevented is 1 μm on the pixel of the image sensor 22 if the size of the pixel is, for example, 1 μm. However, the size that can be corrected with a correcting function of software can be further increased, and the size of a foreign object to be prevented may also be increased. For example, an allowable size of a foreign object on the surface of the light-transmitting unit 23 on the image sensor 22 varies according to performance of a lens and is, for example, 10 to 20 μm.

The air hole diameter of the pore in the porous portion 41 is preferably as small as possible considering the ability to prevent intrusion of a foreign object. The total porosity of the porous portion 41 is preferably as great as possible considering the ability of the pore to hold a foreign object. Air ventilation is not equivalent to porosity or the air hole diameter.

The size of the pore ideally has the minimum value (for example, 0.005 to 0.04 mm) that achieves both of two objects of, for example, emitting air existing in the internal space 28 and preventing intrusion of a foreign object from the outside.

According to the present embodiment, when light that is incident on the light concentrating unit 10 is incident on the surface of the wiring substrate 21 on the inner side of the internal space 28 through the opening portion AP and the light-transmitting unit 23, the fine opening can absorb the most part of the incident light and thus can decrease reflectance. Consequently, occurrence of a problem such as flare or a ghost can be reduced, and image quality can be improved with improvement in image contrast.

[Second Embodiment]

Another embodiment of the present invention will be described as follows on the basis of FIGS. 2(a) and 2(b).

Differences between the present embodiment and the first embodiment will be described, and constituent elements having the same function as the constituent elements (members) described in the first embodiment will be designated by the same reference signs and will not be described. The same modifications carried out to the first embodiment can obviously be carried out to the present embodiment.

<Schematic Configuration of Camera Module 1>

FIG. 2(a) is a sectional view schematically illustrating a schematic configuration of the camera module 1 according to the present embodiment, and FIG. 2(b) is a perspective view schematically illustrating a schematic configuration of a main portion of the camera module 1 illustrated in FIG. 2(a).

In the camera module 1 according to the first embodiment, the entire base material portion 30 of the wiring substrate 21 is formed of a porous material. Regarding this point, the camera module 1 according to the present embodiment is the same as the camera module 1 according to the first embodiment except that a part of the base material portion 30 of the wiring substrate 21 is formed of a porous material.

<Wiring Substrate 21>

As illustrated in FIGS. 2(a) and 2(b), the base material portion 30 in the wiring substrate 21 according to the present embodiment has a multilayer structure (stack structure) that includes a first base material portion 31 and a second base material portion 32. Even in the present embodiment, a circuit unit not illustrated is disposed in the base material portion 30. The circuit unit is electrically joined to the image sensor 22 or to the light concentrating unit 10 in which the lens driving device is disposed.

The image sensor 22 is mounted on the first base material portion 31 through the adhesive layer 25. The cover body 24 is bonded onto the first base material portion 31 through the adhesive layer 26.

The first base material portion 31 is a mount unit in which the image sensor 22 and the cover body 24 are mounted, and is a plate-shaped member configured of a first base material layer. A through port 31a that passes through in the up-down direction is disposed in the first base material portion 31.

The second base material portion 32 is disposed in the through port 31a in the first base material portion 31 and on the rear surface of the first base material portion 31.

Specifically, the second base material portion 32 has a plate-shaped second base material layer 32a and a protruding portion 32b protruding into the through port 31a from one main surface of the second base material layer 32a.

Thus, the base material portion 30 according to the present embodiment has a configuration in which the first base material layer as the first base material portion 31 is stacked on the second base material layer 32a and in which the protruding portion 32b protruding from one main surface of the second base material layer 32a is disposed in the through port 31a disposed in the first base material portion 31.

The second base material portion 32 is a base material portion configured of a porous material. Thus, the second base material portion 32 according to the present embodiment can be represented in another way as a porous portion. The porous material and the porous portion are the same as those in the first embodiment. The description of the first embodiment can be applied to the porous material and the porous portion except that the shape of the second base material portion 32 is different from the shape of the base material portion 30 in the first embodiment.

The first base material portion 31 is a base material portion having a configuration that is more compact than the second base material portion 32. The first base material portion 31 is preferably configured of a base material that can be used as a base material of a wiring substrate and is more compact than the second base material portion 32.

Therefore, hereinafter, a part, of the base material portion 30 constituting the wiring substrate 21, that is configured of a porous material (that is, the second base material portion 32) will be referred to as the porous portion 41 in the same manner as the first embodiment, and the other part (that is, the first base material portion 31) will be referred to as a compact portion 42 in order to be distinguished from the porous portion 41. A material constituting the compact portion 42 will be referred to as a compact material. Being compact referred hereto indicates being relatively compact compared with being porous.

A typical base material, for example, that is used as a base material of a general substrate is used in the compact portion 42.

In the present embodiment, the protruding portion 32b is disposed to abut the internal space 28 and to be away from the area of mounting of the image sensor 22 and the area of connection of the cover body 24 on the surface of the wiring substrate 21.

Thus, the upper surface 21a of the wiring substrate 21 which is a surface where the image sensor 22 is mounted is formed by the porous portion 41 and the compact portion 42, and one end of the porous portion 41, that is, the surface (exposed surface) of the protruding portion 32b, abuts the internal space 28. The other end of the porous portion 41, that is, the rear surface and the side surfaces of the second base material layer 32a, abuts the external space 50. Thus, the internal space 28 and the external space 50 are connected to each other by the porous portion 41 which is the second base material portion 32.

As described in the first embodiment, the porous material is exemplified by, for example, porous ceramic, porous metal, organic fabric, or inorganic fabric.

The compact material is exemplified by a substrate material such as an inorganic material used in a general inorganic substrate or an organic material used in a general organic substrate. That is, the first base material layer constituting the first base material portion 31 which is the compact portion 42 may be an inorganic substrate or may be an organic substrate.

The inorganic material is exemplified by, for example, ceramic or inorganic fabric.

Particularly, ceramic among the illustrative inorganic materials is a general material as a material of a wiring substrate and is easily obtained.

When porous ceramic is used in the second base material portion 32 with the first base material portion 31 configured of ceramic, an existing wiring substrate manufacturing technology can be used in manufacturing of the wiring substrate 21. Thus, an advantage that cost is unlikely to be increased is achieved.

When porous ceramic is used in the second base material portion 32 with the first base material portion 31 configured of ceramic, the first base material portion 31 and the second base material portion 32 have almost the same coefficient of thermal expansion.

In the case of the first base material portion 31 and the second base material portion 32 having almost the same coefficient of thermal expansion, the possibility of a problem such as curvature or breakage of the wiring substrate 21 due to the porous portion 41, which is the second base material portion 32, occurring in the firing step of manufacturing steps of the wiring substrate 21 is decreased. Thus, in this case, an advantage that cost is unlikely to be increased is achieved. This is not limited to the case of configuring the first base material portion 31 of ceramic as described above, and the same applies generally to the case of the first base material portion 31 and the second base material portion 32 having almost the same coefficient of thermal expansion.

The organic material and the organic substrate in which the organic material is used are exemplified by, for example, a base material as a core for a plate shape (core material) that is impregnated with resin, or an insulating material in which polytetrafluoroethylene is used.

The base material (core material) may be an organic-based base material or may be an inorganic-based base material. The organic-based base material (core material) is exemplified by, for example, organic fabric such as paper, a polyester film, or a polyimide film. The inorganic-based base material (core material) is exemplified by, for example, inorganic fabric such as glass fiber or glass cloth.

The resin is exemplified by, for example, a phenol resin, a polyester resin, an epoxy resin, a polyimide resin, or a fluorinated resin.

An organic substrate, among the organic substrates, that is configured by impregnating paper with any resin of a phenol resin, a polyester resin, and an epoxy resin is inexpensive, has good workability, and can be mass-produced by die-stamping with a press. An organic substrate that is configured by impregnating paper with a polyester resin or an epoxy resin has excellent thermal resistance. An organic substrate that is configured by impregnating paper with an epoxy resin has an advantage of enabling through hole plating.

An organic substrate that is configured by impregnating glass cloth with a polyester resin or an epoxy resin has an advantage of having high strength, dimensional stability, and insulation resistance. An organic substrate that is configured by impregnating glass cloth with a polyimide resin has an advantage of having high thermal resistance in addition to high strength and insulating properties.

So-called glass epoxy that is configured by impregnating glass fiber with an epoxy resin is generally used as a material of an organic substrate used in a wiring substrate. A so-called glass epoxy substrate that is configured by impregnating stacked glass fiber with an epoxy resin is the most generally used as a surface-mount substrate and is used in, for example, a double sided substrate or a multilayer substrate.

By using, for example, glass epoxy (glass epoxy substrate) in the first base material portion 31, a rigid substrate (an inflexible substrate) or a rigid flexible substrate (a substrate configured by combining a rigid material and a thin and flexible material) can be formed as the wiring substrate 21 or an organic substrate used in the wiring substrate 21.

The first base material layer constituting the organic substrate, that is, the first base material portion 31, may be configured by forming, on both surfaces of a glass epoxy substrate with the glass epoxy substrate as a center, a paper epoxy substrate configured by impregnating paper with an epoxy resin.

An organic substrate configured by sandwiching a glass epoxy substrate between paper epoxy substrates is easily worked and inexpensive compared with an organic substrate configured of only a glass epoxy substrate. In recent years, a composite substrate that is configured by using polytetrafluoroethylene on both surfaces of a glass epoxy substrate has been manufactured for use in a high frequency circuit. Such an organic substrate is more inexpensive than a polytetrafluoroethylene substrate and has more excellent frequency characteristics than a glass epoxy substrate.

An organic substrate with polytetrafluoroethylene used in an insulating material has favorable frequency characteristics and thus is used in a circuit that uses, for example, a so-called UHF band or SHF band frequency in data communication.

Hereinafter, one example of physical properties of the first base material portion 31 and the second base material portion 32 will be illustrated. Hereinafter, the case of configuring the first base material portion 31 of ceramic and the second base material portion 32 of porous ceramic will be illustratively illustrated. The following illustration is merely one example, and the present embodiment is not limited to the following illustration.

Specific weight: 3.7 to 4 $g/cm^3$ (first base material portion 31), 1 to 3.2 $g/cm^3$ (second base material portion 32)
Bend strength: 300 to 550 MPa (first base material portion 31), 5 to 200 MPa (second base material portion 32) Linear expansion coefficient at room temperature to 400° C.: $5.7 \times 10^{-6}$/°C. to $8.1 \times 10^{-6}$/°C. (first base material portion 31 and second base material portion 32)
Total porosity: 1% (first base material portion 31), 10 to 60% (second base material portion 32)
Air hole diameter: no air hole (first base material portion 31), 1 to 50 μm (second base material portion 32)
Air permeability: 0 (first base material portion 31), $0.8 \times 10^{-13}$ m to $800 \times 10^{-13}$ m (Second Base Material Portion 32)

In the present embodiment, the first base material portion 31 and the second base material portion 32 may preferably have thermal resistance that does not cause burning, scorching, or plastic deformation at a soldering temperature in a step such as reflow soldering mounting at the time of manufacturing the wiring substrate 21.

The porous portion 41 is generally considered to have lower strength than the compact portion 42. In the present embodiment, a pore that connects the internal space 28 and the external space 50 may be preferably disposed in a part of the wiring substrate 21. Thus, the compact portion 42 that is configured of a more compact material than the porous portion 41 is desirably formed in the base material portion 30 as reinforcement of the porous portion 41, and the first base material portion 31 may preferably have a more compact configuration than the second base material portion 32. At this point, as the second base material portion 32 is more compact than the first base material portion 31, substrate strength can obviously be improved.

(Method for Forming First Base Material Portion 31 and Second Base Material Portion 32)

The first base material portion 31 and the second base material portion 32 can be appropriately stacked before use in order to satisfy a desired thickness or strength or the like as a base material portion in the wiring substrate 21.

For example, in the case of configuring the first base material portion 31 of a ceramic substrate, a plurality of base material layers configured of ceramic is stacked and fired to be integrated, and thereby the first base material layer (first base material portion 31) having a desired thickness can be formed.

In the case of configuring the second base material layer 32a of a porous ceramic substrate, the second base material layer 32a having a desired thickness can be formed if a plurality of base material layers configured of porous ceramic is stacked in plural numbers and fired.

In the case of configuring the first base material layer of a ceramic substrate and the second base material layer 32a of a porous ceramic substrate, both substrates can be integrated by stacking and firing both substrates.

At this point, for example, by forming an opening portion constituting the through port 31a in a base material layer constituting the first base material layer, filling the opening portion with a porous material (porous raw material), and stacking and firing the base material layer, the protruding portion 32b of the second base material portion 32 can be formed inside of the first base material portion 31.

A method for forming the first base material portion 31 and the second base material portion 32 is not limited thereto. For example, as a method for forming the protruding portion 32b inside of the first base material portion 31, the through port 31a may be filled with a porous material, or a porous material may be bonded.

For example, in the case of the first base material portion 31 being an inorganic substrate configured of inorganic fabric or being an organic substrate configured of organic fabric, the first base material portion 31 can be formed by impregnating stacked paper, glass fiber, glass fiber cloth, or the like with a resin as described above. At this point, by impregnating, with a resin, an area of the second base material portion 32 except for the area where the protruding portion 32b is formed, in other words, an area around a part where a porous portion is formed, a compact portion in which a porous portion is formed (that is, the first base material portion 31 in which the protruding portion 32b of the second base material portion 32 is formed) can be formed.

Even in the present embodiment, the surface of a three-dimensional mesh skeleton constituting a porous portion may be covered by plating in the same manner as the first embodiment.

<Effect>

As described above, in the present embodiment, the cover body 24 is bonded to the first base material portion 31, which is the compact portion 42, through the adhesive layer 26. The image sensor 22 is bonded to the first base material portion 31 through the adhesive layer 25. Thus, the adhesive layers 25 and 26 do not permeate the second base material portion 32 which is the porous portion 41, and do not damage the porous structure of the second base material portion 32.

Even in the present embodiment, the internal space 28 is connected to the external space 50 outside of the cover body 24 through the pore of the porous portion 41 that is a connecting hole.

According to the present embodiment, gas or ions produced from the adhesive layers 25, 26, and 27 and the like in the internal space 28 of the imaging unit 20 can be released to the outside air through the pore of the porous portion 41 on the rear surface of the wiring substrate 21 (that is, the surface of the wiring substrate 21 on the opposite side from the internal space 28) and on the side surfaces of the wiring substrate 21.

Even in the present embodiment, the pore of the porous portion 41 has a fine opening. Thus, a foreign object that is larger than the fine opening does not intrude into the pore of the porous portion 41.

Thus, the porous portion 41 can achieve both of two objects of emitting air existing in the internal space 28 and preventing intrusion of a foreign object from the outside and can reduce clinging of a foreign object to the image sensor 22 (a defect of the camera module 1).

In the present embodiment, the base material of the wiring substrate 21 is formed by the porous portion 41 and the compact portion 42. Thus, substrate strength can be improved compared with the first embodiment.

According to the present embodiment, the compact portion 42 is stacked on the porous portion 41 in such a manner that the compact portion 42 is positioned on the side where the surface on which the image sensor 22 is mounted is present. Thus, most foreign object that intrudes into the pore of the porous portion 41 and is smaller than the fine opening is prevented from passing in the direction to the internal space 28 by the compact portion 42.

Thus, according to the present embodiment, the possibility of a foreign object reaching the internal space 28 from the outside of the camera module 1 through the wiring substrate 21 can be further reduced from that in the first embodiment.

According to the present embodiment, the wiring substrate 21 has a stack structure of the porous portion 41 and the compact portion 42. Accordingly, even in the present embodiment, the wiring substrate 21 has a configuration in which, in a certain plane (section), the entirety of a plane (section) is formed of the porous portion 41. Thus, unlike in the case of filling a through hole of a substrate with an air-permeable resin, the porous portion 41 can be stably held and stably formed.

<First Modification Example>

FIGS. 2(a) and 2(b) illustratively describe the case of the base material portion 30 having a double layer structure configured of the first base material portion 31 and the second base material portion 32. However, the present embodiment is not limited thereto. As described above, the porous portion 41 may preferably connect the internal space 28 and the external space 50 in the wiring substrate 21. Therefore, the base material portion 30 may have a multi-layer structure (stack structure) of three layers or more if the porous portion 41 connects the internal space 28 and the external space 50. For example, the second base material portion 32 may have a structure that is sandwiched between the first base material portions 31.

<Second Modification Example>

FIGS. 2(a) and 2(b) illustratively illustrate the case of the protruding portion 32b being formed in a part of one edge of the upper surface 21a of the wiring substrate 21. However, the present embodiment is not limited thereto. The protruding portion 32b may be formed along one edge or two or more edges of the upper surface 21a of the wiring substrate 21 or may be formed along the periphery of the upper surface 21a of the wiring substrate 21 to surround the image sensor 22.

According to the present embodiment, the upper surface 21a of the wiring substrate 21 may be preferably configured of the first base material portion 31, which is the compact portion 42, and the second base material portion 32, which is the porous portion 41, and the area of exposure or the proportion of exposure of the protruding portion 32b in the upper surface 21a of the wiring substrate 21 is not particularly limited.

[Third Embodiment]

A still another embodiment of the present invention will be described as follows on the basis of FIGS. 3(a) and 3(b).

Differences between the present embodiment and the second embodiment will be described, and constituent elements having the same function as the constituent elements described in the second embodiment will be designated by the same reference signs and will not be described. The same modifications carried out to the first and second embodiments can obviously be carried out to the present embodiment.

<Schematic Configuration of Camera Module 1>

Figure 3:
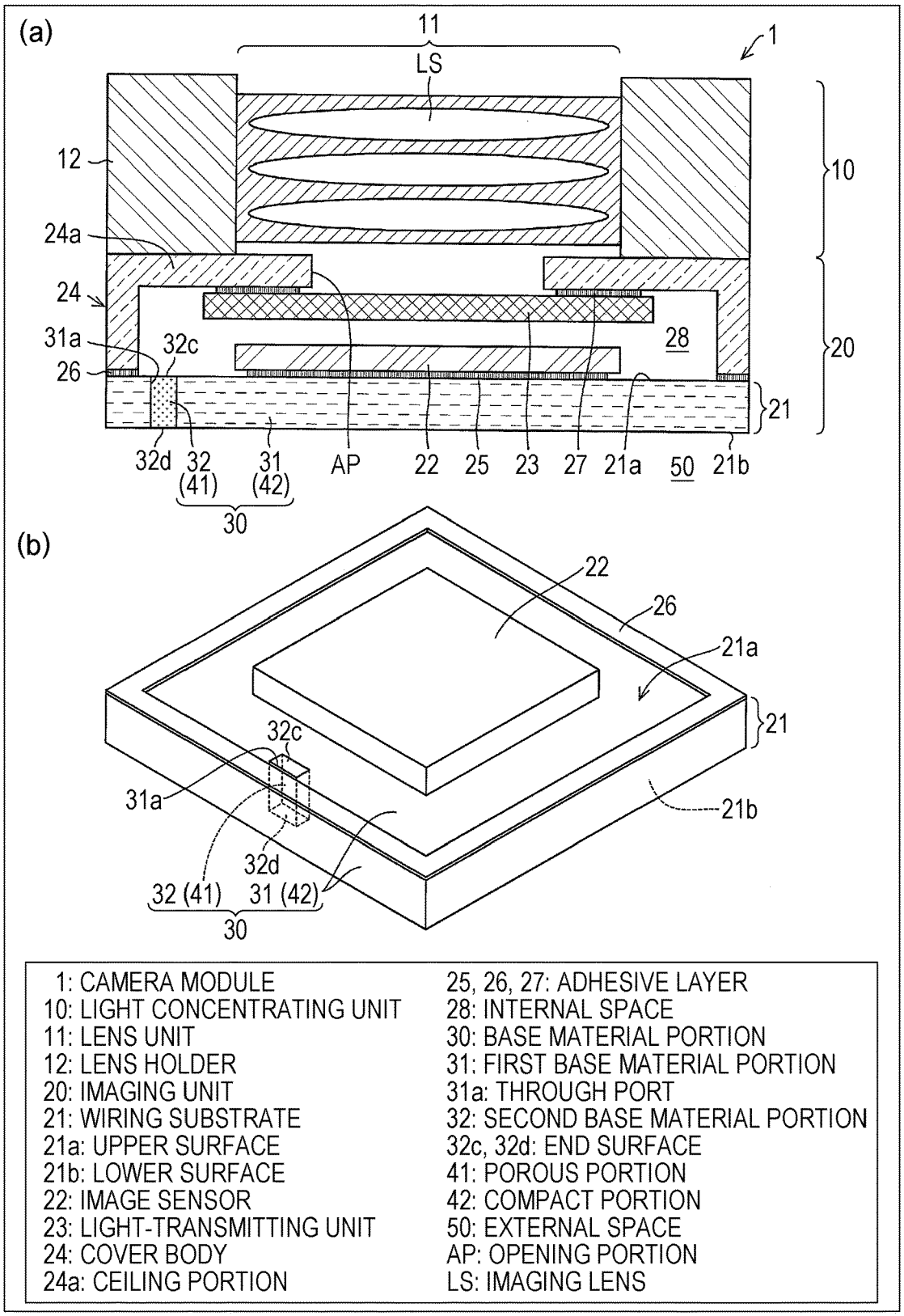
FIG. 3(a) is a sectional view schematically illustrating a schematic configuration of a camera module according to a third embodiment.
FIG. 3(b) is a perspective view schematically illustrating a schematic configuration of a main portion of the camera module illustrated in FIG. 3(a).

FIG. 3(a) is a sectional view schematically illustrating a schematic configuration of the camera module 1 according to the present embodiment, and FIG. 3(b) is a perspective view schematically illustrating a schematic configuration of a main portion of the camera module 1 illustrated in FIG. 3(a).

The camera module 1 according to the third embodiment is the same as the camera module 1 according to the second embodiment except that the shapes of the porous portion 41 and the compact portion 42 in the base material portion 30 of the wiring substrate 21 are different from those in the second embodiment.

<Wiring Substrate 21>

Figure 2:
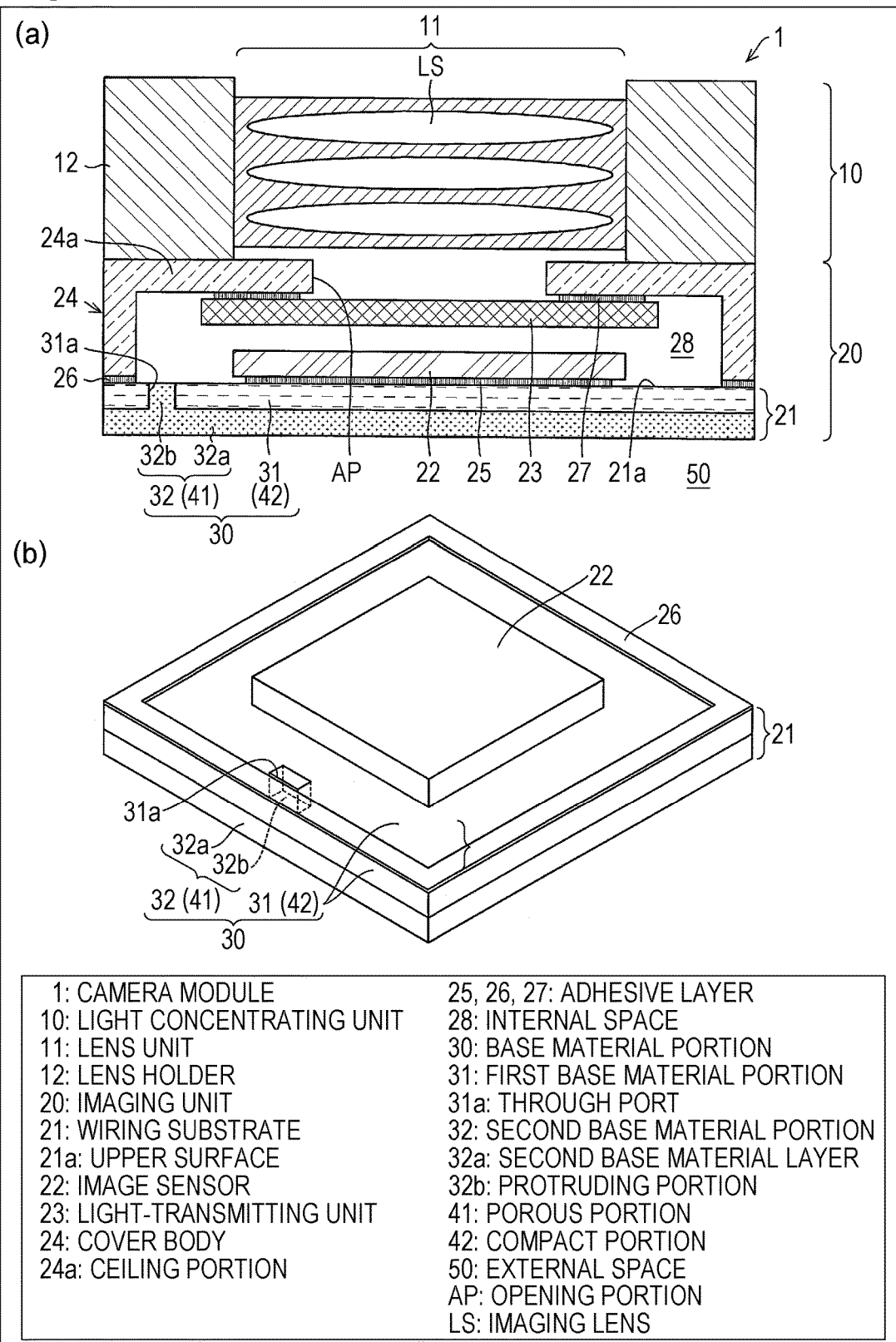
FIG. 2(a) is a sectional view schematically illustrating a schematic configuration of a camera module according to a second embodiment.
FIG. 2(b) is a perspective view schematically illustrating a schematic configuration of a main portion of the camera module illustrated in FIG. 2(a).

As illustrated in FIGS. 2 (a) and 2(b), in the base material portion 30 of the wiring substrate 21 according to the second embodiment, the porous portion 41 as the second base material portion 32 is disposed in the through port 31a in the first base material portion 31 and on the rear surface of the first base material portion 31. Regarding this point, the base material portion 30 of the wiring substrate 21 according to the present embodiment does not have a stack structure of the first base material portion 31 and the second base material portion 32, and the porous portion 41 as the second base material portion 32 is disposed only in the through port 31a in the first base material portion 31.

In the present embodiment, the base material portion 30 does not have a stack structure and has a single layer structure in the up-down direction. Thus, the thickness of the first base material portion 31 is formed to be a thickness that is equal to, for example, the total thickness of the first base material portion 31 and the second base material portion 32 in the second embodiment.

The present embodiment is not limited thereto. The thickness of the wiring substrate 21 may preferably be appropriately set to be a desired thickness and is not particularly limited.

According to the present embodiment, the second base material portion 32 which is the porous portion 41 is formed straight from one main surface to the other main surface of the first base material portion 31 in a part of the first base material portion 31 which is the compact portion 42.

Thus, even in the present embodiment, one end of the porous portion 41 disposed in the compact portion 42 abuts the internal space 28 in the same manner as the second embodiment. The other end of the porous portion 41 disposed in the compact portion 42 abuts the external space 50. Accordingly, the porous portion 41 connects the internal space 28 and the external space 50.

Therefore, in the present embodiment, an end surface 32c (the upper end or a first end surface) that is one end of the second base material portion 32 is positioned in the upper surface 21a of the wiring substrate 21, which is a surface where the image sensor 22 is mounted, and constitutes a part of the upper surface 21a. An end surface 32d (the lower end or a second end surface) that is another one end of the second base material portion 32 is positioned in a lower surface 21b of the wiring substrate 21 which is a surface on the opposite side from the surface where the image sensor 22 is mounted, and constitutes a part of the lower surface 21b.

Thus, in the present embodiment, the angle portion (corner portion) of the wiring substrate 21 and the edge line portion connecting the neighboring angle portions are configured of the first base material portion 31 which is the compact portion 42.

Even in the present embodiment, the image sensor 22 is mounted on the first base material portion 31 through the adhesive layer 25. The cover body 24 is bonded onto the first base material portion 31 through the adhesive layer 26. In the same manner as the second embodiment, the porous portion 41 is disposed to be away from the area of mounting of the image sensor 22 and the area of connection of the cover body 24 on the surface of the wiring substrate 21, and is disposed around the area of connection.

<Effect>

As described heretofore, in the present embodiment, the porous portion 41 is disposed in only a part of the first base material portion 31 which is the compact portion 42, and most part of the wiring substrate 21, particularly, the angle portion and the edge line portion of the wiring substrate 21, is configured of the compact portion 42.

Thus, according to the present embodiment, an effect that a problem such as breakage or chipping caused by external stress in the wiring substrate 21 can be reduced is achieved in addition to the effect disclosed in the second embodiment.

As disclosed in the first embodiment, for example, porous ceramic, porous metal, organic fabric, or inorganic fabric has thermal resistance that does not cause burning, scorching, subliming, or plastic deformation in a heating step of manufacturing steps of the camera module 1 such as a firing step or a soldering step, and thus does not cause problems of an air-permeable resin in PTL 2 and can be suitably used as a base material of the wiring substrate 21. Therefore, according to the present embodiment, even in the case of, as described above, disposing the porous portion 41 in only a part of the first base material portion 31 which is the compact portion 42, the porous portion 41 can be stably held and stably formed unlike in the case of filling a through hole of a substrate with an air-permeable resin.

According to the present embodiment, the porous portion 41 is disposed in a part of the base material of the wiring substrate 21. Thus, the area of opening in the surface of the wiring substrate 21 is small compared with the case of forming the entire wiring substrate 21 of the porous portion 41. Thus, while air ventilation is degraded compared with the first and second embodiments, a foreign object can be more unlikely to intrude into the internal space 28.

[Fourth Embodiment]

A still another embodiment of the present invention will be described as follows on the basis of FIGS. 4(a) and 4(b).

Differences between the present embodiment and the third embodiment will be described, and constituent elements having the same function as the constituent elements described in the third embodiment will be designated by the same reference signs and will not be described. The same modifications carried out to the third embodiment can obviously be carried out to the present embodiment.

<Overview of Camera Module 1>

Figure 4:
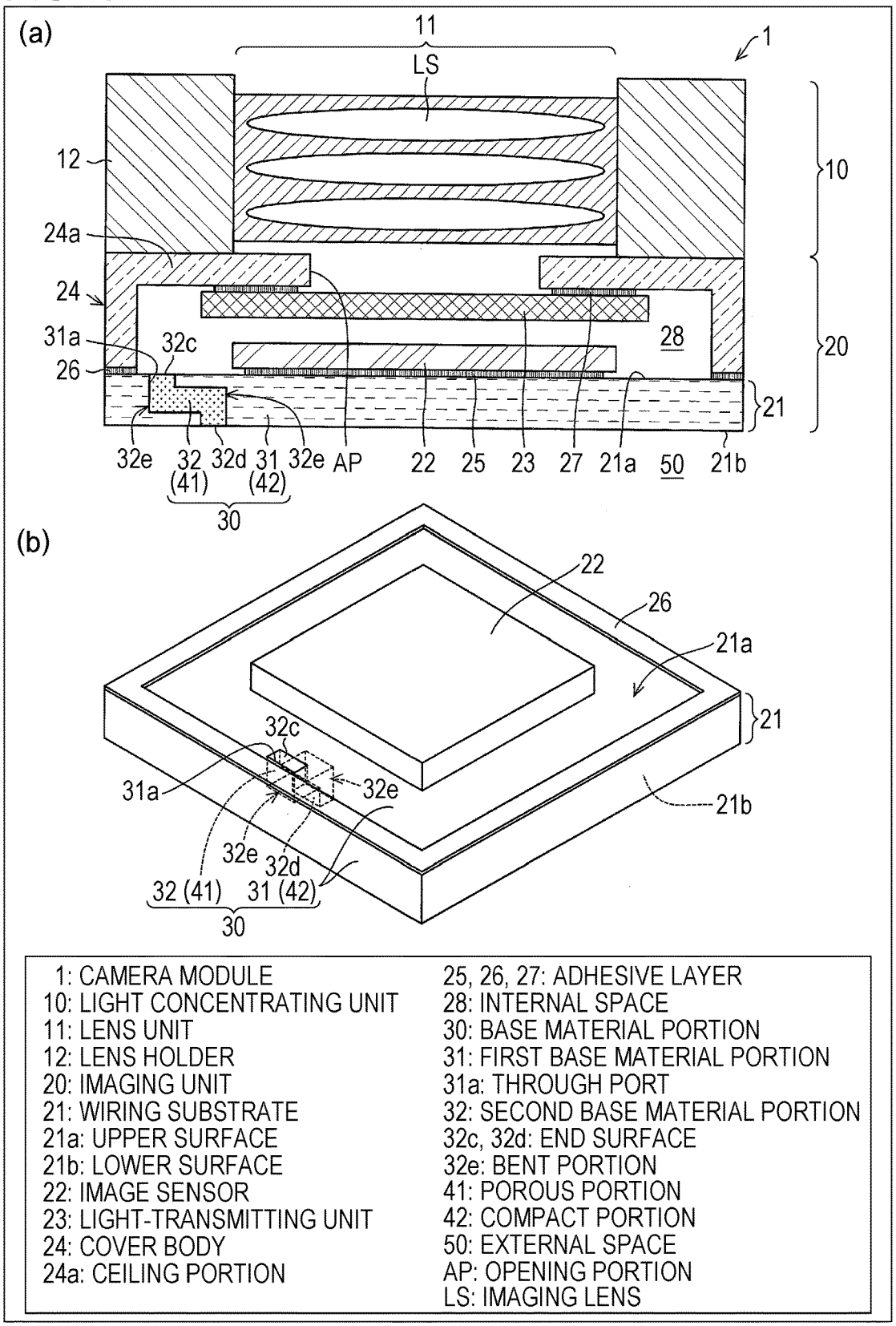
FIG. 4(a) is a sectional view schematically illustrating a schematic configuration of a camera module according to a fourth embodiment.
FIG. 4(b) is a perspective view schematically illustrating a schematic configuration of a main portion of the camera module illustrated in FIG. 4(a).

FIG. 4(a) is a sectional view schematically illustrating a schematic configuration of the camera module 1 according to the present embodiment, and FIG. 4(b) is a perspective view schematically illustrating a schematic configuration of a main portion of the camera module 1 illustrated in FIG. 4(a).

The camera module 1 according to the present embodiment is the same as the camera module 1 according to the third embodiment except that the shape of the porous portion 41 formed in the compact portion 42 in the wiring substrate 21 is different from that in the third embodiment.

Hereinafter, a configuration of the wiring substrate 21 according to the present embodiment will be specifically described.

<Wiring Substrate 21>

As illustrated in FIGS. 4(a) and 4(b), even in the present embodiment, the second base material portion 32 which is the porous portion 41 is disposed in a part (specifically, in the through port 31a of the first base material portion 31) of the first base material portion 31, which is the compact portion 42, in the same manner as the third embodiment from one main surface to the other main surface of the first base material portion 31. Even in the present embodiment, the second base material portion 32 is disposed to be away from the area of mounting of the image sensor 22 and the area of connection of the cover body 24 on the surface of the wiring substrate 21, and is disposed around the area of connection.

Thus, even in the present embodiment, each of the upper surface 21a and the lower surface 21b of the wiring substrate 21 is formed of the porous portion 41 and the compact portion 42 in the same manner as the third embodiment. Thus, one end of the porous portion 41 abuts the internal space 28, and another one end thereof abuts the external space 50. Accordingly, even in the present embodiment, the porous portion 41 connects the internal space 28 and the external space 50.

In the third embodiment, the through port 31a, in other words, the second base material portion 32 disposed in the through port 31a, is disposed straight from the upper surface 21a to the lower surface 21b of the wiring substrate 21. Regarding this point, in the present embodiment, the end surface 32c (the upper end or a first end surface), which is one end of the second base material portion 32, and the end surface 32d (the lower end or a second end surface), which is another one end thereof, are in twisted positions with respect to each other in the wiring substrate 21. The second base material portion 32 has a shape of a crank having a plurality (two in the present embodiment) of bent portions 32e in the wiring substrate 21. Even in the present embodiment, the shape of the through port 31a is the same as the shape of the second base material portion 32 in the same manner as the third embodiment.

<Effect>

As described heretofore, in the present embodiment, the second base material portion 32 which is the porous portion 41 is formed in the shape of a crank. Thus, the length of connection can be extended, and the volume of the air hole can be increased. Accordingly, according to the present embodiment, an effect that the ability to hold an intruding foreign object in the case of the foreign object intruding into the porous portion 41 from the outside can be increased is achieved in addition to the effect disclosed in the third embodiment.

[Fifth Embodiment]

A still another embodiment of the present invention will be described as follows on the basis of FIGS. 5(a) and 5(b).

Differences between the present embodiment and the third and fourth embodiments will be described, and constituent elements having the same function as the constituent elements described in the third and fourth embodiments will be designated by the same reference signs and will not be described. The same modifications carried out to the third and fourth embodiments can obviously be carried out to the present embodiment.

<Overview of Camera Module 1>

Figure 5:
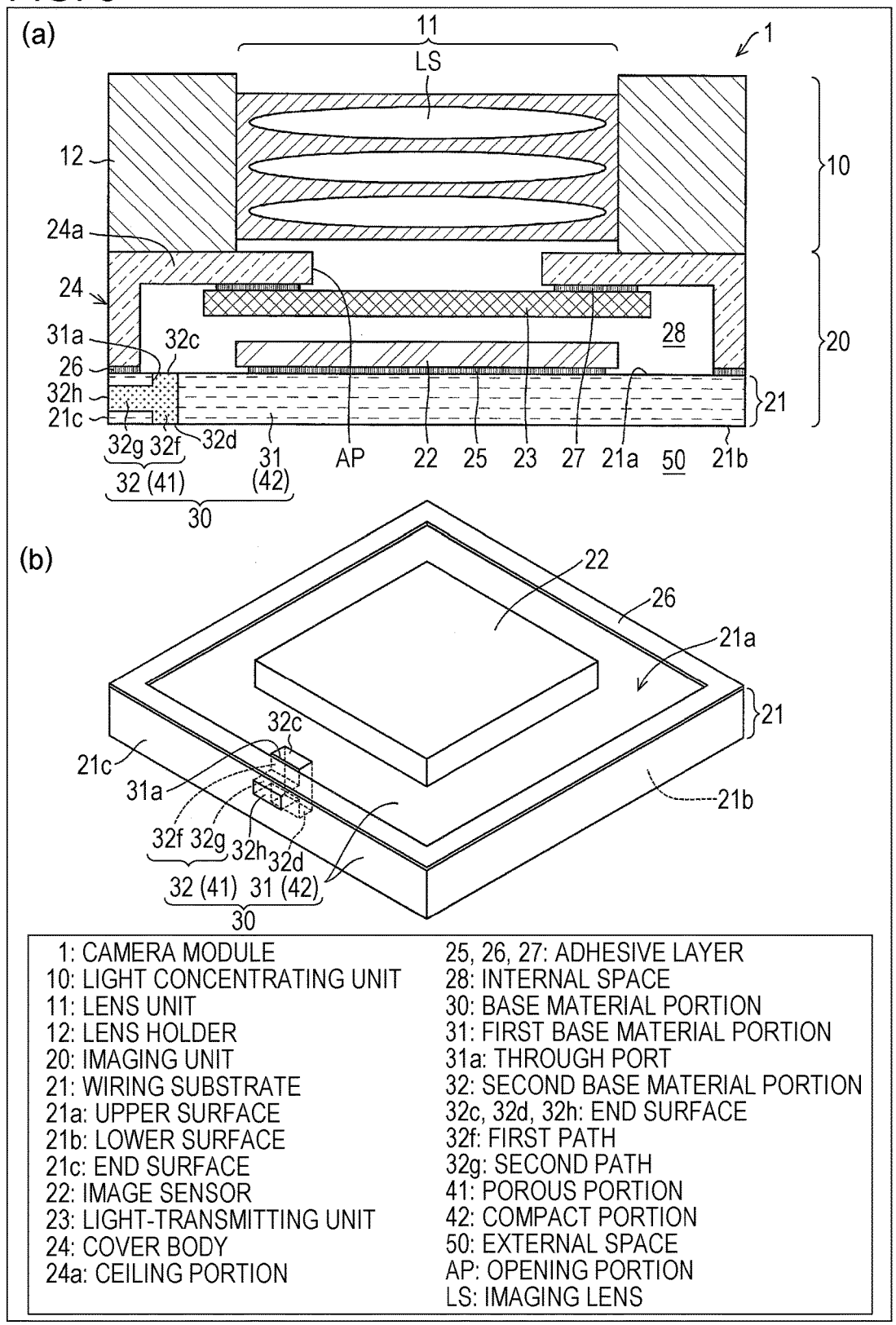
FIG. 5(a) is a sectional view schematically illustrating a schematic configuration of a camera module according to a fifth embodiment.
FIG. 5(b) is a perspective view schematically illustrating a schematic configuration of a main portion of the camera module illustrated in FIG. 5(a).

FIG. 5(a) is a sectional view schematically illustrating a schematic configuration of the camera module 1 according to the present embodiment, and FIG. 5(b) is a perspective view schematically illustrating a schematic configuration of a main portion of the camera module 1 illustrated in FIG. 5(a).

The camera module 1 according to the present embodiment is the same as the camera module 1 according to the third embodiment except that the shape of the porous portion 41 formed in the compact portion 42 in the wiring substrate 21 is different from that in the third embodiment.

<Wiring Substrate 21>

As illustrated in FIGS. 5(a) and 5(b), even in the present embodiment, the second base material portion 32 which is the porous portion 41 is disposed in a part (specifically, in the through port 31a of the first base material portion 31) of the first base material portion 31, which is the compact portion 42, in the same manner as the third embodiment. Even in the present embodiment, the second base material portion 32 is disposed to be away from the area of mounting of the image sensor 22 and the area of connection of the cover body 24 on the surface of the wiring substrate 21, and is disposed around the area of connection.

The second base material portion 32 according to the present embodiment is disposed in a part of the first base material portion 31, which is the compact portion 42, from one main surface to the other main surface of the first base material portion 31, branches off from a path from one main surface to the other main surface of the first base material portion 31, and extends toward one end surface 21c (side surface) of the first base material portion 31.

That is, the second base material portion 32 according to the present embodiment has a shape of ⊥ in the horizontal direction (a shape of T in the horizontal direction) configured of a first path 32f disposed in the up-down direction from one main surface to the other main surface of the first base material portion 31 and a second path 32g disposed horizontally from the first path 32f to the end surface 21c of the first base material portion 31. Even in the present embodiment, the shape of the through port 31a is the same as the shape of the second base material portion 32 in the same manner as the third and fourth embodiments.

Thus, the end surface 32c (the upper end or a first end surface) which is one end of the second base material portion 32 is positioned in the upper surface 21a of the wiring substrate 21 on which the image sensor 22 is mounted. The end surface 32d (the lower end or a second end surface) which is another one end of the second base material portion 32 is positioned in the lower surface 21b of the wiring substrate 21 that is positioned on the opposite side from the surface on which the image sensor 22 is mounted. An end surface 32h (a side end or a third end surface) that is still another one end of the second base material portion 32 is positioned in the end surface 21c of the wiring substrate 21.

Therefore, the upper surface 21a and the lower surface 21b of the wiring substrate 21 illustrated in FIGS. 5(a) and 5(b) and one end surface 21c of the wiring substrate 21 are formed of the porous portion 41 and the compact portion 42.

Accordingly, even in the present embodiment, the porous portion 41 connects the internal space 28 and the external space 50.

<Effect>

As described heretofore, in the present embodiment, the end surface of the porous portion 41 of the wiring substrate 21 that abuts the external space 50 is formed in not only the lower surface 21b of the wiring substrate 21 but also the end surface 21c of the wiring substrate 21. Thus, according to the present embodiment, the area of an external opening of the porous portion 41 can be increased more than that in the third embodiment. Thus, according to the present embodiment, an effect that air ventilation between the internal space 28 and the outside (external space 50) can be further increased is achieved in addition to the effect disclosed in the third embodiment.

<First Modification Example>

FIGS. 5(a) and 5(b) illustratively describe the case of the second base material portion 32 having a shape of ⊥ in the horizontal direction (a shape of T in the horizontal direction) and the second path 32g extending from the first path 32f to one end surface 21c of the first base material portion 31.

However, the present embodiment is not limited thereto. The second path 32g may preferably extend from the first path 32f to at least one end surface 21c of the end surfaces 21c of the first base material portion 31. That is, in the wiring substrate 21 according to the present embodiment, the upper surface 21a and the lower surface 21b and at least one end surface 21c of the end surfaces 21c of the wiring substrate 21 may be preferably formed of the porous portion 41 and the compact portion 42. Accordingly, air ventilation between the internal space 28 and the outside (external space 50) can be further increased.

<Second Modification Example>

FIGS. 5(a) and 5(b) illustratively describe the case of configuring the second base material portion 32 illustrated in FIGS. 3(a) and 3(b) as the first path 32f and disposing the second path 32g in the second base material portion 32 illustrated in FIGS. 3(a) and 3(b).

However, the present embodiment is not limited thereto. For example, the second base material portion 32 illustrated in FIGS. 4(a) and 4(b) may be configured as the first path 32f, and the second path 32g may be disposed in the second base material portion 32 illustrated in FIGS. 4(a) and 4(b). That is, the first path 32f may not be formed straight and may be formed in the shape of a crank. In this case, the effect described above can be achieved in addition to the effect disclosed in the fourth embodiment.

[Sixth Embodiment]

A still another embodiment of the present invention will be described as follows on the basis of FIGS. 6(a) and 6(b).

Differences between the present embodiment and the third to fifth embodiments will be described, and constituent elements having the same function as the constituent elements described in the third to fifth embodiments will be designated by the same reference signs and will not be described. The same modifications carried out to the third to fifth embodiments can obviously be carried out to the present embodiment.

Figure 6:
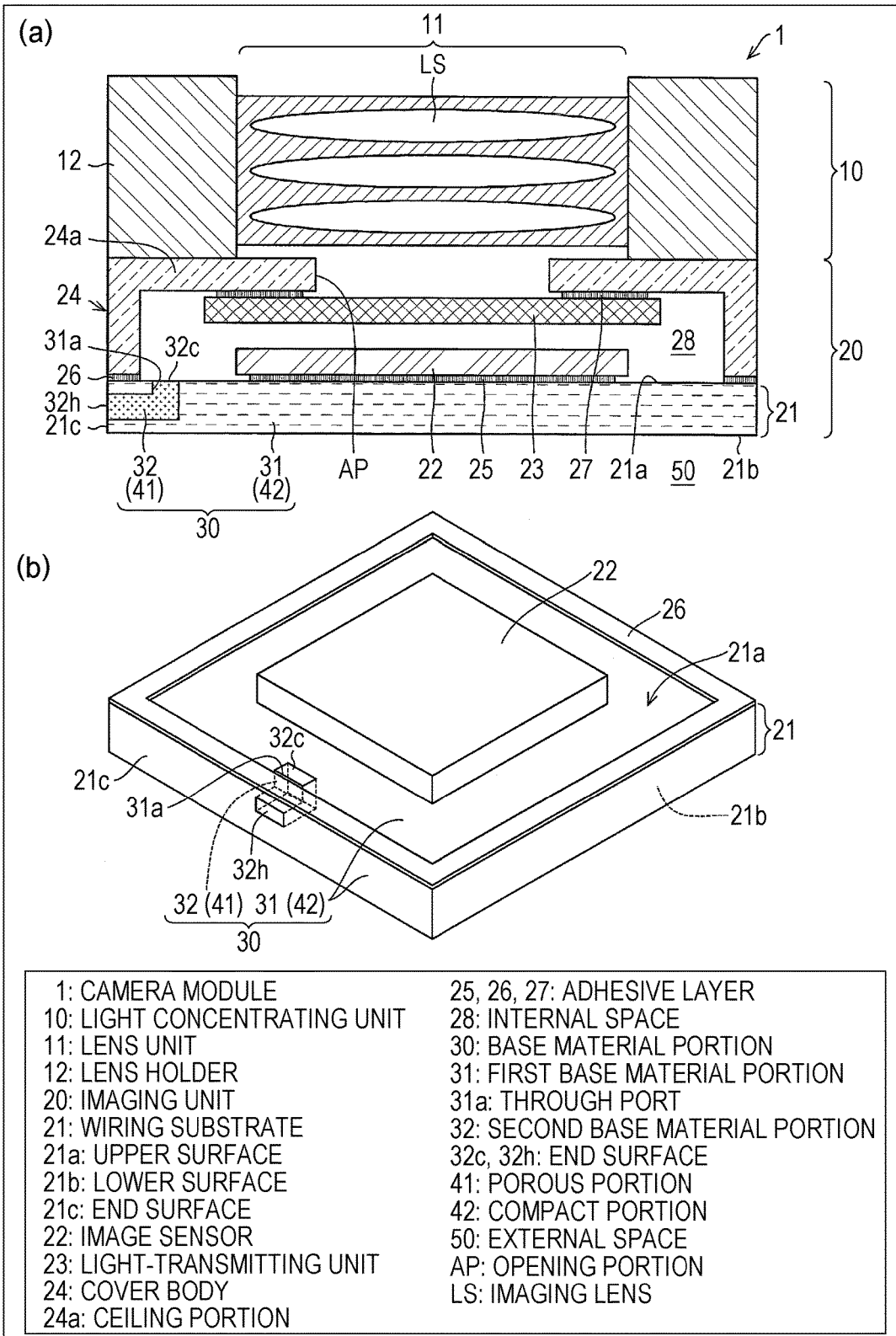
FIG. 6(a) is a sectional view schematically illustrating a schematic configuration of a camera module according to a sixth embodiment.
FIG. 6(b) is a perspective view schematically illustrating a schematic configuration of a main portion of the camera module illustrated in FIG. 6(a).

FIG. 6(a) is a sectional view schematically illustrating a schematic configuration of the camera module 1 according to the present embodiment, and FIG. 6(b) is a perspective view schematically illustrating a schematic configuration of a main portion of the camera module 1 illustrated in FIG. 6(a).

The camera module 1 according to the present embodiment is the same as the camera module 1 according to the third embodiment except that the shape of the porous portion 41 formed in the compact portion 42 in the wiring substrate 21 is different from that in the third embodiment.

<Wiring Substrate 21>

As illustrated in FIGS. 6(a) and 6(b), even in the wiring substrate 21 according to the present embodiment, the second base material portion 32 which is the porous portion 41 is disposed in a part (specifically, in the through port 31a of the first base material portion 31) of the first base material portion 31, which is the compact portion 42, in the same manner as the third to fifth embodiments. Even in the present embodiment, the second base material portion 32 is disposed to be away from the area of mounting of the image sensor 22 and the area of connection of the cover body 24 on the surface of the wiring substrate 21, and is disposed around the area of connection.

The second base material portion 32 according to the present embodiment has an L shape, and the end surface 32c (the upper end or a first end surface) which is one end of the second base material portion 32 is positioned in the upper surface 21a of the wiring substrate 21, and the end surface 32h (a side end or a second end surface) which is another one end thereof is positioned in the end surface 21c of the wiring substrate 21. Even in the present embodiment, the shape of the through port 31a is the same as the shape of the second base material portion 32 in the same manner as the third to fifth embodiments.

Therefore, while the porous portion 41 connects the internal space 28 and the external space 50 even in the present embodiment, only the upper surface 21a and the end surface 21c of the wiring substrate 21 are formed of the porous portion 41 and the compact portion 42 in the present embodiment, and the lower surface 21b of the wiring substrate 21 is formed of only the compact portion 42.

<Effect>

As described heretofore, in the present embodiment, the end surface 32h (a side end or a second end surface) which is an external opening of the porous portion 41 of the wiring substrate 21 is disposed in the end surface 21c of the wiring substrate 21. Thus, according to the present embodiment, an effect that air ventilation between the internal space 28 and the external space 50 is not hindered when the camera module 1 is placed with the wiring substrate 21 in contact with the ground is achieved in addition to the effect disclosed in the third embodiment.

<Modification Example>

FIGS. 6(a) and 6(b) illustratively describe the case of the second base material portion 32 having an L shape and having an external opening thereof disposed in one end surface 21c of the wiring substrate 21.

However, the present embodiment is not limited thereto. The external opening of the second base material portion 32 may be preferably disposed in at least one end surface 21c of the end surfaces 21c of the first base material portion 31. That is, in the wiring substrate 21 according to the present embodiment, the upper surface 21a and at least one end surface 21c of the end surfaces 21c may be preferably formed of the porous portion 41 and the compact portion 42. Accordingly, air ventilation between the internal space 28 and the outside (external space 50) can be further increased.

[Seventh Embodiment]

A still another embodiment of the present invention will be described as follows on the basis of FIGS. 7(a) and 7(b) and FIGS. 8(a) and 8(b).

Differences between the present embodiment and the third to sixth embodiments will be described, and constituent elements having the same function as the constituent elements described in the third to sixth embodiments will be designated by the same reference signs and will not be described. The same modifications carried out to the third to sixth embodiments can obviously be carried out to the present embodiment.

FIG. 7(a) is a sectional view schematically illustrating a schematic configuration of the camera module 1 according to the present embodiment, and FIG. 7(b) is a perspective view schematically illustrating a schematic configuration of a main portion of the camera module 1 illustrated in FIG. 7(a).

The camera module 1 according to the present embodiment is the same as the camera module 1 according to the third embodiment except that the shape of the porous portion 41 formed in the compact portion 42 in the wiring substrate 21 is different from that in the third embodiment.

<Wiring Substrate 21>

As illustrated in FIGS. 7(a) and 7(b), in the wiring substrate 21 according to the present embodiment, a recess portion 31b instead of the through port 31a is disposed on the upper surface 21a side of the first base material portion 31 which is the compact portion 42.

The second base material portion 32 which is the porous portion 41 is disposed in the recess portion 31b in such a manner that the surface thereof is in the same plane as the surface of the first base material portion 31.

The second base material portion 32 is formed through the area of connection of the cover body 24 in a position separated from the area of mounting of the image sensor 22 on the surface of the wiring substrate 21.

That is, the width of the second base material portion 32 is formed to be greater than the width of the adhesive layer 26 connecting the cover body 24 to the wiring substrate 21, and the cover body 24 is formed to pass on the second base material portion 32.

Accordingly, the surface of the second base material portion 32 is divided into the internal space 28 side surface and the external space 50 side surface by the cover body 24 fixed on the second base material portion 32.

That is, even in the present embodiment, the internal space 28 and the external space 50 are connected to each other by the porous portion 41 which is the second base material portion 32.

<Effect>

As described heretofore, in the present embodiment, the upper surface of the porous portion 41 abuts the internal space 28 and the external space 50 with the cover body 24 interposed therebetween. Therefore, according to the present embodiment, the internal space 28 and the external space 50 can be connected without forming a through port in the compact portion 42.

Thus, the camera module 1 according to the present embodiment does not have a tunnel-shaped connecting portion in the wiring substrate 21 and has a simple structure. Thus, according to the present embodiment, cost can be decreased in manufacturing steps of the wiring substrate 21, and consequently an effect that cost of the camera module 1 can be decreased is achieved in addition to the effect disclosed in the third embodiment.

According to the present embodiment, the lower surface 21b and the end surface 21c of the wiring substrate 21 are formed of only the compact portion 42. Thus, substrate strength can be improved. According to the present embodiment, only the upper surface 21a of the wiring substrate 21 is formed of the porous portion 41 and the compact portion 42. Thus, an effect that air ventilation between the internal space 28 and the outside is not hindered when the camera module 1 is placed with the wiring substrate 21 in contact with the ground is also achieved.

<First Modification Example>

Figure 7:
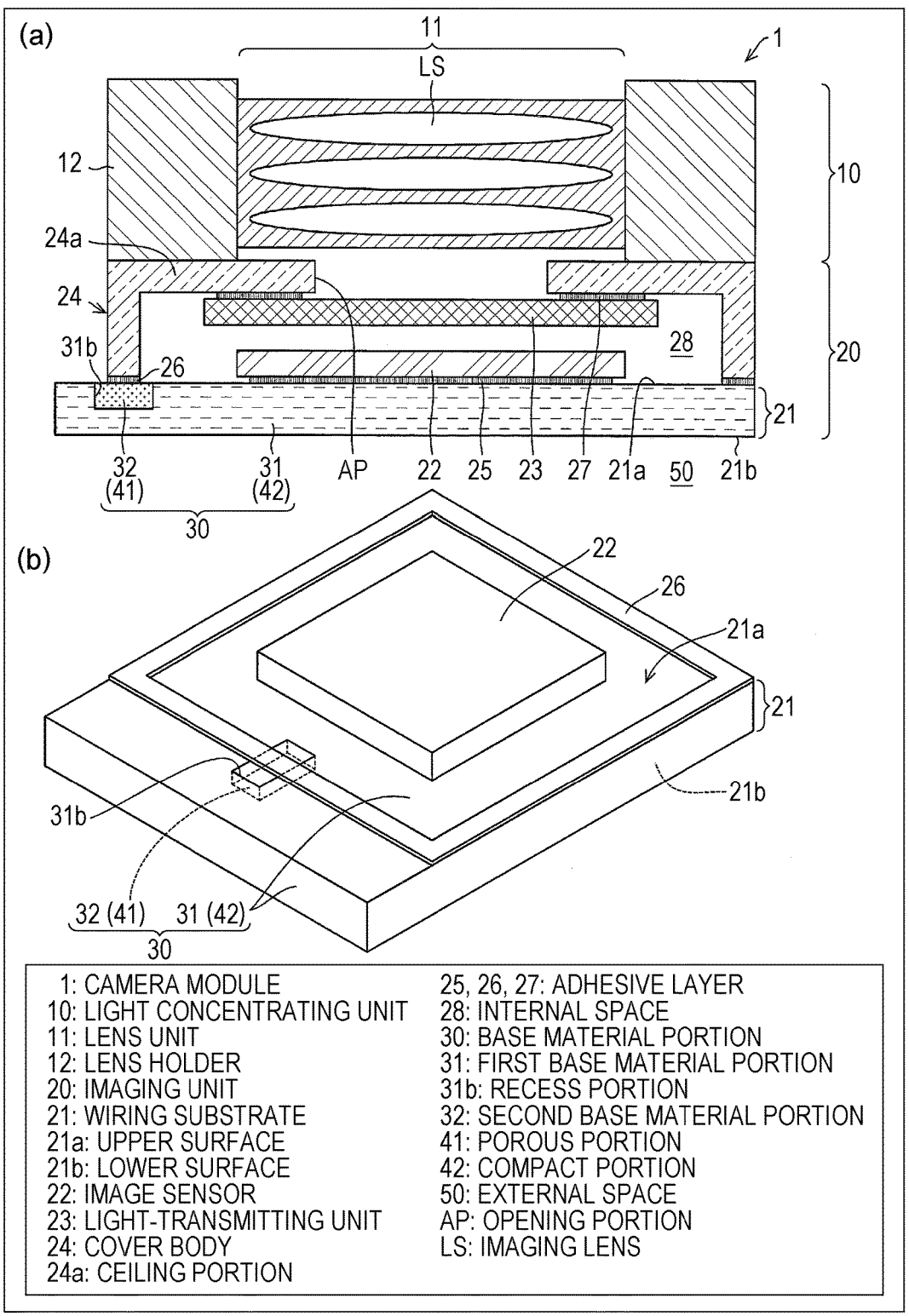
FIG. 7(a) is a sectional view schematically illustrating a schematic configuration of a camera module according to a seventh embodiment.
FIG. 7(b) is a perspective view schematically illustrating a schematic configuration of a main portion of the camera module illustrated in FIG. 7(a).

FIGS. 7(*a*) and 7(*b*) illustratively illustrate the case of forming the second base material portion 32 along one edge of the adhesive layer 26 formed in the shape of a frame (in other words, one edge of a side wall of the cover body 24).

However, the present embodiment is not limited thereto. The second base material portion 32 may be formed along at least one edge of the adhesive layer 26 formed in the shape of a frame or may be formed on two or more edges.

<Second Modification Example>

Figure 8:
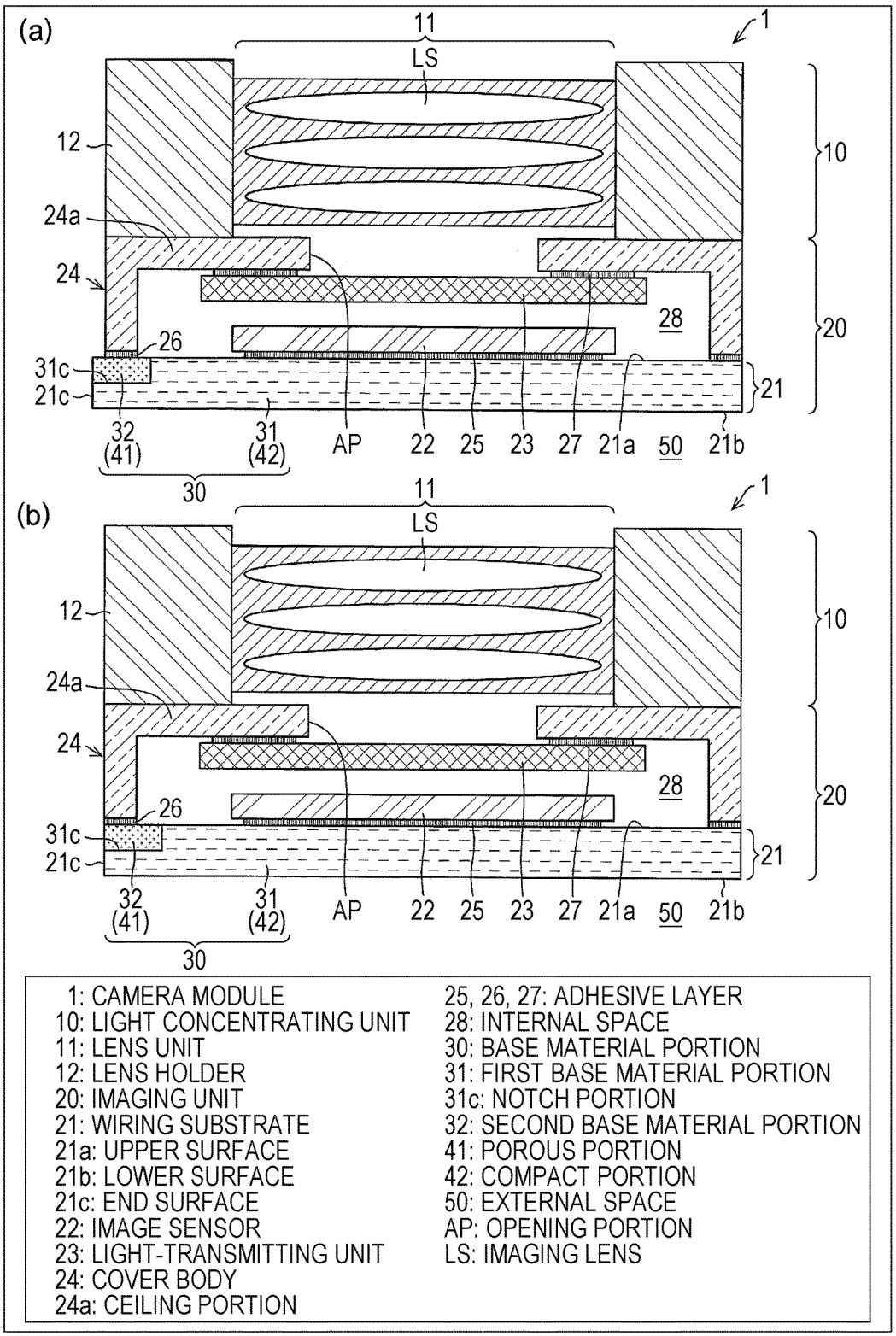
FIGS. 8(a) and 8(b) are sectional views schematically illustrating a schematic configuration of a camera module according to a second modification example of the seventh embodiment.

FIGS. 8(*a*) and 8(*b*) are sectional views schematically illustrating a schematic configuration of the camera module 1 according to the present modification example.

FIGS. 7(*a*) and 7(*b*) illustratively describe the case of forming the recess portion 31b on the upper surface of the first base material portion 31 (that is, the upper surface 21a of the wiring substrate 21) and forming the second base material portion 32 in the recess portion 31b.

However, the present embodiment is not limited thereto. For example, as illustrated in FIGS. 8(*a*) and 8(*b*), a notch portion 31c instead of the recess portion 31b may be formed on the upper surface of the first base material portion 31 (that is, the upper surface 21a of the wiring substrate 21), and the second base material portion 32 may be formed in the notch portion 31c.

In the example illustrated in FIG. 8(*a*), the upper surface of the porous portion 41 abuts the internal space 28 and the external space 50 with the cover body 24 interposed therebetween, and a side surface of the porous portion 41 abuts the external space 50.

In the example illustrated in FIG. 8(*b*), the upper surface of the porous portion 41 abuts the internal space 28, and a side surface of the porous portion 41 abuts the external space 50.

Even in the present modification example, the internal space 28 and the external space 50 can be connected without forming a through port (that is, a tunnel-shaped connecting portion) in the compact portion 42 in the same manner as FIGS. 7(*a*) and 7(*b*). Therefore, even in the present modification example, the same effect as the camera module 1 illustrated in FIGS. 7(*a*) and 7(*b*) described above can be achieved. According to the present modification example, an effect that the size of the wiring substrate 21 can be reduced from that in FIGS. 7(*a*) and 7(*b*) is additionally achieved.

Even in the present modification example, the second base material portion 32 may be formed on at least one edge of the upper surface 21a of the wiring substrate 21 or may be formed on two or more edges in the same manner as the first modification example.

[Eighth Embodiment]

A still another embodiment of the present invention will be described as follows on the basis of FIGS. 9(*a*) and 9(*b*).

Differences between the present embodiment and the third to seventh embodiments will be described, and constituent elements having the same function as the constituent elements described in the third to seventh embodiments will be designated by the same reference signs and will not be described. The same modifications carried out to the third to seventh embodiments can obviously be carried out to the present embodiment.

Figure 9:
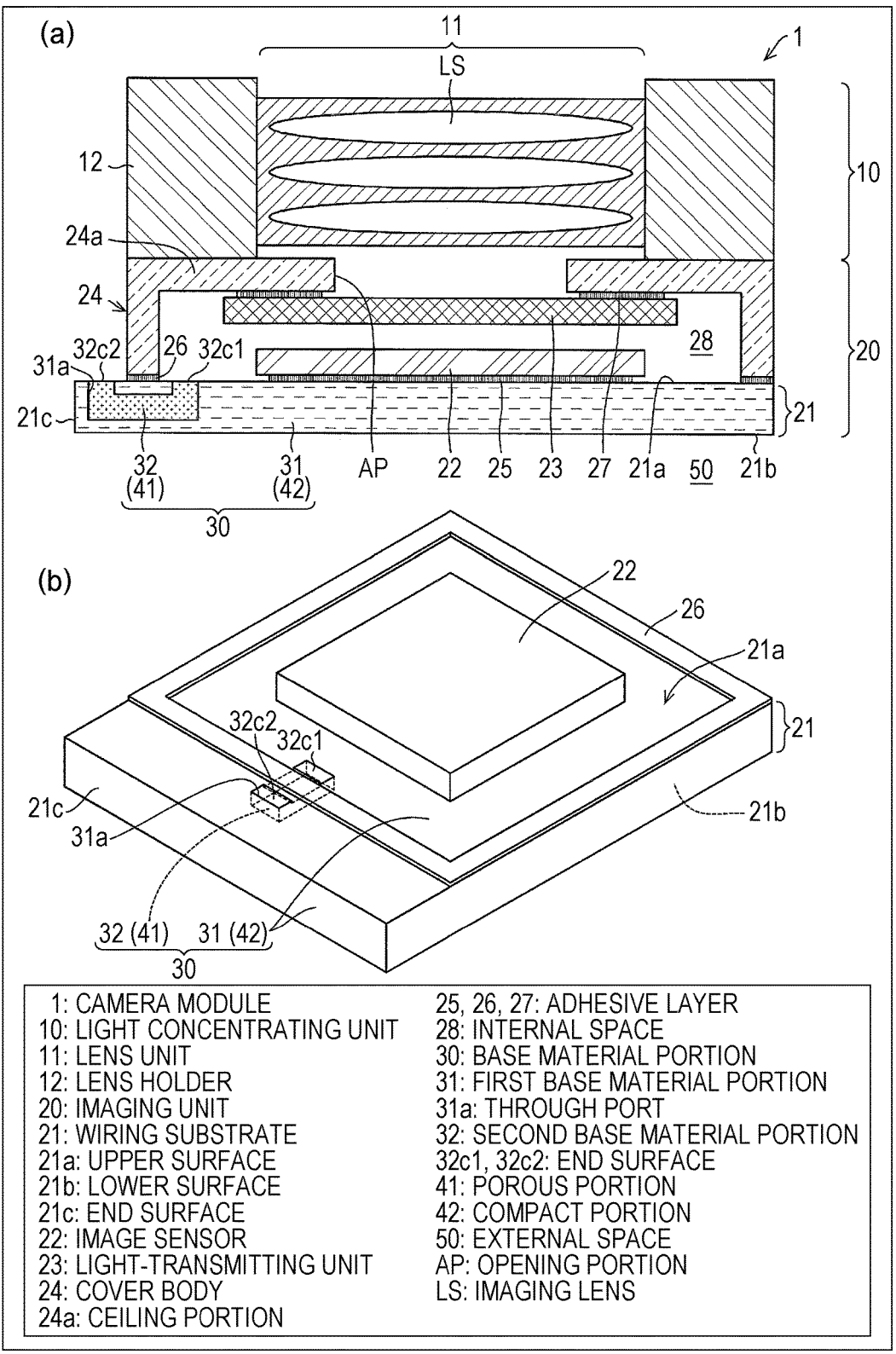
FIG. 9(a) is a sectional view schematically illustrating a schematic configuration of a camera module according to an eighth embodiment.
FIG. 9(b) is a perspective view schematically illustrating a schematic configuration of a main portion of the camera module illustrated in FIG. 9(a).

FIG. 9(*a*) is a sectional view schematically illustrating a schematic configuration of the camera module 1 according to the present embodiment, and FIG. 9(*b*) is a perspective view schematically illustrating a schematic configuration of a main portion of the camera module 1 illustrated in FIG. 9(*a*).

The camera module 1 according to the present embodiment is the same as the camera module 1 according to the third embodiment except that the shape of the porous portion 41 formed in the compact portion 42 in the wiring substrate 21 is different from that in the third embodiment.

<Wiring Substrate 21>

As illustrated in FIGS. 9(*a*) and 9(*b*), even in the wiring substrate 21 according to the present embodiment, the second base material portion 32 which is the porous portion 41 is disposed in the through port 31a of the first base material portion 31, which is the compact portion 42, in the same manner as the third to sixth embodiments. Even in the present embodiment, the second base material portion 32 is disposed to be away from the area of mounting of the image sensor 22 and the area of connection of the cover body 24 on the surface of the wiring substrate 21, and is disposed around the area of connection.

The second base material portion 32 according to the present embodiment has an approximately U shape. The second base material portion 32 is formed through the area of connection of the cover body 24 in a position separated from the area of mounting of the image sensor 22 on the surface of the wiring substrate 21.

That is, the cover body 24 is mounted on the first base material portion 31 between end surfaces 32c1 and 32c2 to pass between the end surfaces 32c1 and 32c2 of the second base material portion 32 in the upper surface 21a of the wiring substrate 21.

Accordingly, one end surface 32c1 (a first upper end or a first end surface) and the other end surface 32c2 (a second upper end or a second end surface) of the second base material portion 32 are divided into the internal space 28 side surface and the external space 50 side surface by the cover body 24.

That is, in the present embodiment, one end surface 32c1 of the second base material portion 32 is positioned in the upper surface 21a of the wiring substrate 21 abutting the internal space 28, and the other end surface 32c2 is positioned in the upper surface 21a of the wiring substrate 21 abutting the external space 50. Even in the present embodiment, the shape of the through port 31a is the same as the shape of the second base material portion 32 in the same manner as the third to sixth embodiments.

Therefore, while the porous portion 41 connects the internal space 28 and the external space 50 even in the present embodiment, only the upper surface 21a of the wiring substrate 21 is formed of the porous portion 41 and the compact portion 42 in the present embodiment, and the lower surface 21b and the end surface 21c of the wiring substrate 21 are formed of only the compact portion 42.

<Effect>

Even in the present embodiment, the lower surface 21b and the end surface 21c of the wiring substrate 21 are formed of only the compact portion 42 in the same manner as the seventh embodiment. Thus, substrate strength can be improved.

Even in the present embodiment, only the upper surface 21a of the wiring substrate 21 is formed of the porous portion 41 and the compact portion 42 in the same manner as the seventh embodiment. Thus, air ventilation between the internal space 28 and the outside is not hindered when the camera module 1 is placed with the wiring substrate 21 in contact with the ground.

In the present embodiment, the cover body 24 is bonded to the first base material portion 31 (that is, the compact portion 42) of the wiring substrate 21 through the adhesive layer 26. Thus, according to the present embodiment, an effect that an adhesive in the adhesive layer 26 does not permeate the porous portion 41 and damage the porous structure is also achieved in addition to the effect disclosed in the third embodiment and the effect described above.

<First Modification Example>

Even in the present embodiment, as illustrated in FIGS. 9(a) and 9(b), the second base material portion 32 is illustratively illustrated in the case of being formed along one edge of the adhesive layer 26 formed in the shape of a frame (in other words, one edge of a side wall of the cover body 24).

However, the present embodiment is not limited thereto. The second base material portion 32 may be formed along at least one edge of the adhesive layer 26 formed in the shape of a frame or may be formed on two or more edges.

<Second Modification Example>

In the present embodiment, as illustrated in FIGS. 9(a) and 9(b), the second base material portion 32 is illustratively described in the case of being formed in an approximately U shape.

However, the present embodiment is not limited thereto. The second base material portion 32 is not limited to the shape if the second base material portion 32 has, in the upper surface 21a of the wiring substrate 21, at least one end surface abutting the internal space 28 and at least one end surface abutting the external space 50 with the cover body 24 interposed therebetween. For example, the second base material portion 32 may have a shape that branches into a plurality of branches in the first base material portion 31.

[Ninth Embodiment]

A still another embodiment of the present invention will be described as follows on the basis of FIGS. 10(a) and 10(b).

Differences between the present embodiment and the third to fifth embodiments will be described, and constituent elements having the same function as the constituent elements described in the third to fifth embodiments will be designated by the same reference signs and will not be described. The same modifications carried out to the third to fifth embodiments can obviously be carried out to the present embodiment.

<Schematic Configuration of Camera Module 1>

Figure 10:
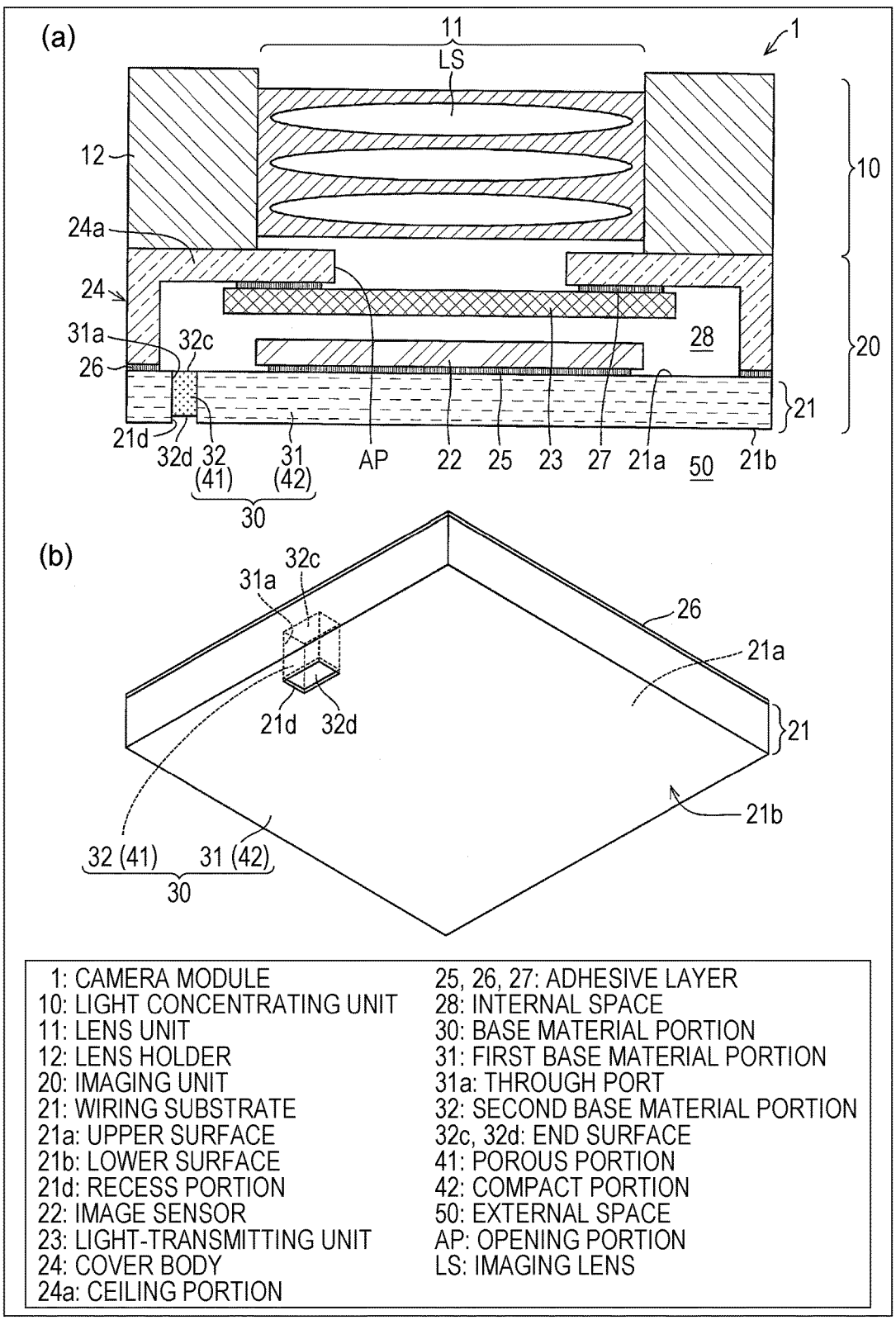
FIG. 10(a) is a sectional view schematically illustrating a schematic configuration of a camera module according to a ninth embodiment.
FIG. 10(b) is a perspective view schematically illustrating a schematic configuration of a main portion of the camera module illustrated in FIG. 10(a).

FIG. 10(a) is a sectional view schematically illustrating a schematic configuration of the camera module 1 according to the present embodiment, and FIG. 10(b) is a perspective view schematically illustrating a schematic configuration of a main portion of the camera module 1 illustrated in FIG. 10(a).

The camera module 1 according to the present embodiment is the same as the camera module 1 according to the third embodiment except that the second base material portion 32 which is the porous portion 41 is formed in a part of the through port 31a of the first base material portion 31 which is the compact portion 42.

<Wiring Substrate 21>

As illustrated in FIGS. 10(a) and 10(b), in the wiring substrate 21 according to the present embodiment, the end surface 32c (the upper end or a first end surface) which is one end of the second base material portion 32 abuts the internal space 28, and the end surface 32d (the lower end or a second end surface) which is another one end thereof abuts the external space 50 on the lower surface 21b side of the wiring substrate 21 in the same manner as the third embodiment.

In the present embodiment, the end surface 32c on the upper surface 21a side of the wiring substrate 21 has the same height as the surface of the surrounding first base material portion 31 (that is, the surface of the first base material portion 31 on the upper surface 21a side of the wiring substrate 21) in the same manner as the third embodiment. However, the end surface 32d which is an external opening on the lower surface 21b side of the wiring substrate 21 is recessed from the surface of the surrounding first base material portion 31 (the surface of the first base material portion 31 on the lower surface 21b side of the wiring substrate 21).

That is, while the end surface 32c is positioned in the upper surface 21a of the wiring substrate 21, the end surface 32d is positioned above the lower surface 21b of the wiring substrate 21.

Thus, a recess portion 21d that is formed of the through port 31a of the first base material portion 31 and the second base material portion 32 in the through port 31a is disposed in the lower surface 21b of the wiring substrate 21 according to the present embodiment.

<Method for Forming Recess Portion 21d>

As described above, for example, in the case of configuring the first base material portion 31 of a ceramic substrate, a plurality of base material layers configured of ceramic is stacked and fired to be integrated, and thereby the first base material portion 31 having a desired thickness can be formed.

At this point, for example, by forming an opening portion constituting the through port 31a in a base material layer constituting the first base material layer, filling the opening portion with a porous material (porous raw material), and stacking and firing the base material layer, the second base material portion 32 can be formed inside of the first base material portion 31.

In the present embodiment, for example, when a plurality of base material layers is stacked, a base material that has an opening is stacked without filling the opening portion constituting the through port 31a with a porous material, for the part forming the recess portion 21d. That is, a base material in which a through port (opening portion) is opened in a position corresponding to a through port (opening portion) filled with a porous material is stacked on a base material in which the through port (opening portion) constituting the through port 31a is filled with the porous material, and these base materials are fired. Thus, the recess portion 21d can be formed in the wiring substrate 21.

Even in the case of the first base material portion 31 being an organic substrate in which organic fabric is used or being an inorganic substrate in which inorganic fabric is used, a base material in which a through port (opening portion) is opened in a position corresponding to a through port (opening portion) filled with a porous material is stacked on a base material in which the through port (opening portion) constituting the through port 31a is filled with the porous material, as described above, and these base materials are pressed with a laminating press. Thus, the recess portion 21d can be formed in the wiring substrate 21.

A method for forming the recess portion 21d is not limited thereto. For example, the recess portion 21d may be formed by performing a light exposing or developing step after printing a solder resist on the surface of the wiring substrate 21 where a recess portion is formed.

<Effect>

As described heretofore, in the wiring substrate 21 according to the present embodiment, one end of the porous portion 41 on the lower surface 21b side of the wiring substrate 21 is recessed from the lower surface 21b of the wiring substrate 21 by the recess portion 21d. Thus, according to the present embodiment, an effect that a problem in air ventilation due to collapsing of the pore of the porous portion 41 by a scratch caused by external contact can be reduced is achieved in addition to the effect disclosed in the third embodiment.

<Modification Example>

The present embodiment illustratively describes the case of the end surface 32d of the second base material portion 32 on the lower surface 21b side of the wiring substrate 21 illustrated in the third embodiment, specifically, in FIGS. 3(a) and 3(b), being recessed (sunk) from the surface of the surrounding first base material portion 31.

However, the wiring substrate 21 according to the present embodiment may preferably include the first base material portion 31 and the second base material portion 32, and the second base material portion 32 may preferably include a first end surface abutting the internal space 28 and a second end surface abutting the external space 50 on the lower surface 21b side of the wiring substrate 21 with the second end surface sunk from (that is, positioned above) the surface of the first base material portion 31 on the lower surface 21b side of the wiring substrate 21.

Therefore, the wiring substrate 21 according to the present embodiment may have a configuration in which the end surface 32d of the second base material portion 32 in the wiring substrate 21 according to the fourth or fifth embodiment is recessed (sunk) from the surface of the surrounding first base material portion 31. In this case, the effect described above can be achieved in addition to the effect disclosed in the fourth or fifth embodiment.

[Tenth Embodiment]

A still another embodiment of the present invention will be described as follows on the basis of FIGS. 11(a) and 11(b).

Differences between the present embodiment and the first to ninth embodiments will be described, and constituent elements having the same function as the constituent elements described in the first to ninth embodiments will be designated by the same reference signs and will not be described. The same modifications carried out to the first to ninth embodiments can obviously be carried out to the present embodiment.

<Schematic Configuration of Camera Module 1>

Figure 11:
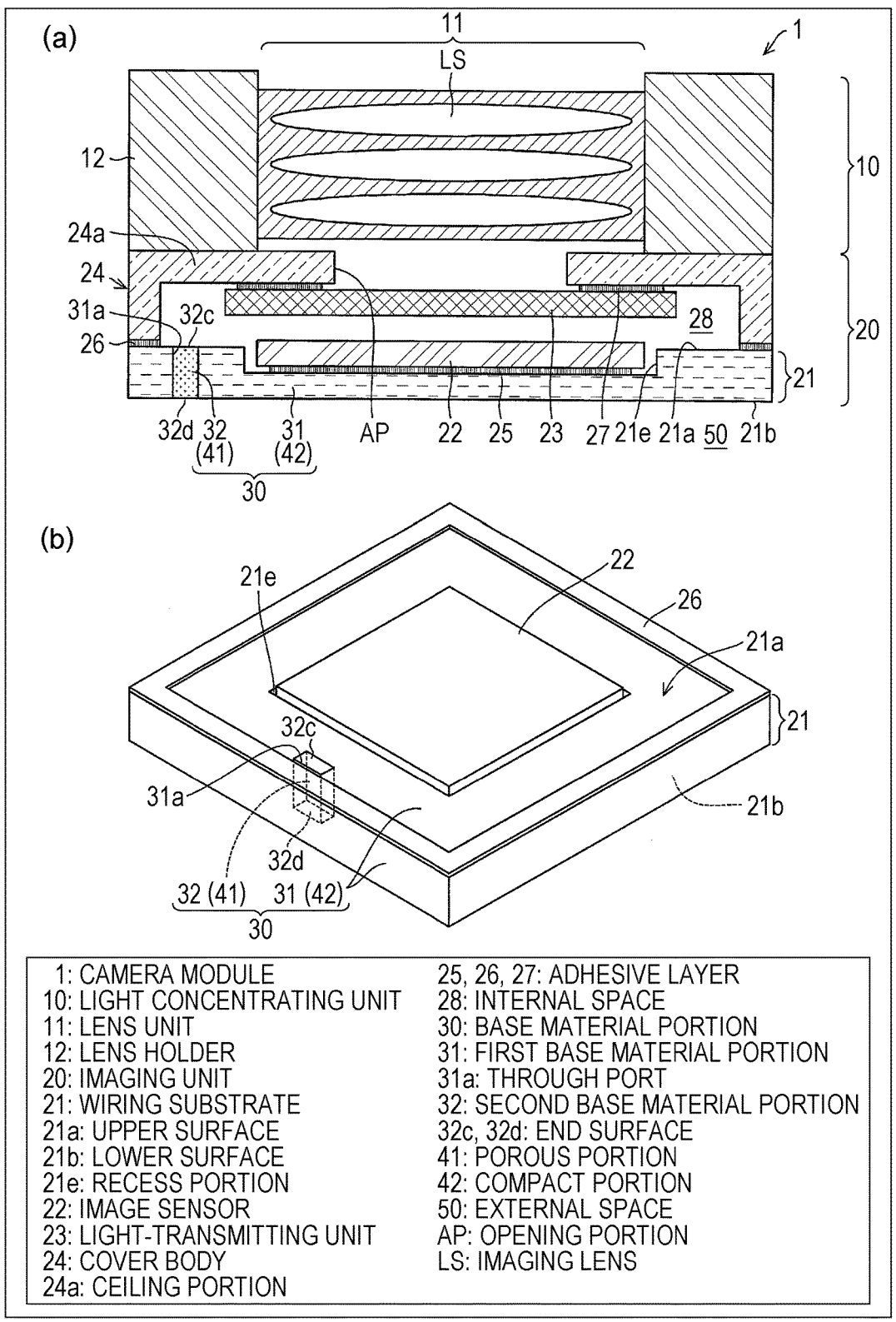
FIG. 11(a) is a sectional view schematically illustrating a schematic configuration of a camera module according to a tenth embodiment.
FIG. 11(b) is a perspective view schematically illustrating a schematic configuration of a main portion of the camera module illustrated in FIG. 11(a).

FIG. 11(a) is a sectional view schematically illustrating a schematic configuration of the camera module 1 according to the present embodiment, and FIG. 11(b) is a perspective view schematically illustrating a schematic configuration of a main portion of the camera module 1 illustrated in FIG. 11(a).

The camera module 1 according to the present embodiment is the same as the camera module 1 according to the third embodiment except that a recess portion 21e is disposed in the upper surface 21a, which is the surface of the wiring substrate 21 where the image sensor 22 is mounted, and that the image sensor 22 is arranged in the recess portion 21e.

That is, in the wiring substrate 21 according to the present embodiment, the area of mounting of the image sensor 22 is recessed from the surrounding area thereof. The second base material portion 32 which is the porous portion 41 is formed in an area, around the area of mounting of the image sensor 22, that has a greater thickness than the area of mounting of the image sensor 22 (that is, outside of the recess portion 21e) in the wiring substrate 21.

<Effect>

As described heretofore, according to the present embodiment, the image sensor 22 is arranged in the recess portion 21e. Thus, the height of the cover body 24 can be decreased, and the size of the camera module 1 can be reduced. The porous portion 41 is formed in the thick part of the first base material portion 31, which is the compact portion 42, outside of the recess portion 21e. Thus, the volume of the air hole can be increased. Thus, according to the present embodiment, an effect that the ability to hold an intruding foreign object in the case of the foreign object intruding into the porous portion 41 from the outside can be increased even with reduction of the size of the camera module 1 is achieved in addition to the effect disclosed in, for example, the third embodiment.

The present embodiment illustratively describes changes from the camera module 1 according to the third embodiment. However, the present embodiment is not limited thereto. The changes described above may obviously be made to the camera module 1 according to the first, second, and fourth to ninth embodiments. In this case, the effect described above can be achieved in addition to the effects disclosed in the first, second, and fourth to ninth embodiments.

[Eleventh Embodiment]

A still another embodiment of the present invention will be described as follows on the basis of FIGS. 12(a) and 12(b).

Differences between the present embodiment and the first to ninth embodiments will be described, and constituent elements having the same function as the constituent elements described in the first to ninth embodiments will be designated by the same reference signs and will not be described.

While even the present embodiment illustratively describes changes from the camera module 1 according to the third embodiment, the same modifications carried out to the first to ninth embodiments can obviously be carried out to the present embodiment.

<Schematic Configuration of Camera Module 1>

Figure 12:
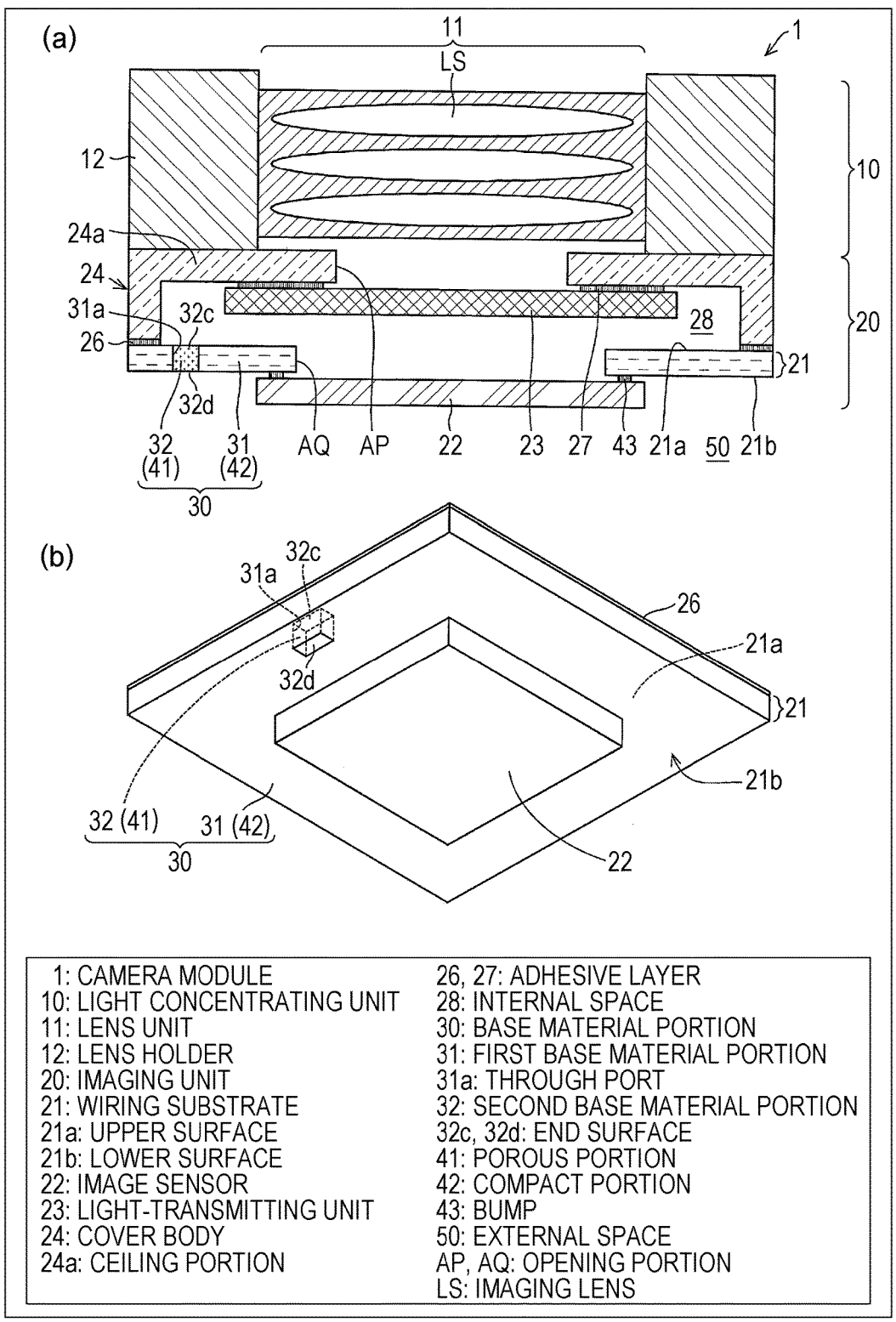
FIG. 12(a) is a sectional view schematically illustrating a schematic configuration of a camera module according to an eleventh embodiment.
FIG. 12(b) is a perspective view schematically illustrating a schematic configuration of a main portion of the camera module illustrated in FIG. 12(a).

FIG. 12(a) is a sectional view schematically illustrating a schematic configuration of the camera module 1 according to the present embodiment, and FIG. 12(b) is a perspective view schematically illustrating a schematic configuration of a main portion of the camera module 1 illustrated in FIG. 12(a).

The camera module 1 according to the present embodiment has the same configuration as the camera module 1 according to the third embodiment except for a method for mounting the image sensor 22 on the wiring substrate 21 and the thickness of the wiring substrate 21.

<Wiring Substrate 21>

As illustrated in FIGS. 12(a) and 12(b), an opening portion AQ (through port) is disposed in the central portion of the wiring substrate 21. The image sensor 22 is electrically connected to the lower surface 21b of the wiring substrate 21 by a bump 43 or the like to overlap with the opening portion AQ.

Thus, the opening portion AQ is closed by the image sensor 22 and the bump 43 or the like. The image sensor 22 and the light-transmitting unit 23 are disposed to face each other in the wiring substrate 21 with the opening portion AQ interposed therebetween. Thus, in the present embodiment, the internal space 28 surrounded by the image sensor 22, the wiring substrate 21, the cover body 24, and the light-transmitting unit 23 is formed in the imaging unit 20.

A connected portion (joint portion) of the wiring substrate 21 and the image sensor 22 may be reinforced with a resin material (not illustrated) such as an epoxy resin.

In FIGS. 12(a) and 12(b), the thickness of the wiring substrate 21 is smaller than that in the third embodiment when the image sensor 22 is connected to the lower surface 21b of the wiring substrate 21.

However, according to the present embodiment, the image sensor 22 is connected to the lower surface 21b of the wiring substrate 21. Thus, the height of the cover body 24 can be decreased. Thus, the thickness of the wiring substrate 21 in the present embodiment is not necessarily required to be smaller than that in the third embodiment.

<Effect>

As described heretofore, according to the present embodiment, the image sensor 22 is fixed to the wiring substrate 21 in which the opening portion AQ is disposed. A mounting method such as flip chip mounting can be applied in mounting of the image sensor 22.

In flip chip mounting, the image sensor 22 is not connected by a wire as in wire bonding and is, as described above, connected by the bump 43 that is a protruding terminal, referred to as a bump, lined up in an array.

Thus, according to the present embodiment, the area of mounting of the image sensor 22 can be decreased compared with wire bonding, in addition to the effect disclosed in, for example, the third embodiment. Thus, this is effective for reducing the size of the camera module 1.

The present embodiment has a short interconnect and good electrical characteristics and thus is effective for a circuit of a portable device that is mostly required to have a small size or thickness, or for a high frequency circuit or the like of which the electrical characteristics are considered important. The heat of the image sensor 22 is easily transferred to the wiring substrate 21. Thus, the present embodiment has an advantage with respect to heat radiation.

Thus, the porous portion 41 can achieve both of two objects of emitting air existing in the internal space 28 and preventing intrusion of a foreign object from the outside and can reduce clinging of a foreign object to the image sensor 22 (a defect of a camera module) and improve size reduction and electrical characteristics.

Even the present embodiment illustratively describes changes from the camera module 1 according to the third embodiment. However, the present embodiment is not limited thereto. The changes described above may obviously be made to the camera module 1 according to the first, second, and fourth to ninth embodiments. In this case, the effect described above can be achieved in addition to the effects disclosed in the first, second, and fourth to ninth embodiments.

[Twelfth Embodiment]

A still another embodiment of the present invention will be described as follows on the basis of FIGS. 13(a) and 13(b).

Differences between the present embodiment and the first to ninth and eleventh embodiments will be described, and constituent elements having the same function as the constituent elements described in the first to ninth and eleventh embodiments will be designated by the same reference signs and will not be described.

While the present embodiment illustratively describes changes from the camera module 1 according to the eleventh embodiment, specifically, from the camera module 1 illustrated in FIGS. 12(a) and 12(b), the same modifications carried out to the first to ninth and eleventh embodiments can obviously be carried out to the present embodiment.

<Schematic Configuration of Camera Module 1>

Figure 13:
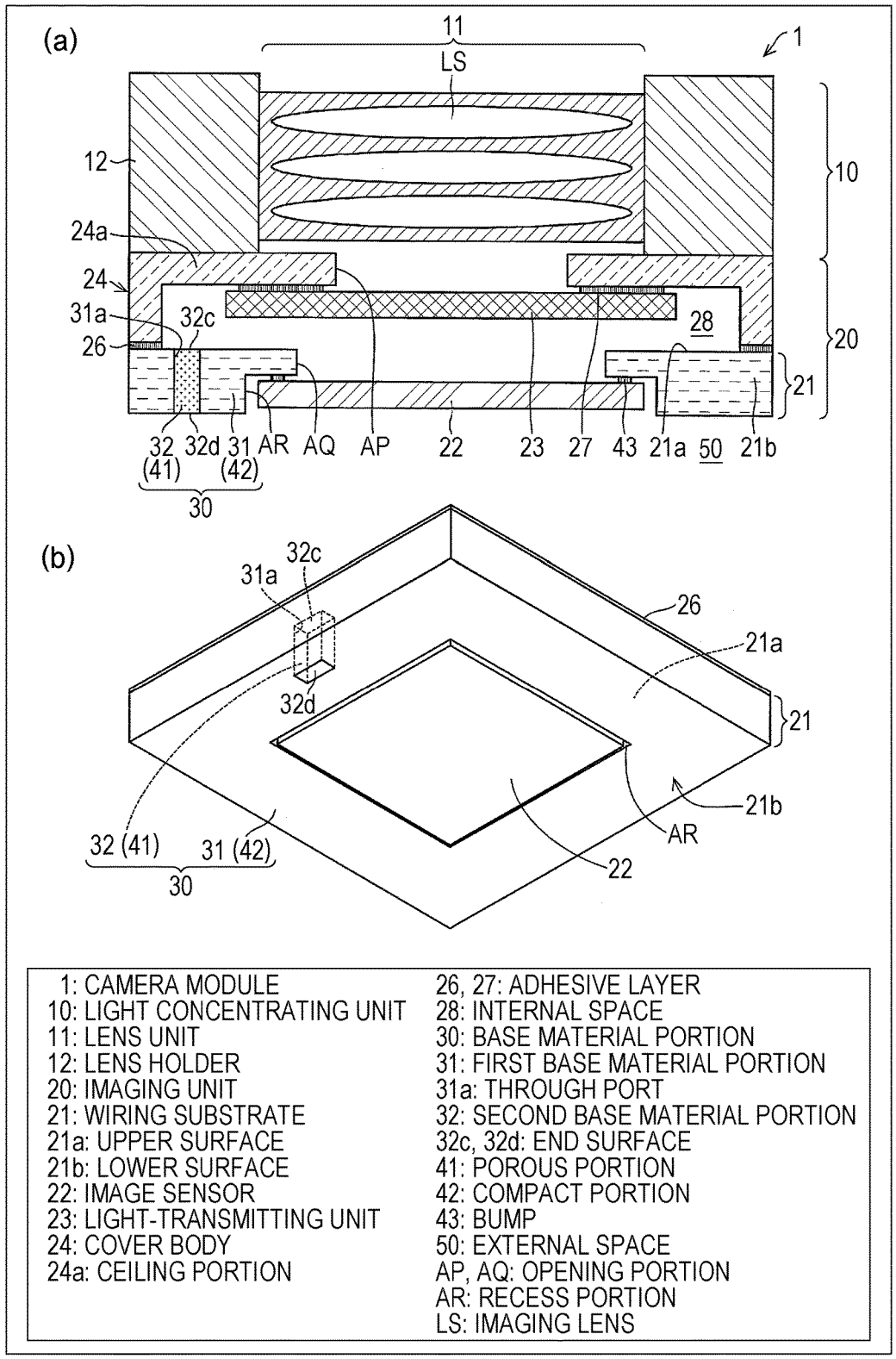
FIG. 13(a) is a sectional view schematically illustrating a schematic configuration of a camera module according to a twelfth embodiment.
FIG. 13(b) is a perspective view schematically illustrating a schematic configuration of a main portion of the camera module illustrated in FIG. 13(a).

FIG. 13(a) is a sectional view schematically illustrating a schematic configuration of the camera module 1 according to the present embodiment, and FIG. 13(b) is a perspective view schematically illustrating a schematic configuration of a main portion of the camera module 1 illustrated in FIG. 13(a).

The camera module 1 according to the present embodiment is the same as the camera module 1 according to the eleventh embodiment except that the thickness of the wiring substrate 21 is formed to be greater than that in the eleventh embodiment, that a recess portion AR is disposed by using the bump 43 in the lower surface 21b which is the surface of the wiring substrate 21 where the image sensor 22 is mounted, and that the image sensor 22 is arranged in the recess portion AR.

That is, in the wiring substrate 21 according to the present embodiment, the thickness of a part surrounding the area of mounting of the image sensor 22 in the wiring substrate 21 is great. In other words, in the present embodiment, the area of mounting of the image sensor 22 in the wiring substrate 21 is recessed from the surrounding area thereof. The second base material portion 32 which is the porous portion 41 is formed in an area, around the area of mounting of the image sensor 22, that has a greater thickness than the area of mounting of the image sensor 22 (that is, outside of the recess portion AR) in the wiring substrate 21.

<Effect>

As described heretofore, according to the present embodiment, the image sensor 22 is arranged in the recess portion 21e, and the porous portion 41 is formed in the thick part of the first base material portion 31, which is the compact portion 42, outside of the recess portion AR. Thus, the path length of the porous portion 41 can be increased with the thickness of the camera 1 reduced. Thus, according to the present embodiment, an effect that an external foreign object is more unlikely to reach the internal space 28 through the porous portion 41 than that in the eleventh embodiment can be achieved in addition to the effect disclosed in the eleventh embodiment.

The present embodiment illustratively describes changes from the camera module 1 illustrated in FIGS. 12(a) and 12(b). In other words, the present embodiment illustratively describes changes from the case of applying the eleventh embodiment to the camera module 1 according to the third embodiment. However, the present embodiment is not limited thereto. The changes described in the eleventh embodiment and in the present embodiment may obviously be made to the camera module 1 according to the first, second, and fourth to ninth embodiments.

[Thirteenth Embodiment]

A still another embodiment of the present invention will be described as follows on the basis of FIGS. 14(a) and 14(b).

Differences between the present embodiment and the first to sixth, ninth, and eleventh embodiments will be described, and constituent elements having the same function as the constituent elements described in the first to sixth, ninth, and eleventh embodiments will be designated by the same reference signs and will not be described.

While even the present embodiment illustratively describes changes from the camera module 1 illustrated in FIGS. 12(a) and 12(b), the same modifications carried out to the first to sixth, ninth, and eleventh embodiments can obviously be carried out to the present embodiment.

<Schematic Configuration of Camera Module 1>

FIG. 14(a) is a sectional view schematically illustrating a schematic configuration of the camera module 1 according to the present embodiment, and FIG. 14(b) is a perspective view schematically illustrating a schematic configuration of a main portion of the camera module 1 illustrated in FIG. 14(a).

The strongest feature of the camera module 1 according to the present embodiment is that the light-transmitting unit 23 is fixed around the opening portion AQ on the wiring substrate 21 by the adhesive layer 27.

Even in the camera module 1 according to the present embodiment, the internal space 28 that is surrounded by constituent elements including the wiring substrate 21 and occluded is formed in the imaging unit 20. The internal space 28 of the camera module 1 according to the present embodiment is a space portion surrounded by the image sensor 22, the wiring substrate 21, and the light-transmitting unit 23.

The present embodiment illustratively describes the case of forming the thickness of the wiring substrate 21 to be greater than that in the eleventh embodiment and disposing the second base material portion 32 (porous portion 41) having an L shape in the compact portion 42 in the wiring substrate 21.

In the second base material portion 32, an end surface 32i (a side end or a first end surface) that is one end thereof is positioned at an end of opening of the opening portion AQ (an inner wall of the opening portion) of the wiring substrate 21, and the end surface 32d (the lower end or a second end surface) that is another one end thereof is positioned in the lower surface 21b of the wiring substrate 21. Thus, even in the present embodiment, the internal space 28 and the external space 50 are connected to each other by the porous portion 41.

Even in the present embodiment, the shape of the through port 31a is the same as the shape of the second base material portion 32.

The camera module 1 according to the present embodiment has the same configuration as the camera module 1 according to the eleventh embodiment except for the point described above.

<Effect>

As described heretofore, in the present embodiment, the light-transmitting unit 23 is fixed on the wiring substrate 21, and the internal space 28 is formed of a space portion surrounded by the image sensor 22, the wiring substrate 21, and the light-transmitting unit 23. Thus, the internal space 28 can be decreased, and the surface area of a surface constituting the internal space 28 can be decreased.

The surface constituting the internal space 28 having a small surface area, in other words, the surface abutted by the image sensor 22 having a small surface area, means that a foreign object clinging to the surface is less likely to cling to the surface of the image sensor 22 or that a foreign object produced from the surface is less likely to cling to the surface of the image sensor 22.

Thus, according to the present embodiment, an effect that clinging of a foreign object to the image sensor 22 (a defect of a camera module) can be more securely reduced is achieved in addition to the effect disclosed in the eleventh embodiment.

<Modification Example>

The present embodiment illustratively describes the case of forming the above L-shaped second base material portion 32 in the wiring substrate 21. However, the present embodiment is not limited thereto. The wiring substrate 21 may be configured in such a manner that the opening portion AQ is disposed in the wiring substrate 21 according to the first to sixth and ninth embodiments and that one end of the second base material portion 32 abutting the internal space 28 in the wiring substrate 21 according to the first to sixth and ninth embodiments is not positioned in the upper surface 21a of the wiring substrate 21 and is positioned at an end of opening of the opening portion AQ (an inner wall of the opening portion) of the wiring substrate 21. In this case, the effect described above can be achieved in addition to the effect disclosed in the first to sixth and ninth embodiments.

[Fourteenth Embodiment]

A still another embodiment of the present invention will be described as follows on the basis of FIGS. 15(a) and 15(b).

Differences between the present embodiment and the first to sixth, ninth, eleventh, and thirteenth embodiments will be described, and constituent elements having the same function as the constituent elements described in the first to sixth, ninth, eleventh, and fifteenth embodiments will be designated by the same reference signs and will not be described.

While the present embodiment illustratively describes changes from the camera module 1 according to the thirteenth embodiment, specifically, from the camera module 1 illustrated in FIGS. 14(a) and 14(b), the same modifications carried out to the first to sixth, ninth, and eleventh embodiments can obviously be carried out to the present embodiment.

<Schematic Configuration of Camera Module 1>

Figure 15:
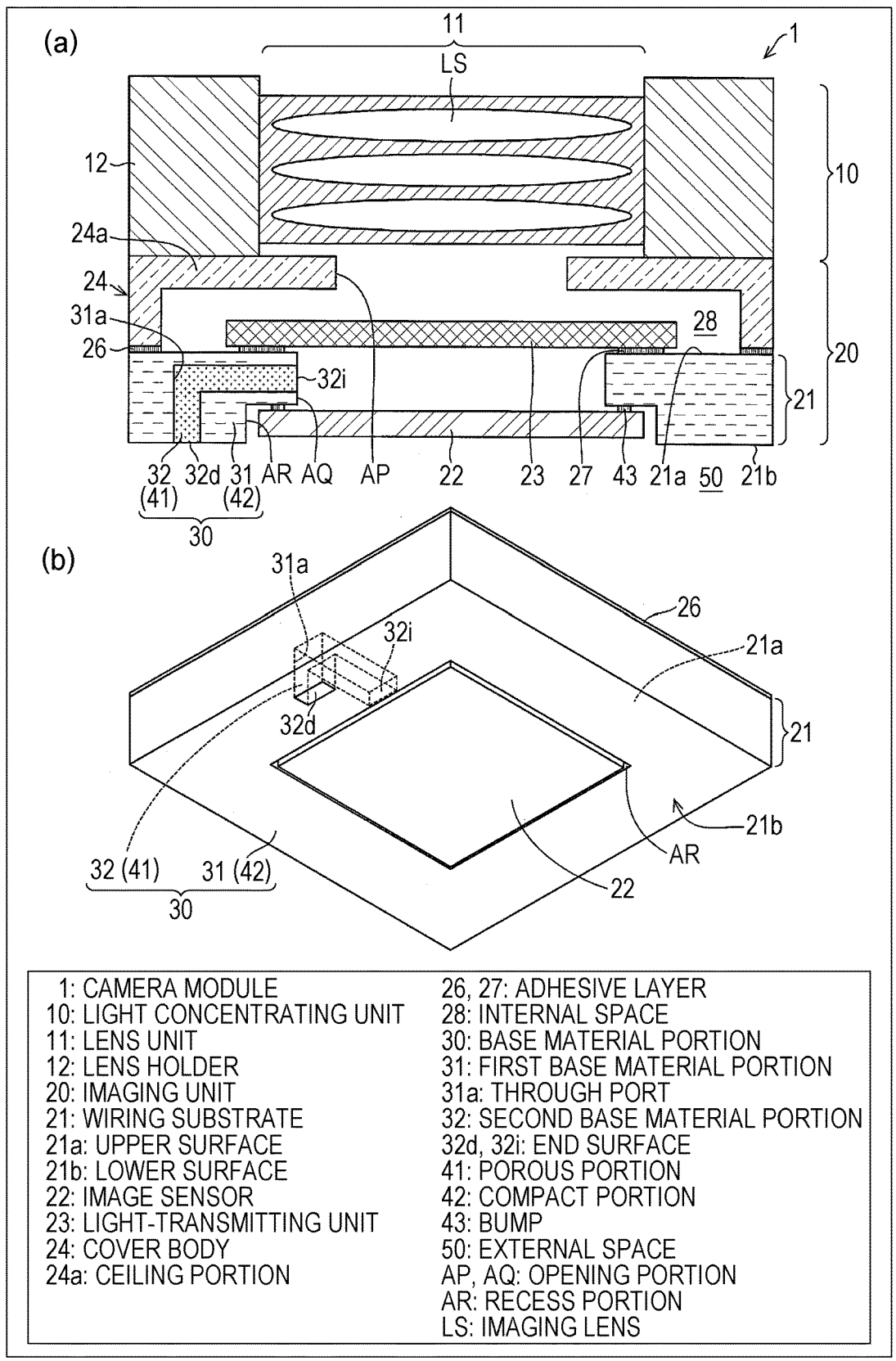
FIG. 15(a) is a sectional view schematically illustrating a schematic configuration of a camera module according to a fourteenth embodiment.
FIG. 15(b) is a perspective view schematically illustrating a schematic configuration of a main portion of the camera module illustrated in FIG. 15(a).

FIG. 15(a) is a sectional view schematically illustrating a schematic configuration of the camera module 1 according to the present embodiment, and FIG. 15(b) is a perspective view schematically illustrating a schematic configuration of a main portion of the camera module 1 illustrated in FIG. 15(*a*).

The camera module 1 according to the present embodiment is the same as the camera module 1 according to the thirteenth embodiment except that the thickness of the wiring substrate 21 is formed to be greater than that in the thirteenth embodiment, that a recess portion AR is disposed by using the bump 43 in the lower surface 21*b* which is the surface of the wiring substrate 21 where the image sensor 22 is mounted, and that the image sensor 22 is arranged in the recess portion AR.

That is, in the wiring substrate 21 according to the present embodiment, in the same manner as the twelfth embodiment, the second base material portion 32 which is the porous portion 41 is formed in an area, around the area of mounting of the image sensor 22, that has a greater thickness than the area of mounting of the image sensor 22 (that is, outside of the recess portion AR) in the wiring substrate 21.

<Effect>

Thus, according to the present embodiment, the same effect as the twelfth embodiment can be achieved in addition to the effect disclosed in the thirteenth embodiment.

Figure 14:
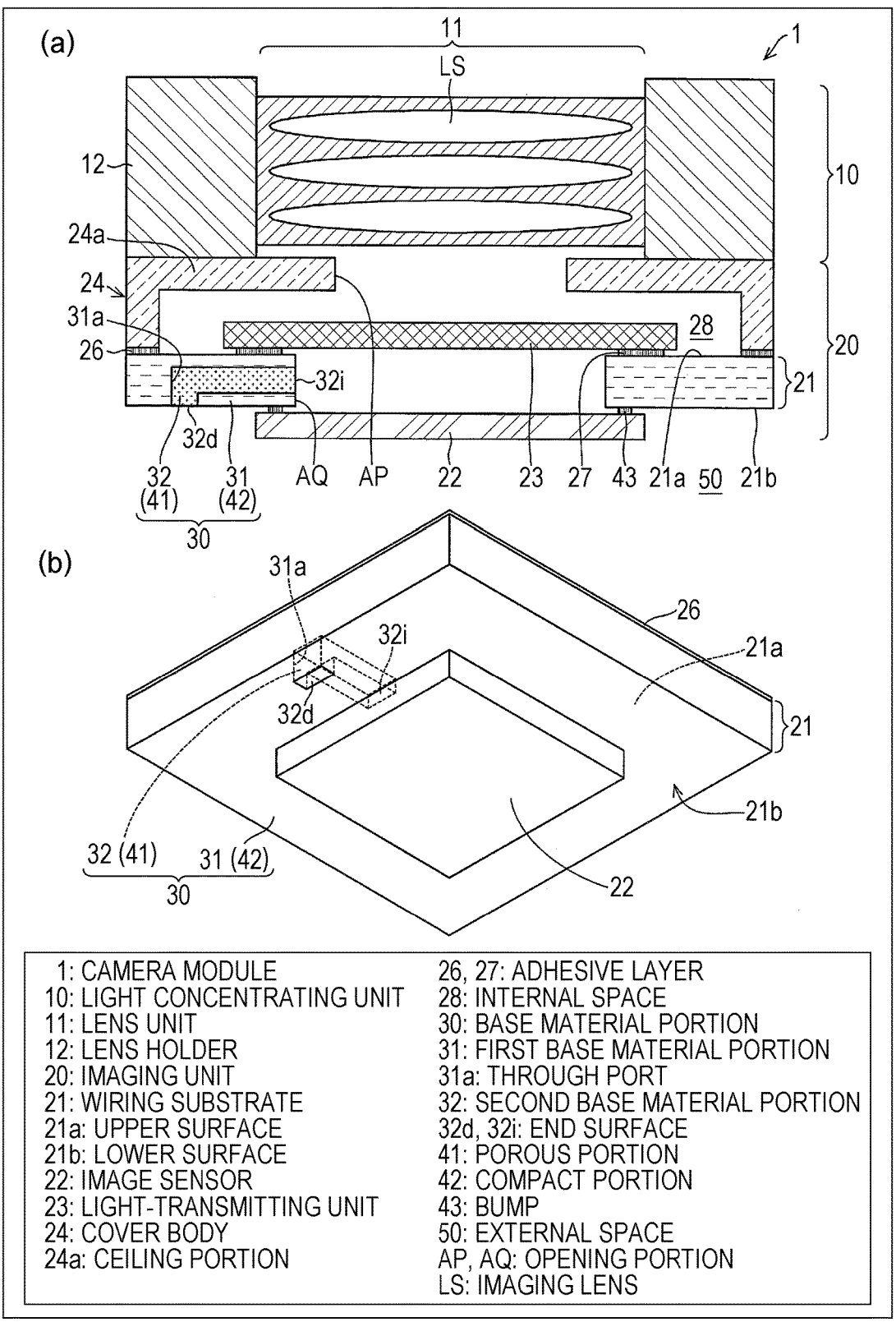
FIG. 14(a) is a sectional view schematically illustrating a schematic configuration of a camera module according to a thirteenth embodiment.
FIG. 14(b) is a perspective view schematically illustrating a schematic configuration of a main portion of the camera module illustrated in FIG. 14(a).

While the present embodiment illustratively describes changes from the camera module 1 illustrated in FIGS. 14(*a*) and 14(*b*), as described in the thirteenth embodiment, the changes described above may obviously made to the wiring substrate 21 in which the opening portion AQ is disposed in the wiring substrate 21 according to the first to sixth and ninth embodiments and in which one end of the second base material portion 32 abutting the internal space 28 in the wiring substrate 21 according to the first to sixth ninth embodiments is not positioned in the upper surface 21*a* of the wiring substrate 21 and is positioned at an end of opening of the opening portion AQ (an inner wall of the opening portion) of the wiring substrate 21.

[Fifteenth Embodiment]

A still another embodiment of the present invention will be described as follows on the basis of FIGS. 16(*a*) and 16(*b*).

Differences between the present embodiment and the third embodiment will be described, and constituent elements having the same function as the constituent elements described in the third embodiment will be designated by the same reference signs and will not be described.

While the present embodiment illustratively describes changes from the camera module 1 according to the third embodiment, the same modifications carried out to the first to fourteenth embodiments can obviously be carried out to the present embodiment.

<Schematic Configuration of Camera Module 1>

FIG. 16(*a*) is a sectional view schematically illustrating a schematic configuration of the camera module 1 according to the present embodiment, and FIG. 16(*b*) is a perspective view schematically illustrating a schematic configuration of a main portion of the camera module 1 illustrated in FIG. 16(*a*).

As illustrated in FIGS. 16(*a*) and 16(*b*), the upper surface 21*a* that is a surface where the image sensor 22 is mounted in the wiring substrate 21 is formed of a first porous portion 41*a* (second base material portion) and the compact portion 42 (first base material portion), and the first porous portion 41*a* abuts the internal space 28.

The lower surface 21*b* that is a surface on the opposite side from the surface where the image sensor 22 is mounted in the wiring substrate 21 is formed of a second porous portion 41*b* (third base material portion) and the compact portion 42 (first base material portion), and the second porous portion 41*b* abuts the external space 50.

The first porous portion 41*a* and the second porous portion 41*b* are separated from each other by a separating portion 44 that is formed in the wiring substrate 21. The separating portion 44 may be a void portion or may be a third porous portion configured of a different porous material from the first porous portion 41*a* and the second porous portion 41*b*.

That is, the separating portion 44 may preferably have an air hole (hole portion) that separates the first porous portion 41*a* and the second porous portion 41*b* from each other and connects the first porous portion 41*a* and the second porous portion 41*b*.

The first porous portion 41*a* and the second porous portion 41*b* may be formed of the same porous material or may be formed of different porous materials. The porous materials illustrated in the first embodiment can be used as the porous materials constituting the first porous portion 41*a*, the second porous portion 41*b*, and the third porous portion.

<Effect>

As described heretofore, in the present embodiment, the separating portion 44 that is sandwiched between the first porous portion 41*a* and the second porous portion 41*b* is disposed in the wiring substrate 21.

Thus, according to the present embodiment, when an external foreign object reaches the separating portion 44 through the second porous portion 41*b*, the foreign object remains in the separating portion 44. That is, the separating portion 44 functions as a dust trap. Thus, the foreign object in the separating portion 44 is unlikely to reach the internal space 28 through the first porous portion 41*a*.

Even in the case of the separating portion 44 being a space portion or being the third porous portion, the same effect of prevention of a foreign object is achieved. That is, in the case of the separating portion 44 being a space portion, the separating portion 44 functions as one large air hole. The separating portion 44 being a space portion or the third porous portion corresponds to the size of the air hole as a dust trap being different. That is, the first porous portion 41*a*, the second porous portion 41*b*, and the separating portion 44 can be regarded as one porous portion in which one end of the porous portion abutting the internal space 28 is the surface of the first porous portion 41*a* positioned in the upper surface 21*a* of the wiring substrate 21 and in which another one end of the porous portion abutting the external space 50 is the surface of the second porous portion 41*b* positioned in the lower surface 21*b* of the wiring substrate 21.

The present embodiment illustratively illustrates the case of forming the first porous portion 41*a* and the second porous portion 41*b* in shifted positions in a plan view with the separating portion 44 interposed therebetween.

Accordingly, when the first porous portion 41*a* and the second porous portion 41*b* are positioned in twisted positions in the wiring substrate 21, a path formed by the first porous portion 41*a*, the separating portion 44, and the second porous portion 41*b* has a complex three-dimensional structure. However, even in this case, each of the first porous portion 41*a*, the second porous portion 41*b*, and the separating portion 44 can have a simple layer structure as illustrated in FIGS. 16(*a*) and 16(*b*).

Thus, according to the present embodiment, an effect that the ability to hold a foreign object intruding into the porous portion 41 from the outside can be increased with a simple structure is achieved in addition to the effect disclosed in the third embodiment.

According to the present embodiment, each unit (each layer) preferably has a simple structure, and cost can be decreased in manufacturing steps of the wiring substrate 21. Consequently, an effect that cost of the camera module 1 can be decreased is achieved.

In the case of the separating portion 44 having low density with respect to the second porous portion 41b as in the case of, for example, the separating portion 44 being a space portion or the separating portion 44 being the third porous portion that has a greater hole diameter than the second porous portion 41b, dust (foreign object) is likely to move from the high density part to the low density part. Thus, in this case, an effect of trapping dust in the separating portion 44 as described above is achieved.

That is, in the case of the air hole diameter of the separating portion 44>the air hole diameters of the first porous portion 41a and the second porous portion 41b, dust (foreign object) is trapped in the separating portion 44. Therefore, in the case of using the separating portion 44 as a dust trap, the air hole diameter of the separating portion 44 may be preferably such that 25 µm<the air hole diameter of the separating portion 44<50 µm, given, for example, 1 µm<the air hole diameters of the first porous portion 41a and the second porous portion 41b<25 µm. The magnitudes of the air hole diameters are one example and are not limited the ranges. The air hole diameters of the first porous portion 41a and the second porous portion 41b may partially overlap with the air hole diameter of the separating portion 44. The air hole diameter of the first porous portion 41a and the air hole diameter of the second porous portion 41b may be the same or different.

The present embodiment is not limited to the case of the air hole diameter of the separating portion 44>the air hole diameters of the first porous portion 41a and the second porous portion 41b.

When the density of the separating portion 44 is high with respect to the first porous portion 41a or the second porous portion 41b, the separating portion 44 prevents passage of a foreign object from the porous portion side thereof where the density is low. Thus, in this case, the first porous portion 41a or the second porous portion 41b can have a dust trapping effect. Apparently, any one of the first porous portion 41a and the second porous portion 41b may have a dust trapping effect, or both thereof may have a dust trapping effect.

The present embodiment illustratively describes changes from the camera module 1 illustrated in the third embodiment. However, the present embodiment is not limited thereto. The same separating portion as the separating portion 44 may obviously be disposed in the porous portion in the other embodiments of the first to fourteenth embodiments.

[Sixteenth Embodiment]

A still another embodiment of the present invention will be described as follows on the basis of FIGS. 17(a) to 17(d).

Differences between the present embodiment and the third embodiment will be described, and constituent elements having the same function as the constituent elements described in the third embodiment will be designated by the same reference signs and will not be described.

While the present embodiment illustratively describes changes from the camera module 1 according to the third embodiment, the same modifications carried out to the first to fifteenth embodiments can obviously be carried out to the present embodiment.

<Schematic Configuration of Camera Module 1>

FIGS. 17(a) to 17(d) are perspective views schematically illustrating a schematic configuration of the camera module 1 according to the present embodiment.

The camera module 1 according to the present embodiment is the same as the camera module 1 according to the third embodiment except that a pattern 61 covering a part of the surface of the second base material portion 32 is disposed on the second base material portion 32 (porous portion 41).

The pattern 61 may be a conductive pattern (for example, a metal pattern) such as an interconnect pattern or may be an insulating pattern disposed for adjusting the area of the second base material portion 32 in the surface of the wiring substrate 21 (for example, just for adjusting the area of the second base material portion 32 in the surface of the wiring substrate 21) and is not particularly limited.

Typically, the pattern 61 is preferably a part of a pattern required for the camera module 1 and is more preferably an interconnect pattern or a pattern that is formed at the same time as an interconnect pattern. In this case, an existing pattern can be used, and the pattern 61 can be formed without causing a significant change in design or an increase in the number of manufacturing steps.

Figure 17:
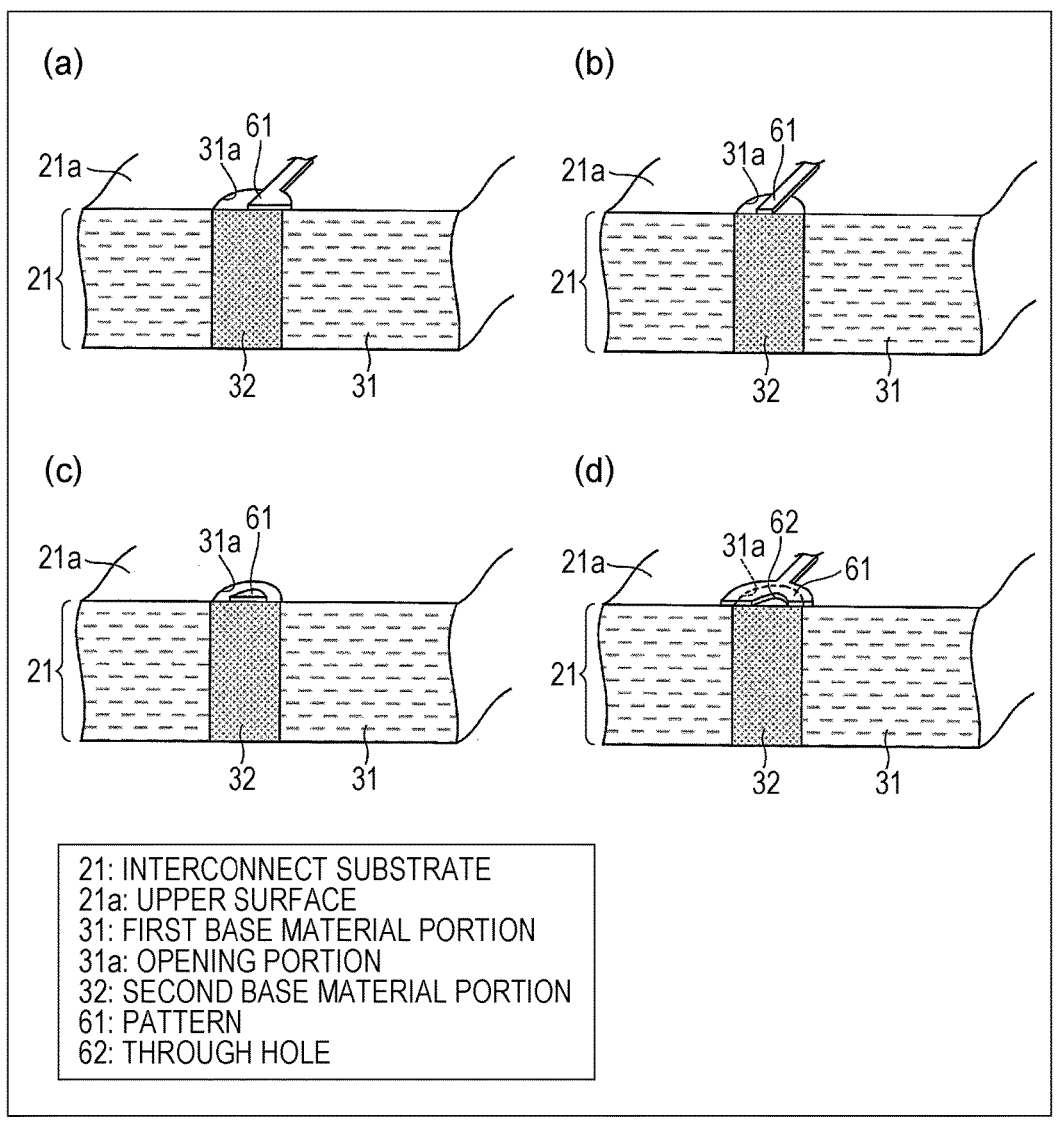
FIGS. 17(a) to 17(d) are perspective views schematically illustrating a schematic configuration of a main portion of a camera module according to a sixteenth embodiment.
Figure 18:
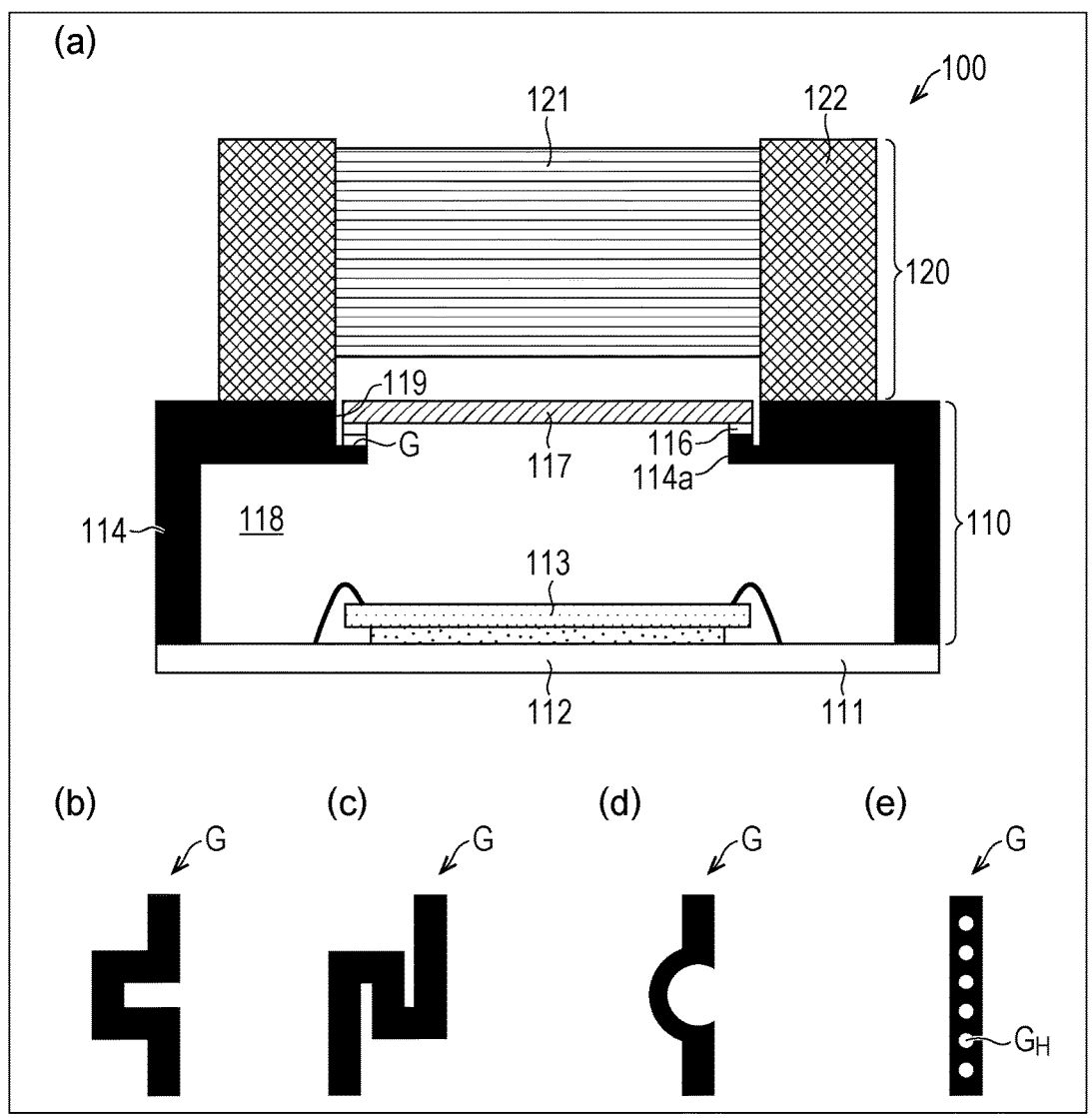
FIG. 18(a) is a sectional view illustrating a schematic configuration of a camera module disclosed in PTL 1.
FIGS. 18(b) to 18(e) are plan views illustrating the planar shape of an air vent groove formed in a sensor cover of the camera module illustrated in FIG. 18(a).
Figure 19:
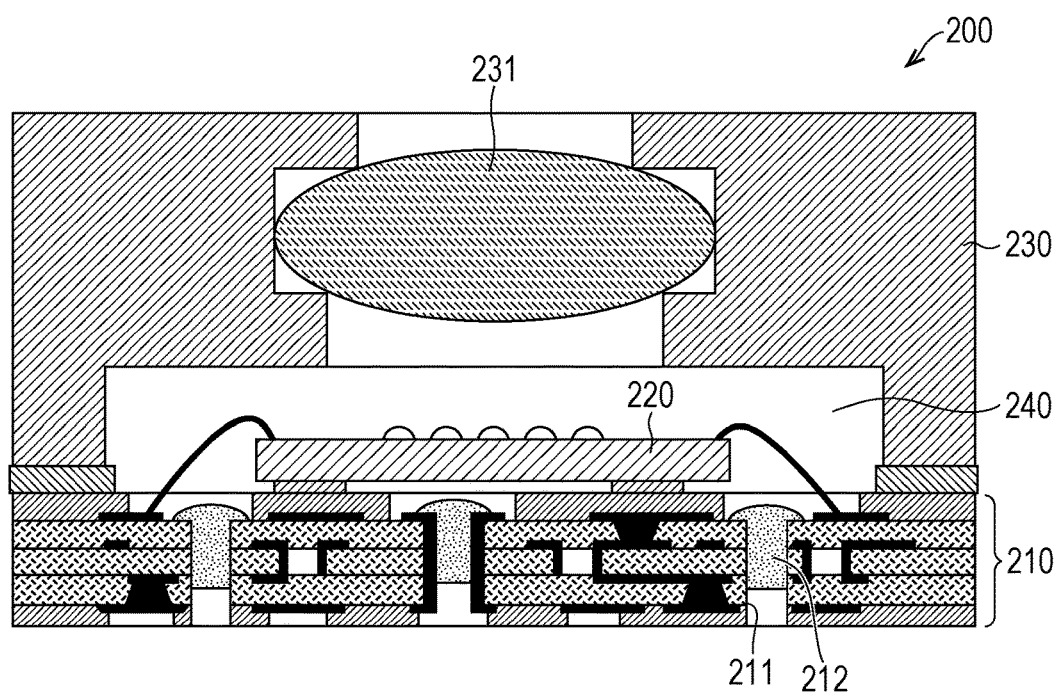
FIG. 19 is a sectional view illustrating a schematic configuration of a camera module disclosed in PTL 2.
Figure 20:
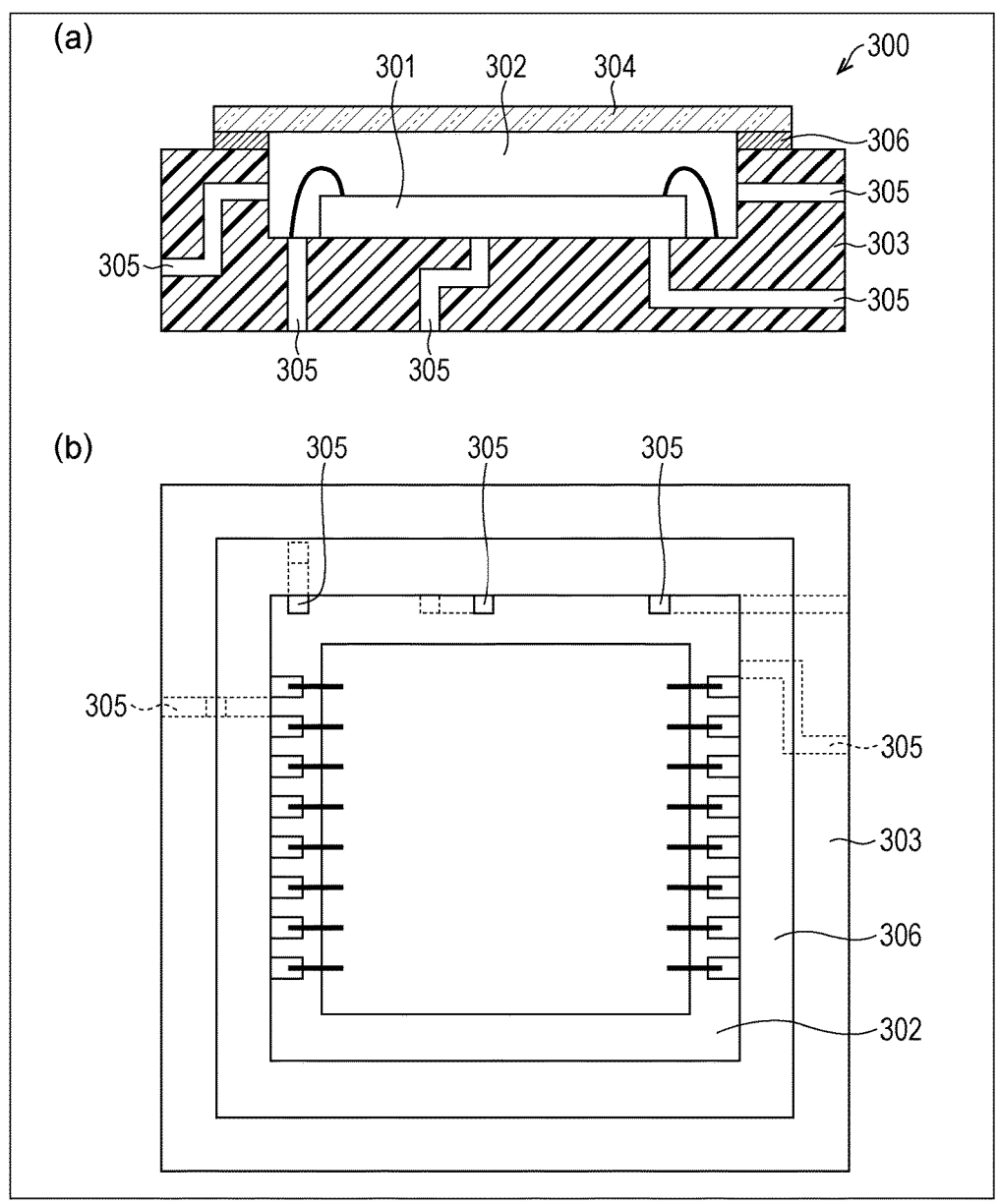
FIG. 20(a) is a sectional view illustrating a schematic configuration of a semiconductor device disclosed in PTL 3.
FIG. 20(b) is a plan view illustrating a schematic configuration of the semiconductor device illustrated in FIG. 20(a).
Figure 21:
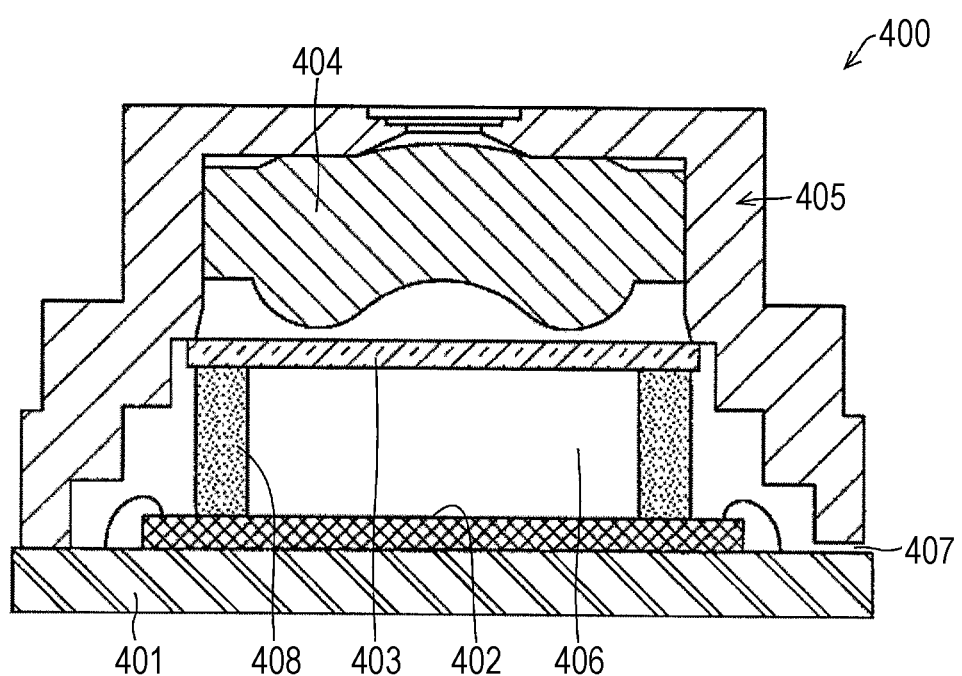
FIG. 21 is a sectional view illustrating a schematic configuration of a camera module disclosed in PTL 4.

The pattern 61 may cover one side of the second base material portion 32 in the surface of the wiring substrate 21 as illustrated in, for example, FIG. 17(a). For example, in the case of the pattern 61 being an interconnect pattern, one side of the second base material portion 32 in the upper surface 21a of the wiring substrate 21 that is an active surface of the wiring substrate 21 may be covered with the interconnect pattern.

The pattern 61 may be disposed across the second base material portion 32 in the surface of the wiring substrate 21 as illustrated in, for example, FIG. 17(b).

The pattern 61 may cover the second base material portion 32 in the shape of an island in the surface of the wiring substrate 21 as illustrated in, for example, FIG. 17(c).

The pattern 61 may have a through hole 62 corresponding to a part of the second base material portion 32 in the surface of the wiring substrate 21 and cover the entirety of the second base material portion 32 in the surface of the wiring substrate 21 except for a portion exposed by the through hole 62 as illustrated in, for example, FIG. 17(d).

FIGS. 17(a) to 17(d) illustratively illustrate the case of covering a part of the surface of the second base material portion 32 in the upper surface 21a of the wiring substrate 21 with the pattern 61. However, the present embodiment is not limited thereto. A part of the surface of the second base material portion 32 in the lower surface 21b of the wiring substrate 21 may be covered with the pattern 61.

<Effect>

As described heretofore, the pattern 61 covering a part of the surface of the second base material portion 32 is disposed on the second base material portion 32 (porous portion 41). Thus, the area of the second base material portion 32 in the surface of the wiring substrate 21, in other words, the area of opening of the wiring substrate 21, can be adjusted. Thus, intrusion of a foreign object can be more unlikely to happen.

[CONCLUSION]

The camera module 1 according to a first aspect of the present invention is the camera module 1 having the internal space 28 abutting the wiring substrate 21 and occluded, in which at least a part of a base material of the wiring substrate 21 is the porous portion 41 (the second base material portion 32, the porous portion 41, the first porous portion 41a, the second porous portion 41b, the second base material layer 32a, and the protruding portion 32b) configured of porous ceramic, porous metal, organic fabric, or inorganic fabric and having interconnected air holes, and the internal space 28 is connected to the outside of the camera module 1 through the interconnected air holes.

Typically, an image sensor is bonded onto a wiring substrate of a camera module by an adhesive layer. A light-transmitting unit is disposed above the image sensor to cover the image sensor, and a light concentrating unit is disposed above the light-transmitting unit.

According to the above configuration, gas or ions in the internal space can be released to the outside of the camera module 1 through a pore of the porous portion 41. Thus, according to the above configuration, blurriness of the light-transmitting unit caused by gas or ions in the internal space 28 can be reduced, and damage or the like in the camera module 1 can be prevented with reduction of increase in pressure due to thermal expansion of air in the internal space 28.

Any of porous ceramic, porous metal, organic fabric, and inorganic fabric is a versatile porous material and is easily obtained. In addition, these porous materials have thermal resistance so do not burn, scorch, sublime, or plastically deform in a heating step of manufacturing steps of the camera module 1 such as a firing step or a soldering step, and thus do not cause problems of an air-permeable resin in PTL 2 and can be suitably used as the base material of the wiring substrate 21. Thus, according to the above configuration, unlike in the case of filling a through hole of a substrate with an air-permeable resin, the porous portion 41 can be stably held and stably formed.

The interconnected air holes of the porous portion 41 configured of the porous material have fine openings (pores). Thus, a foreign object that is larger than the pore does not intrude into the pore. Therefore, a foreign object does not reach the internal space 28 from the outside of the camera module 1 through the wiring substrate 21. A foreign object that is smaller than the pore intrudes into the pore, but the foreign object that is stuck in the pore does not easily pass the pore. Therefore, a foreign object almost does not reach the internal space 28 from the outside of the camera module 1 through the wiring substrate 21.

According to the above configuration, the porous portion 41 does not allow a foreign object to reach the internal space 28 from the outside. Thus, clinging of a foreign object onto a pixel on the surface of the image sensor of the camera module 1 and onto the surface of the light-transmitting unit on the image sensor can be prevented. Therefore, according to the above configuration, an image defect such as a stain defect can be reduced.

According to the above configuration, when light that is incident on the light concentrating unit is incident on the surface of the wiring substrate 21 on the inner side of the internal space 28 through the light-transmitting unit, the pore can absorb the most part of the incident light and thus can decrease reflectance. Consequently, occurrence of a problem such as flare or a ghost can be reduced, and image quality can be improved with improvement in image contrast.

The camera module 1 according to a second aspect of the present invention may include, in the first aspect, the image sensor 22 that is mounted on the wiring substrate 21, the cover body 24 that is mounted on the wiring substrate 21 and in which the opening portion AP is formed above the image sensor 22, and the light-transmitting unit 23 that closes the opening portion AP of the cover body 24, in which the internal space 28 is a space portion that is surrounded by the wiring substrate 21, the image sensor 22, the cover body 24, and the light-transmitting unit 23.

According to the above configuration, gas or ions in the internal space 28 that is surrounded by the image sensor 22 mounted on the wiring substrate 21, the cover body 24 that is mounted on the wiring substrate 21 and in which the opening portion AP is formed above the image sensor 22, and the light-transmitting unit 23 that closes the opening portion AP of the cover body 24 can be released to the outside of the camera module 1, and intrusion of a foreign object into the internal space 28 can be prevented.

The camera module 1 according to a third aspect of the present invention may be such that, in the second aspect, the porous portion 41 is formed in an area other than a portion in which the image sensor 22 and the cover body 24 are fixed to the wiring substrate 21.

An image sensor and a cover body are generally mounted on a wiring substrate through an adhesive layer. Therefore, according to the above configuration, the porous portion 41 is formed in an area other than a portion in which the image sensor 22 and the cover body 24 are fixed to the wiring substrate 21. Thus, gas or ions produced from the adhesive layer or the like in the internal space 28 can be efficiently released to outside air through the interconnected air holes (pores) of the porous portion 41.

According to the above configuration, the porous portion 41 is formed in an area other than a portion in which the image sensor 22 and the cover body 24 are fixed to the wiring substrate 21. Thus, an adhesive of the adhesive layer used for fixing the image sensor 22 or the cover body 24 does not permeate the porous portion 41 and damage a porous structure of the porous portion 41.

The camera module 1 according to a fourth aspect of the present invention may include, in the first aspect, the image sensor 22 that is mounted on the wiring substrate 21, and the light-transmitting unit 23 that is positioned above the image sensor 22, in which the wiring substrate 21 has a through port (opening portion AQ), the image sensor 22 and the light-transmitting unit 23 are disposed to face each other with the through port (opening portion AQ) interposed therebetween in the wiring substrate 21, and the internal space 28 is a space portion that is surrounded by the wiring substrate 21, the image sensor 22, and the light-transmitting unit 23.

According to the above configuration, gas or ions in the internal space 28 surrounded by the wiring substrate 21 and the image sensor 22 and the light-transmitting unit 23 disposed to face each other with the through port interposed therebetween in the wiring substrate 21 can be released to the outside of the camera module 1, and intrusion of a foreign object into the internal space 28 can be prevented.

According to the above configuration, the internal space 28 can be decreased, and the surface area of a surface constituting the internal space 28, in other words, the surface area of a surface abutted by the image sensor 22, can be decreased. Thus, a foreign object clinging to the surface can be less likely to cling to the surface of the image sensor 22, or a foreign object produced from the surface can be less likely to cling to the surface of the image sensor 22. Therefore, according to the above configuration, clinging of a foreign object to the image sensor 22 (a defect of a camera module) can be more securely reduced.

The camera module 1 according to a fifth aspect of the present invention may be such that, in the second or fourth aspect, the porous portion 41 is formed in an area other than a portion in which the image sensor 22 is fixed to the wiring substrate 21.

An image sensor is generally mounted on a wiring substrate through an adhesive layer. Therefore, according to the above configuration, the porous portion 41 is formed in an area other than a portion in which the image sensor 22 is fixed to the wiring substrate 21. Thus, gas or ions produced from the adhesive layer or the like in the internal space 28 can be efficiently released to outside air through the interconnected air holes (pores) of the porous portion 41.

According to the above configuration, the porous portion 41 is formed in an area other than a portion in which the image sensor 22 is fixed to the wiring substrate 21. Thus, an adhesive of the adhesive layer used for fixing the image sensor 22 does not permeate the porous portion 41 and damage a porous structure of the porous portion 41.

The camera module 1 according to a sixth aspect of the present invention may be such that, in any of the first to fifth aspects, the porous portion 41 is disposed in a part of the base material of the wiring substrate 21.

The porous portion 41 is considered to have low strength compared with a general base material (compact base material) that is used as the base material of the wiring substrate 21. The interconnected air holes that connect the internal space 28 and the outside may be preferably disposed in a part of the wiring substrate 21.

Therefore, as described above, the porous portion 41 is disposed in a part of the base material of the wiring substrate 21. Thus, substrate strength can be improved compared with the case of forming the entire wiring substrate 21 of the porous portion 41.

According to the above configuration, the porous portion 41 is disposed in a part of the base material of the wiring substrate 21. Thus, the area of opening in the surface of the wiring substrate 21 can be decreased compared with the case of forming the entire wiring substrate 21 of the porous portion 41, and a foreign object can be more unlikely to enter the internal space 28.

The camera module 1 according to a seventh aspect of the present invention may be such that, in any of the first to sixth aspects, a first end portion (for example, the end surface 32*c*) of the porous portion 41 abuts the internal space, and that a second end portion (for example, the end surface 32*d*) of the porous portion is positioned in a surface of the wiring substrate 21 (for example, the lower surface 21*b*) on the opposite side from a surface thereof (for example, the upper surface 21*a*) facing the internal space 28.

According to the above configuration, gas or ions in the internal space 28 can be released to the outside of the camera module 1 from the second end portion of the porous portion disposed on the surface on the opposite side from the surface facing the internal space 28.

According to the above configuration, the first end portion and the second end portion of the porous portion 41 are positioned on the surface of the wiring substrate 21 on the opposite side from the surface facing thereof facing the internal space 28. Thus, the porous portion 41 can have a simple configuration, and the porous portion 41 can be easily formed.

The camera module 1 according to an eighth aspect of the present invention may be such that, in any of the second to fifth aspects, the image sensor 22 is mounted on the surface (upper surface 21*a*) of the wiring substrate 21 facing the internal space 28, the first end portion (end surface 32*c*) of the porous portion 41 abuts the internal space 28, and the second end portion (end surface 32*d*) of the porous portion 41 is positioned on the surface (lower surface 21*b*) of the wiring substrate 21 on the opposite side from a surface (upper surface 21*a*) thereof on which the image sensor 22 is mounted.

According to the above configuration, gas or ions in the internal space 28 can be released to the outside from the second end portion of the porous portion 41.

The camera module 1 according to a ninth aspect of the present invention may be such that, in the seventh or eighth aspect, the first end portion (for example, the end surface 32*c*) of the porous portion 41 and the second end portion (for example, the end surface 32*d*) of the porous portion are in twisted positions.

According to the above configuration, the first end portion and the second end portion of the porous portion 41 are in twisted position. Thus, the length of connection can be extended, and the volume of the air hole can be increased. Accordingly, in the case of a foreign object intruding into the porous portion 41 from the outside, the ability to hold the intruding foreign object can be increased.

The camera module 1 according to a tenth aspect of the present invention may be such that, in any of the first to sixth aspects, the first end portion (end surface 32*c*) of the porous portion 41 abuts the internal space 28, the second end portion (end surface 32*d*) of the porous portion 41 is positioned in the surface (lower surface 21*b*) of the wiring substrate 21 on the opposite side from the surface (upper surface 21*a*) thereof facing the internal space 28, and a third end portion (end surface 32*h*) of the porous portion 41 is positioned in an end surface (end surface 21*c*) of the wiring substrate 21.

According to the above configuration, the area of external opening of the porous portion 41 can be increased compared with the case of not disposing the third end portion. Thus, according to the above configuration, air ventilation between the internal space 28 and the outside can be further increased.

According to the above configuration, the third end portion is positioned in an end surface of the wiring substrate 21. Thus, air ventilation between the internal space 28 and the outside is not hindered when the camera module 1 is placed with the wiring substrate 21 in contact with the ground.

The camera module 1 according to an eleventh aspect of the present invention may be such that, in any one of the seventh to tenth aspects, the second end portion (end surface 32*d*) of the porous portion 41 is sunk from the surface (lower surface 21*b*) of the surrounding wiring substrate 21.

According to the above configuration, the second end portion of the porous portion 41 is sunk from the surface of the surrounding wiring substrate 21. Thus, a problem in air ventilation due to collapsing of the pore of the porous portion 41 by a scratch caused by external contact can be reduced.

The camera module 1 according to a twelfth aspect of the present invention may be such that, in any of the first to sixth aspects, the first end portion (end surface 32*c*) of the porous portion 41 abuts the internal space 28, and that the second end portion (end surface 32*h*) of the porous portion 41 is positioned in the end surface 21*c* of the wiring substrate 21.

According to the above configuration, the second end portion is positioned in an end surface of the wiring substrate 21. Thus, air ventilation between the internal space 28 and the outside is not hindered when the camera module 1 is placed with the wiring substrate 21 in contact with the ground.

The camera module 1 according to a thirteenth aspect of the present invention may be such that, in the second aspect, the surface of the porous portion 41 is divided into an internal space 28 side surface and an outer (external space 50) side surface by the cover body 24.

According to the above configuration, the internal space 28 and the outside can be connected without forming a through port (tunnel-shaped connecting portion) in the wiring substrate 21. Thus, a simple structure can be configured, and cost can be decreased.

The camera module 1 according to a fourteenth aspect of the present invention may be such that, in the third aspect, the image sensor 22 is mounted on the surface (upper surface 21*a*) of the wiring substrate 21 facing the internal space 28, the first end portion (end surface 32*c*1) of the porous portion 41 abuts the internal space 28, and the second end portion (end surface 32*c*2) of the porous portion 41 is disposed in a part that is positioned on the outer (external space 50) side of the cover body 24 in the surface (upper surface 21*a*) of the wiring substrate 21 on which the image sensor 22 is mounted.

According to the above configuration, any of the first end portion and the second end portion of the porous portion 41 is disposed on the surface of the wiring substrate 21 on which the image sensor 22 is mounted. Thus, air ventilation between the internal space 28 and the outside is not hindered when the camera module 1 is placed with the wiring substrate 21 in contact with the ground.

According to the above configuration, the porous portion is disposed in areas, with the cover body 24 interposed therebetween, other than a portion in which the image sensor and the cover body are fixed to the wiring substrate. Thus, the adhesive that is used for fixing the image sensor 22 and the cover body 24 does not permeate the porous portion 41 and damage the porous structure.

The camera module 1 according to a fifteenth aspect of the present invention may be such that, in the second or third aspect, the wiring substrate 21 has a through port (opening portion AQ), the image sensor 22 is disposed to face the cover body 24 and the light-transmitting unit 23 with the through port (opening portion AQ) interposed therebetween in the wiring substrate 21, and the second end portion (end surface 32*d*) of the porous portion 41 is positioned in the surface (lower surface 21*b*) of the wiring substrate 21 on which the image sensor 22 is mounted.

Accordingly, the image sensor 22 may be disposed to face the cover body 24 and the light-transmitting unit 23 with the through port interposed therebetween in the wiring substrate 21.

A mounting method such as flip chip mounting can be applied in mounting of the image sensor 22. By using flip chip mounting in mounting of the image sensor 22, the area of mounting of the image sensor 22 can be decreased compared with wire bonding.

The camera module 1 according to a sixteenth aspect of the present invention may be such that, in the sixth aspect, the base material of the wiring substrate 21 includes, as a part of the porous portion 41, a porous layer (second base material layer 32*a*) having interconnected air holes on the surface thereof on the opposite side from the internal space 28.

According to the above configuration, the base material of the wiring substrate 21 includes a porous layer having interconnected air holes. Thus, unlike in the case of filling a through hole of a substrate with an air-permeable resin, the porous portion 41 can be stably held and stably formed.

In addition, according to the above configuration, the porous layer is disposed on the surface of the wiring substrate 21 on the opposite side from the internal space 28, and a part of the internal space 28 side of the wiring substrate 21 is formed of a compact base material that is more compact than the porous layer. Thus, in the camera module 1, sufficient air ventilation can be secured by the porous layer, and even if foreign objects intrude into the interconnected air holes of the porous portion 41, most foreign objects intruding into the interconnected air holes are prevented from passing in the direction to the internal space 28 by the compact portion configured of the compact base material.

Thus, according to the above configuration, sufficient air ventilation and an effect of preventing intrusion of a foreign object can be sufficiently secured.

The camera module 1 according to a seventeenth aspect of the present invention may be such that, in any of the first, second, and fourth aspects, the entire base material of the wiring substrate 21 is configured of the porous portion 41 having interconnected air holes.

According to the above configuration, the base material of the wiring substrate 21 is formed of a porous material. Thus, the porous material can be stably held in the wiring substrate 21, and the porous portion 41 can be stably formed. Since the base material of the wiring substrate 21 is formed of a porous material, high air ventilation can be secured.

The camera module 1 according to an eighteenth aspect of the present invention may be such that, in any of the second to fifth aspects, the wiring substrate 21 has a recess portion (the recess portion 21*e* or the recess portion AR), and that the image sensor 22 is mounted in the recess portion.

According to the above configuration, the image sensor 22 is mounted in the recess portion. Thus, the size of the camera module 1 can be reduced.

According to the above configuration, the porous portion 41 is formed outside of the recess portion where the thickness is great, obviously in the case of configuring the entire base material of the wiring substrate of the porous portion 41 having interconnected air holes and even in the case of forming the porous portion 41 in a part of the wiring substrate 21. Thus, the volume of the air hole can be increased. Thus, according to the above configuration, the ability to hold a foreign object intruding into the porous portion 41 from the outside can be increased even with reduction of the size of the camera module 1.

The camera module 1 according to a nineteenth aspect of the present invention may be such that, in any of the first to eighteenth aspects, the porous portion 41 has a first porous portion (first porous portion 41*a*) that is formed in the internal space 28 side surface (upper surface 21*a*) of the wiring substrate 21, a second porous portion (second porous portion 41*b*) that is formed in the outer (external space 50) side surface (lower surface 21*b*) of the wiring substrate 21, and the separating portion 44 that separates the first porous portion and the second porous portion from each other and has an air hole connecting the first porous portion and the second porous portion.

According to the above configuration, even if a foreign object intrudes into the wiring substrate 21, the foreign object can be trapped with any of the first porous portion, the second porous portion, and the separating portion 44.

The camera module 1 according to a twentieth aspect of the present invention may be such that, in the nineteenth aspect, the air hole diameter of the separating portion 44 is greater than the air hole diameter of the first porous portion (first porous portion 41*a*) and the air hole diameter of the second porous portion (second porous portion 41*b*).

A foreign object is likely to move from a high density part to a low density part. Thus, according to the above configuration, a foreign object intruding into the porous portion 41 can be trapped in the separating portion 44.

The camera module 1 according to a twenty-first aspect of the present invention may be such that, in the nineteenth aspect, the air hole diameter of the separating portion 44 is smaller than the air hole diameter of at least one porous portion of the first porous portion (first porous portion 41*a*) and the second porous portion (second porous portion 41*b*).

A foreign object is likely to move from a high density part to a low density part. Thus, according to the above configuration, a foreign object intruding into the porous portion 41 can be trapped with at least one of the first porous portion 41*a* and the second porous portion 41*b*.

The camera module 1 according to a twenty-second aspect of the present invention may be such that, in any of the first to twenty-first aspects, the conductive or insulating pattern 61 that covers a part of the surface of the porous portion 41 is disposed on the porous portion 41.

According to the above configuration, the pattern 61 that covers a part of the surface of the porous portion 41 is disposed on the porous portion 41. Thus, the area of the porous portion 41 in the surface of the wiring substrate 21, in other words, the area of opening of the wiring substrate 21, can be adjusted. Thus, intrusion of a foreign object can be more unlikely to happen.

The camera module 1 according to a twenty-third aspect of the present invention may be such that, in the twenty-second aspect, the pattern 61 is an interconnect pattern.

According to the above configuration, an existing pattern can be used, and the pattern can be formed without causing a significant change in design or an increase in the number of manufacturing steps.

The camera module 1 according to a twenty-fourth aspect of the present invention may be such that, in any of the first to twenty-third aspects, the porous portion 41 is porous ceramic, and that the base material of a part (the first base material portion 31 and the compact portion 42) of the wiring substrate 21 other than the porous portion 41 (the first base material portion 31 and the compact portion 42) is ceramic.

Ceramic is a general material as a material of a wiring substrate and is easily obtained. When porous ceramic is used in the porous portion 41 with the base material of the part of the wiring substrate 21 other than the porous portion 41 configured of ceramic, an existing wiring substrate manufacturing technology can be used in manufacturing of the wiring substrate 21, and cost is unlikely to be increased.

When porous ceramic is used in the porous portion 41 with the base material of the part of the wiring substrate 21 other than the porous portion 41 configured of ceramic, the porous portion 41 and the part of the wiring substrate 21 other than the porous portion 41 have almost the same coefficient of thermal expansion. Thus, the possibility of a problem such as curvature or breakage of the wiring substrate 21 due to the porous portion 41 occurring in a firing step of manufacturing steps of the wiring substrate 21 is decreased. Thus, in this case, an advantage that cost is unlikely to be increased is achieved.

The camera module 1 according to a twenty-fifth aspect of the present invention may be such that, in any of the first to twenty-third aspects, the porous portion 41 is configured of porous metal.

As described above, porous metal is a versatile material and has an advantage of being easily obtained. Porous metal has conductivity. Thus, in the case of forming the porous portion 41 with porous metal, the porous metal can be used as a circuit of the wiring substrate 21. Therefore, in this case, air ventilation can be secured, and the wiring substrate 21 can have high density interconnects.

Particularly, a porous metal sheet has excellent bendability. Thus, the wiring substrate 21 can be applied as a flexible substrate by using a porous metal sheet as the porous material of the camera module 1 disclosed in, for example, the seventeenth aspect.

The camera module 1 according to a twenty-sixth aspect of the present invention may be such that, in any of the first to twenty-third aspects, the porous portion 41 is organic fabric or inorganic fabric, and that the base material of the part (the first base material portion 31 and the compact portion 42) of the wiring substrate 21 other than the porous portion 41 (the first base material portion 31 and the compact portion 42) is an organic substrate or an inorganic substrate configured by impregnating the organic fabric or the inorganic fabric with a resin.

As described above, organic fabric and inorganic fabric are versatile materials and are easily obtained. According to the above configuration, the wiring substrate 21 can be manufactured by using a manufacturing process of an organic substrate or an inorganic substrate.

The camera module 1 according to a twenty-seventh aspect of the present invention may be such that, in any of the first to twenty-sixth aspects, a plating coat is formed on the surface of the air hole of the porous portion 41.

Accordingly, the surface of the air hole of the porous portion 41, that is, the surface of a porous structure constituting the porous portion 41 (the surface of a three-dimensional mesh skeleton) can be coated by plating. Thus, the magnitude of the air hole diameter can be adjusted, and the plating coat of the surface of the three-dimensional mesh skeleton can be used as an interconnect regardless of types of porous materials.

A plating process is a process that is typically performed in general manufacturing steps of a wiring substrate. Thus, an additional facility for the plating process is not required. Therefore, investment of a new facility for the plating process is not required. Even if the plating process is performed, a significant increase in cost can be reduced.

The present invention is not limited to each embodiment described above, and various modifications can be carried out within the scope disclosed in the claims. Embodiments obtained by an appropriate combination of each technical means disclosed in different embodiments are included in the technical scope of the present invention. Furthermore, new technical features can be formed by combining each technical means disclosed in each embodiment.

INDUSTRIAL APPLICABILITY

The present invention can be applied to a camera module that performs imaging in, for example, a camera-equipped mobile phone, a digital camera, a security camera, or a television camera.

REFERENCE SIGNS LIST

1 CAMERA MODULE
10 LIGHT CONCENTRATING UNIT
11 LENS UNIT
12 LENS HOLDER

20 IMAGING UNIT
21 WIRING SUBSTRATE
21a UPPER SURFACE
21b LOWER SURFACE
21c END SURFACE
21d RECESS PORTION
21e RECESS PORTION
22 IMAGE SENSOR
23 LIGHT-TRANSMITTING UNIT
24 COVER BODY
24a CEILING PORTION
25, 26, 27 ADHESIVE LAYER
28 INTERNAL SPACE
30 BASE MATERIAL PORTION
31 FIRST BASE MATERIAL PORTION
31a THROUGH PORT
31b RECESS PORTION
31c NOTCH PORTION
32 SECOND BASE MATERIAL PORTION
32a SECOND BASE MATERIAL LAYER
32b PROTRUDING PORTION
32c, 32c1, 32c2, 32d, 32h, 32i END SURFACE
32e BENT PORTION
32f FIRST PATH
32g SECOND PATH
41 POROUS PORTION
41a FIRST POROUS PORTION
41b SECOND POROUS PORTION
42 COMPACT PORTION
43 BUMP
44 SEPARATING PORTION
50 EXTERNAL SPACE
61 PATTERN
62 THROUGH HOLE
AP, AQ OPENING PORTION
AR RECESS PORTION
LS IMAGING LENS

The invention claimed is:

1. A camera module comprising:
an internal space that abuts a wiring substrate and is occluded,
wherein a part of a base material of the wiring substrate is a porous portion that is configured of a three-dimensional mesh skeleton and has interconnected air holes, and the internal space is connected to the outside of the camera module through the interconnected air holes, and the three-dimensional mesh skeleton has a surface provided with a plating coat.

2. The camera module according to claim 1,
wherein the base material of the wiring substrate includes, as a part of the porous portion, a porous layer having interconnected air holes on a surface of the base material on the opposite side from the internal space.

3. The camera module according to claim 1,
wherein the porous portion has a first porous portion that is formed on an internal space side surface of the wiring substrate, a second porous portion that is formed on an outer side surface of the wiring substrate, and a separating portion that separates the first porous portion and the second porous portion from each other and has an air hole connecting the first porous portion and the second porous portion.

4. The camera module according to claim 1,
wherein a conductive or insulating pattern that covers a part of the surface of the porous portion is disposed on the porous portion.

5. The camera module according to claim 1, wherein the porous portion is configured of porous ceramic, porous metal, organic fabric, or inorganic fabric.

6. The camera module according to claim 1, wherein the porous portion has a first end surface that abuts the internal space and a second end surface that is positioned on a surface of the wiring substrate which surface faces the internal space and that abuts the outside of the camera module.

7. A camera module comprising:
an internal space that abuts a wiring substrate and is occluded,
wherein at least a part of a base material of the wiring substrate is a porous portion that is configured of porous ceramic, porous metal, organic fabric, or inorganic fabric and has interconnected air holes, and the internal space is connected to the outside of the camera module through the interconnected air holes, and
wherein the porous portion has a first porous portion that is formed on an internal space side surface of the wiring substrate, a second porous portion that is formed on an outer side surface of the wiring substrate, and a separating portion that separates the first porous portion and the second porous portion from each other and has an air hole connecting the first porous portion and the second porous portion.

* * * * *